United States Patent
Wang et al.

(10) Patent No.: US 11,388,320 B2
(45) Date of Patent: Jul. 12, 2022

(54) PHOTOSENSITIVE COMPONENT, AND CAMERA MODULE AND MANUFACTURING METHOD THEREFOR

(71) Applicant: NINGBO SUNNY OPOTECH CO., LTD., Zhejiang (CN)

(72) Inventors: Mingzhu Wang, Ningbo (CN); Zhenyu Chen, Ningbo (CN); Zhongyu Luan, Ningbo (CN); Zhen Huang, Ningbo (CN); Nan Guo, Zhejiang (CN); Fengsheng Xi, Zhejiang (CN); Takehiko Tanaka, Zhejiang (CN); Bojie Zhao, Zhejiang (CN); Heng Jiang, Zhejiang (CN); Ye Wu, Zhejiang (CN); Zilong Deng, Zhejiang (CN)

(73) Assignee: NINGBO SUNNY OPOTECH CO., LTD., Zhejiang Province (CN)

( * ) Notice: Subject to any disclaimer, the term of this patent is extended or adjusted under 35 U.S.C. 154(b) by 791 days.

(21) Appl. No.: 16/322,946

(22) PCT Filed: Jun. 2, 2017

(86) PCT No.: PCT/CN2017/086998
§ 371 (c)(1),
(2) Date: Feb. 3, 2019

(87) PCT Pub. No.: WO2018/006673
PCT Pub. Date: Jan. 11, 2018

(65) Prior Publication Data
US 2021/0306530 A1   Sep. 30, 2021

(30) Foreign Application Priority Data

Jul. 3, 2016 (CN) .......................... 201610516600.2
Jul. 3, 2016 (CN) .......................... 201620691699.5

(Continued)

(51) Int. Cl.
*H04N 5/225* (2006.01)
*H05K 1/02* (2006.01)

(52) U.S. Cl.
CPC ......... *H04N 5/2253* (2013.01); *H04N 5/2254* (2013.01); *H05K 1/0274* (2013.01); *H05K 2201/10121* (2013.01)

(58) Field of Classification Search
CPC .................................................. H04N 5/2253
(Continued)

(56) References Cited

U.S. PATENT DOCUMENTS

2011/0194023 A1 * 8/2011 Tam ..................... H04N 5/2253
348/374
2012/0018830 A1 1/2012 Lin et al.

FOREIGN PATENT DOCUMENTS

CN     105681637 A    6/2016
CN     105681640 A    6/2016
(Continued)

*Primary Examiner* — Joel W Fosselman
(74) *Attorney, Agent, or Firm* — Wenderoth, Lind & Ponack, L.L.P.

(57) ABSTRACT

A photosensitive component, and a camera module and a manufacturing method therefor. The photosensitive component comprises at least a photosensitive element, at least a window-form circuit board and at least a packaging body, wherein the photosensitive element and the window-form circuit board are integrally packaged through the packaging body. The window-form circuit board comprises a circuit board main body which comprises at least one window arranged thereon, wherein the photosensitive element is arranged within the window.

18 Claims, 66 Drawing Sheets

(30) Foreign Application Priority Data

Nov. 28, 2016 (CN) .......................... 201611067131.7
Nov. 28, 2016 (CN) .......................... 201621286847.1
Feb. 6, 2017 (CN) .......................... 201710065909.9
Feb. 6, 2017 (CN) .......................... 201720112605.9

(58) Field of Classification Search
USPC ........................................................ 348/335
See application file for complete search history.

(56) References Cited

FOREIGN PATENT DOCUMENTS

| | | |
|---|---|---|
| CN | 105704354 A | 6/2016 |
| CN | 105847645 | 8/2016 |
| CN | 105704354 B | 7/2019 |
| CN | 105681637 B | 12/2019 |
| EP | 3429183 A1 | 1/2019 |
| JP | 2003189195 A | 7/2003 |
| JP | 2008187554 A | 8/2008 |
| JP | 2008300574 A | 12/2008 |
| JP | 2014-075480 | 4/2014 |
| KR | 10-2009-0055889 | 6/2009 |
| KR | 10-2011-0123567 | 11/2011 |

* cited by examiner

PHOTOSENSITIVE COMPONENT, AND CAMERA MODULE AND MANUFACTURING METHOD THEREFOR

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to the field of camera module, and more particularly to a photosensitive component, and camera module and manufacturing method thereof.

Description of Related Arts

Conventional camera is usually encapsulated through COB process (Chip On Board), which is a relatively well-developed technique with advantages as well as a lot of disadvantages.

Conventional camera module usually includes a circuit board, a photosensitive element, an optical filter, a base, an actuator, a lens, and at least a resistance-capacitance component. After these mentioned elements are encapsulated through COB, the photosensitive element is mounted on the circuit board, the base is mounted on the circuit board, the optical filter is mounted on the base along the photosensitive path of the photosensitive element, the actuator is mounted on the base, and the lens is mounted on the actuator along the photosensitive path of the photosensitive element, wherein the focal length of the camera module is adjusted by the actuator.

First, in the above mentioned conventional manner, the photosensitive element is attached on the top surface of the circuit board. In this process, the photosensitive element is adhered on the circuit board by gluing. For the camera module, the alignment of the optical axis is really important, so that it requires a highly flatness between the photosensitive element and the circuit board so as to latterly align the main optical axis of the lens with the center optical axis of the photosensitive element.

Second, the base is adhered to be affixed on the circuit board. And the optical filter, the actuator and the lens are basically mounted on the base, so that the flatness of the base and mounting flatness is highly demanded.

Third, the photosensitive element is electrically connected to the circuit board with gold wires while there is no the resistance-capacitance component being protruded on the circuit board. Hence, while installing the base, extra spaces are required to be provided for the gold wires and the resistance-capacitance components to avoid the exposed gold wires and the resistance-capacitance components from being contacted in all directions, resulting in unnecessary space being occupied. On the other hand, the resistance-capacitance components are easily to be contaminated with dusts and sundries which substantially and adversely affect the imaging of the camera module and forming dark marks.

Fourth, it is also relatively important that, for adapting with the development of various kinds of smart device, such as smart phone, the demand of a thinner camera module becomes more and more essential. Until now, the camera module is made extremely micro small that every single tiny space is very essential. Nevertheless, in the above mentioned assembling manner, the photosensitive element, each of the circuit board and the resistance-capacitance components occupies independent space, so the size of the camera module becomes difficult to be reduced. According to such adhering structure, since the photosensitive element has a predetermined thickness, while installing other components, the base is necessary to be mounted for providing space for the photosensitive element protruded from the circuit board.

Fifth, the height of the camera module must fulfill optical imaging requirement. In the above mentioned assembling manner, the photosensitive element is adhered on the circuit board and the optical filter is supported by the base. Therefore, the rear focal length of the camera module is longer and the height of the camera module is larger.

With continuous development of electrical smart devices, the requirements of the camera modules are becoming higher and higher. Smart electronic device, such as smart phone, is becoming more functional, thinner and lighter. Accordingly, the camera module has to be developed to have higher imaging quality and to be smaller.

Taking smart phone as example, it is well known that the thickness of the smart phone is reduced to several millimeters, such as 6 or 7 mm. The camera module being installed is required to be smaller than such size. Obviously, the camera module is in micro size that it is extremely hard to further reduce the size of the camera module.

According to the rapid development of the camera module, the performance of various camera modules have reached really high standard and achieved corresponding imaging quality that their components and relative structure thereof are basically settled. Referring to FIG. 1, a camera module packaged and encapsulated through COB technology is illustrated, wherein the camera module usually includes a circuit board 101P, a photosensitive element 102P, a lens holder 103P, a lens 104P, and a motor unit 105P. The photosensitive element 102P is attached on the circuit board 101P. The lens holder 103P is installed on the circuit board 101P. The lens 104P is installed on the motor unit 105P and therefore positioned along the photosensitive path of the photosensitive element 102P. An optical filter 108P is mounted in the lens holder 103P and positioned along the photosensitive path of the photosensitive element 102P. It is worth to mention that a plurality of resistance-capacitance components 106P and gold wires 107P is needed to be provided on the circuit board 101P, for example, mounting resistors and capacitors to work with the circuit board 101P, wherein the resistance-capacitance components 106P and the gold wires 107P are usually protruded from the circuit board 101P. This conventional structure has many problems.

First, the lens holder 103P is adhered on the circuit board 101P by gluing, wherein due to the unevenness of the lens holder 103P and the inclination of the adhering assembling of lens holder 103P, it is easy to cause inclination of the camera module and result in dis-alignment of the optical axis.

Second, the resistance-capacitance components 106P, the gold wires 107P and the photosensitive element 102P are connected in a communicating cavity, wherein the dirt on the resistance-capacitance components 106P and the gold wires 107P is easily to be moved or fallen to the photosensitive element 102P that infects the imaging quality of the camera module, so that the image of the camera module is adversely affected and has black marks and stains.

Third, the lens holder 103P is merely adhered on the circuit board 101P with glue which has bad structural strength, and thus a thicker circuit board 101P is required, resulting that the thickness of the camera module is difficult to be reduced.

Fourth, the structure of conventional camera module made through the COB encapsulation technique has achieved an advance level. The positions and relative structures of the components, such as the lens holder 103P, the circuit board 101P, the photosensitive element 102P, the lens 104P, and the motor unit 105P, have been relatively determined. Accordingly, the size of the camera module is so hard to be further reduced.

Fifth, the photosensitive element 102P is adhered on the circuit board 101P, so that the lamination structure of the camera module renders the camera module having a thicker height.

Sixth, it is a more important issue that, since the photosensitive element 102P is adhered on the circuit board 101P with glue, the upper space of the photosensitive element 102P is sealed in a space corresponding the lens 104P and the bottom of the photosensitive element 102P is blocked by the circuit board 101P. Therefore, the overall heat dissipation of the photosensitive element 102P is poor while heat can only be dissipated through the circuit board 101P. It is well known that the heat dissipation effect of the circuit board 101P is poor either. Furthermore, when the photosensitive element 102P generates heat, the working performance of the camera module, such as the quality of imaging, is affected easily.

In recent years, the development trend of electronic devices is heading towards thinness and high performance, that makes a very strictly demanding requirement to the size and performance of the camera module which is a standard component of an electronic device. One skilled in the art would understand that, the imaging quality of the camera module is not only determined by the performance of the photosensitive element thereof, but also greatly limited by the flatness of the photosensitive element. Thus, for ensuring the flatness of the photosensitive element in the conventional camera module, a thicker and stronger circuit board is usually selected to be used that causes increase of the height of the camera module.

Furthermore, the photosensitive element is mounted on the circuit board by the SMT (Surface Mount Technology) process. During the SMT process, an adhesive or the like is needed to be adhered between the photosensitive element and the circuit board. The deformations of the adhesive during solidifying at different positions between the photosensitive element and the circuit board have differences that lead to adverse effect such as inclination of the photosensitive element and etc., and that the height of the camera module is increased due to the adhesive filled between the photosensitive element and the circuit board.

The circuit board is made of polymer materials. Because the thickness size of the circuit board is required to be as thin as possible, when the camera module is being used, heat is generated by the photosensitive element directly mounted on the circuit board during the photoelectric conversion of the photosensitive element continuously, which will cause deformation of the circuit board that affects the flatness of the photosensitive element. In order to solve adverse influence of the flatness of the photosensitive element because of the deformation of the circuit board due to heat, a metal cover is provided and overlapped on the circuit board in some camera modules to prevent deformation of the circuit board due to heat. However, it not only increases the manufacture cost of the camera module, but also further increases the height of the camera module.

SUMMARY OF THE PRESENT INVENTION

An object of the present invention is to provide a photosensitive component and camera module, and manufacturing method thereof, wherein the photosensitive component comprises a photosensitive element, a window-form circuit board, and a packaging body, wherein the photosensitive element and the window-form circuit board are integrally encapsulated through the packaging body.

An object of the present invention is to provide a photosensitive component and camera module, and manufacturing method thereof, wherein the photosensitive element and the window-form circuit board are integrally encapsulated by the packaging body in a spatially overlapping manner, so as to reduce a relative height of the photosensitive element and the window-form circuit board.

Another object of the present invention is to provide a photosensitive component and camera module, and manufacturing method thereof, wherein the window-form circuit board has a window to accommodate and receive the photosensitive element, so as to reduce the relative height between the photosensitive element and the window-form circuit board as well as the height of the camera module.

Another object of the present invention is to provide a photosensitive component and camera module, and manufacturing method thereof, wherein the window of the window-form circuit board is a through hole, so that a relative height between the photosensitive element with respect to the circuit board is adjustable to adapt for circuit boards having different thicknesses.

Another object of the present invention is to provide a photosensitive component and camera module, and manufacturing method thereof, wherein the bottom of the photosensitive element is exposed to outside to enhance the heat dissipation performance of the photosensitive element.

An object of the present invention is to provide a photosensitive component and camera module, and manufacturing method thereof, wherein the photosensitive element and the window-form circuit board are electrically connected through one or more connecting elements and the one or more connecting element are integrally encapsulated by the packaging body.

Another object of the present invention is to provide a photosensitive component and camera module, and manufacturing method thereof, wherein the photosensitive component comprises an optical filter being arranged on the photosensitive element, so as to protect the photosensitive element from being contaminated and polluted, as well as reduce the back focal length of the camera module.

Another object of the present invention is to provide a photosensitive component and camera module, and manufacturing method thereof, wherein the packaging body comprises a lens portion extended integrally and upwardly, adapted for installation of a lens of the camera module, so as to provide a flat, smooth and stable mounting condition for the lens of the camera module.

Another object of the present invention is to provide a photosensitive component and camera module, and manufacturing method thereof, wherein the packaging body can be extended downwardly to the bottom of the photosensitive component for encapsulating the photosensitive component from the bottom side thereof.

An object of the present invention is to provide a camera module and photosensitive component, and manufacturing method thereof, wherein the photosensitive component includes an integral encapsulation base, a circuit board and a photosensitive element, wherein the photosensitive element is sunkenly and integrally encapsulated on the circuit board through the integral encapsulation base, such that a size of the camera module is reduced.

An object of the present invention is to provide a camera module and photosensitive component, and manufacturing method thereof, wherein the integral encapsulation base integrally encapsulates and wraps up the photosensitive element and the circuit board that substitutes the conventional lens holder and the conventional chip attaching method.

An object of the present invention is to provide a camera module and photosensitive component and manufacturing method thereof, wherein the circuit board comprises a circuit board main body and has a disposing area provided on the circuit board main body, wherein the photosensitive element is arranged at the disposing area, so as to reduce the relative height between the circuit board main body and the photosensitive element.

An object of the present invention is to provide a camera module and photosensitive component, and manufacturing method thereof, wherein the disposing area communicates both sides of the circuit board main body, such that the back side of the photosensitive element is exposed to outside for enhancing the heat dissipation performance of the photosensitive element.

An object of the present invention is to provide a camera module and photosensitive component, and manufacturing method thereof, wherein the integral encapsulation base comprises a base main body, wherein the base main body comprises a primary base and a secondary base, so as to gradually affix the photosensitive element in position to complete the sinking of the photosensitive element with respect to the circuit board and the encapsulating of the photosensitive element.

An object of the present invention is to provide a camera module and photosensitive component, and manufacturing method thereof, wherein the primary base comprises a bottom liner and a primary packaging base. During the manufacturing method, the bottom liner is formed on the circuit board to support the manufacturing device at the bottom liner to form the primary packaging base, so as to pre-fix the photosensitive element and prevent the manufacturing mold from damaging the photosensitive element.

An object of the present invention is to provide a camera module and photosensitive component, and manufacturing method thereof, wherein the secondary base includes a packaging and encapsulating base and a secondary packaging base, wherein the packaging and encapsulating base and the primary packaging base form and define a ring structure, wherein the packaging and encapsulating base packages and encapsulates one or more electrical connection elements of the photosensitive element.

An object of the present invention is to provide a camera module and photosensitive component and manufacturing method thereof, wherein during the manufacturing process, the manufacturing device is supported on the ring structure to form the secondary packaging base, wherein a mounting groove is formed by the ring structure and the secondary packaging base to reduce the number of turning corner being formed during the single formation process, reduce burr from occurring during the formation process, and increase the flatness, smoothness and evenness of the surfaces thereof.

An object of the present invention is to provide a camera module and photosensitive component, and manufacturing method thereof, wherein the secondary packaging base covers, encloses, encapsulates and/or wraps up the electronic component(s) arranged on the surface of the circuit board, so as to minimize the space occupied by the independent electronic component(s) to reduce the dimension and size of the camera module.

An object of the present invention is to provide a camera module and photosensitive component, and manufacturing method thereof, wherein the camera module includes a filter, wherein the filter is covered on the photosensitive element to protect the photosensitive element.

An object of the present invention is to provide a camera module, molded circuit board component of the camera module, manufacturing method thereof, and electronic device equipped with the camera module, wherein the molded circuit board component comprises a circuit board, a photosensitive element, and a retaining portion integrally formed on the circuit board and the photosensitive element. In comparison with the conventional camera module, the flatness of the photosensitive element of the camera module of the present invention is maintained by the retaining portion to improve the imaging quality of the camera module.

An object of the present invention is to provide a camera module, molded circuit board component of the camera module, manufacturing method thereof, and electronic device equipped with the camera module, wherein since the flatness of the photosensitive element is maintained by the retaining portion, the camera module is capable of using a thinner circuit board to reduce the size of the camera module, especially the height of the camera module.

An object of the present invention is to provide a camera module, molded circuit board component of the camera module, manufacturing method thereof, and electronic device equipped with the camera module, wherein when the camera module is being utilized, even if the camera module is heated and causes defectives such as deformation and etc., the flatness and smoothness of the photosensitive element will not be affected.

An object of the present invention is to provide a camera module, molded circuit board component of the camera module, manufacturing method thereof, and electronic device equipped with the camera module, wherein the circuit board has an accommodating space for accommodating and receiving the photosensitive element therein, so as to reduce a height difference between the chip upper surface of the photosensitive element and the basal plate upper surface of the circuit board or even allow the chip upper surface of the photosensitive element to be level with or lower than the basal plate upper surface of the circuit board, such that the camera module can have a longer focal length.

An object of the present invention is to provide a camera module, molded circuit board component of the camera module, manufacturing method thereof, and electronic device equipped with the camera module, wherein a first safe distance L is formed between the photosensitive element and the circuit board, that is a predetermined safe distance between the photosensitive element and the circuit board to keep the photosensitive element having no contact with the circuit board, and that when the circuit board is deformed, the flatness of the photosensitive element is protected from being affected through preventing the circuit board from contacting with the photosensitive element of the camera module.

An object of the present invention is to provide a camera module, molded circuit board component of the camera module, manufacturing method thereof, and electronic device equipped with the camera module, wherein the retaining portion has a coupling side and an attaching side and provides an optical window communicating the coupling side and the attaching side, wherein the size of the opening of the optical window at the attaching side is larger than the size of the opening of the optical window at the coupling side, such that it is easier for the drafting and demolding of the formation mold after the molding of the retaining portion by means of the formation mold.

An object of the present invention is to provide a camera module, molded circuit board component of the camera module, manufacturing method thereof, and electronic device equipped with the camera module, wherein the retaining portion has an inner surface, wherein the inner surface defines the optical window and at least part of the inner surface extends from the coupling side to the attaching side in an inclining and sloping manner, such that a first included angle α is formed and defined between at least part of the inner surface of the retaining portion and the photosensitive axis of the photosensitive element, wherein the first included angle α is a sharp angle.

An object of the present invention is to provide a camera module, molded circuit board component of the camera module, manufacturing method thereof, and electronic device equipped with the camera module, wherein when the formation mould is used to mold and produce the molded circuit board component, an optical window molding member provided on the upper mold of the formation mold is substantially used to form the optical window in the retaining portion, such that the first included angle α can reduce the friction force generated between the optical window molding member and the inner surface of the retaining portion as the formation mould is drafted and demolded, so as to prevent the inner surface of the retaining portion from being worn and damaged.

An object of the present invention is to provide a camera module, molded circuit board component of the camera module, manufacturing method thereof, and electronic device equipped with the camera module, wherein the first included angle α reduces the friction caused by the optical window molding member against the inner surface of the retaining portion during the drafting and demolding of the formation mould, so as to prevent the inner surface of the retaining portion from producing contaminants, such as fragments and etc., and polluting the photosensitive area of the photosensitive element.

An object of the present invention is to provide a camera module, molded circuit board component of the camera module, manufacturing method thereof, and electronic device equipped with the camera module, wherein the retaining portion has an outer surface in correspondence with the inner surface of the retaining portion, wherein the outer surface extends from the coupling side to the attaching side in an inclining and sloping manner, such that a second included angle β is formed and defined between the outer surface of the retaining portion and the photosensitive axis of the photosensitive element, wherein the second included angle β is a sharp angle.

An object of the present invention is to provide a camera module, molded circuit board component of the camera module, manufacturing method thereof, and electronic device equipped with the camera module, wherein when the formation mould is used to mold and produce the molded circuit board component, the surrounding member of the upper mold of the formation mould is used to form the outer surface of the retaining portion, such that the second included angle β can reduce the friction force generated between the outer surface of the retaining portion and the surrounding member during the drafting and demolding of the formation mould, so as to prevent the outer surface of the retaining portion from being worn and damaged.

An object of the present invention is to provide a camera module, molded circuit board component of the camera module, manufacturing method thereof, and electronic device equipped with the camera module, wherein the inner surface of the retaining portion has a first inner surface, a second inner surface and a third inner surface which are respectively and orderly formed between the coupling side and the attaching side of the retaining portion, wherein the first included angle α is formed and defined between the first inner surface of the retaining portion and the photosensitive axis of the photosensitive element and a third included angle γ, which is a sharp angle, is formed and defined between the third inner surface and the photosensitive axis of the photosensitive element, such that the second inner surface can remain horizontal during the drafting and demolding of the formation mould.

An object of the present invention is to provide a camera module, molded circuit board component of the camera module, manufacturing method thereof, and electronic device equipped with the camera module, wherein the first included angle α, the second included angle β, and the third included angle γ can ensure that, during the drafting and demolding of the formation mould, the tendency of the retaining portion being detached from the circuit board and the photosensitive element due to the friction between the formation mould and the retaining portion will not occur, such that both the flatness and smoothness of the retaining portion and the reliability and stability of the camera module can be guaranteed.

An object of the present invention is to provide a camera module, molded circuit board component of the camera module, manufacturing method thereof, and electronic device equipped with the camera module, wherein the optical window molding member has a groove arranged corresponding to the photosensitive area of the photosensitive element to provide a second safe distance h between the optical window molding member and the photosensitive area of the photosensitive element, so as to prevent the photosensitive area of the photosensitive element being scratched and damaged.

An object of the present invention is to provide a camera module, molded circuit board component of the camera module, manufacturing method thereof, and electronic device equipped with the camera module, wherein a cover film is overlappedly provided on the optical window molding member of the formation mould, so as to isolate the pressing surface of the optical window molding member and the photosensitive area of the photosensitive element in order to protect the photosensitive element.

An object of the present invention is to provide a camera module, molded circuit board component of the camera module, manufacturing method thereof, and electronic device equipped with the camera module, wherein the cover film is deformed and absorbs the impact force acted on the photosensitive element during the clamping of the formation mould so as to protect the photosensitive element.

An object of the present invention is to provide a camera module, molded circuit board component of the camera module, manufacturing method thereof, and electronic device equipped with the camera module, wherein the cover film is deformed to avoid any gap formed between the optical window molding member and the photosensitive element, so as to prevent the molding material for forming the retaining portion from polluting the photosensitive area of the photosensitive element and resulting in defectives, such as burr and etc.

An object of the present invention is to provide a camera module, molded circuit board component of the camera module, manufacturing method thereof, and electronic device equipped with the camera module, wherein the molded circuit board member comprises a framework shaped protecting element positioned outside of the photosensitive area of the photosensitive element for supporting the optical window molding member, so as to provide the second safe distance h between the optical window molding member and the photosensitive area of the photosensitive element to prevent the photosensitive area of the photosensitive element from being scratched and damaged.

An object of the present invention is to provide a camera module, molded circuit board component of the camera module, manufacturing method thereof, and electronic device equipped with the camera module, wherein the protecting element absorbs the impact force acted on the photosensitive element during the clamping of the formation mould so as to protect the photosensitive element.

An object of the present invention is to provide a camera module, molded circuit board component of the camera module, manufacturing method thereof, and electronic device equipped with the camera module, wherein the protecting element avoids any gap being formed between the optical window molding member and the photosensitive element through deformation, so as to prevent the molding material for forming the retaining portion from polluting the photosensitive area of the photosensitive element and resulting in defectives, such as burr and etc.

In order to achieve the above and other objects and advantages of the present invention, the present invention provides a photosensitive component, which comprises at least a photosensitive element, at least a window-form circuit board and at least a packaging body, wherein the photosensitive element and the window-form circuit board are integrally packaged by the packaging body, wherein the packaging body has an optical window formed corresponding to the photosensitive element, wherein the window-form circuit board comprises a circuit board main body which comprises at least one window arranged therein, wherein the photosensitive element is arranged within the window.

According to some embodiments, the window is a groove, wherein the photosensitive element is arranged in the groove.

According to some embodiments, the photosensitive element and the circuit board main body are electrically connected through at least one electrical connection element, wherein the at least one electrical connection element has two ends, respectively connected with the photosensitive element and a top side of the circuit board main body, wherein the top side of the circuit board main body that is connected with the other end of the photosensitive element is located outside of the window.

According to some embodiments, the photosensitive element and the circuit board main body are electrically connected through at least one electrical connection element, wherein the at least one electrical connection element has two ends, respectively connected with the photosensitive element and a top side of the circuit board main body, wherein the top side of the circuit board main body that is connected with the other end of the photosensitive element is located inside of the window.

According to some embodiments, the window is a through hole, wherein the photosensitive element is arranged in the through hole.

According to some embodiments, the photosensitive element is electrically connected through at least one electrical connection element, wherein the at least one electrical connection element has two ends, respectively connected with the photosensitive element and the top side of the circuit board main body.

According to some embodiments, the photosensitive component further comprises a substrate, arranged under the photosensitive element.

According to some embodiments, the photosensitive component comprises a substrate, wherein the substrate has a groove shape and is provided in the window, wherein the photosensitive element is accommodated in the substrate.

According to some embodiments, the packaging body integrally encapsulates the at least one electrical connection element.

According to some embodiments, the photosensitive component comprises at least one electronic component protruded from or partially protruded from the circuit board main body, wherein the packaging body integrally encapsulates the at least one electronic component.

According to some embodiments, the photosensitive element comprises a photosensitive area and a non-photosensitive area, wherein the packaging body integrally encapsulates at least a part of the non-photosensitive area.

According to some embodiments, the photosensitive component further comprises a ring shaped blocking element arranged around the photosensitive area of the photosensitive element.

According to some embodiments, the surface of the packaging body forms a step structure.

According to some embodiments, the surface of the packaging body forms a plane structure.

According to some embodiments, the packaging body comprises a support portion configured for installing an optical filter and a lens portion configured for installing a lens, wherein the lens portion integrally extends along the support portion from the outside thereof and forms a step-shaped structure in the inside thereof.

According to some embodiments, the inside of the lens portion is flat and smooth, which is adapted for mounting a threadless lens.

According to some embodiments, the lens portion has a thread structure arranged on the inside thereof, which is adapted for mounting a threaded lens.

According to some embodiments, the circuit board main body comprises a reinforced hole formed therein, wherein the packaging body extends into the reinforced hole.

According to some embodiments, the circuit board main body comprises one or more reinforced holes formed therein, wherein the packaging body passes across the one or more reinforced holes and extends to reach the bottom of the circuit board main body.

According to some embodiments, the photosensitive component further comprises an optical filter, which is attached on the photosensitive element.

According to some embodiments, the photosensitive component further comprises an optical filter, wherein an edge of the optical filter is integrally encapsulated by the packaging body.

According to some embodiments, the photosensitive component comprises a back board attached on the bottom of the circuit board main body.

According to some embodiments, the way of integral encapsulation is molding.

According to another aspect of the present invention, the present invention provides a camera module, which comprises one or more photosensitive components and at least a lens, wherein the lens is arranged along the photosensitive path of the photosensitive element of the corresponding photosensitive component.

According to some embodiments, the camera module further comprises at least an actuator, wherein the lens is mounted in the actuator, wherein the actuator is mounted on the photosensitive component.

According to some embodiments, the camera module further comprises at least a frame mounted on the photosensitive component.

According to some embodiments, the camera module further comprises a plurality of the photosensitive elements and a plurality of the lenses, so as to form an array camera module.

According to some embodiments, the window-form circuit boards of the photosensitive components are integrally connected with each other.

According to another aspect of the present invention, the present invention also provides a manufacturing method of photosensitive component, comprising the following steps:

(A) providing a photosensitive element in a window of a window-form circuit board;

(B) electrically connecting the photosensitive element and the window-form circuit board; and (C) forming a packaging body integrally packaging the photosensitive element and the window-form circuit board, wherein an optical window is formed in the packaging body and aligned with the photosensitive element correspondingly.

According to some embodiments, in the step (C), the photosensitive element and the window-form circuit board are contacting with each other, wherein the packaging body integrally connects the photosensitive element and the window-form circuit board.

According to some embodiments, in the step (C), the photosensitive element and the window-form circuit board are spaced with each other, wherein the packaging body is integrally connected with and filled between the photosensitive element and the window-form circuit board, so as to reinforce the photosensitive element and the window-form circuit board.

According to some embodiments, in the step (C), the photosensitive element and the window-form circuit board are contacted with each other indirectly through a medium, wherein the packaging body integrally connects the photosensitive element, the medium and the window-form circuit board.

Another aspect of the present invention provides a camera module, which comprises at least a photosensitive component and a lens, wherein the photosensitive component comprises a circuit board, a photosensitive element and an integral encapsulation base, wherein the circuit board comprises a circuit board main body and has a disposing area arranged on the circuit board main body, wherein the photosensitive element is arranged on the disposing area, wherein the integral encapsulation base comprises a base main body and has an optical window arranged thereon, wherein the base main body integrally encapsulates at least a part of the photosensitive element and at least a part of the circuit board main body, wherein the optical window provides a light path for the photosensitive element, wherein the lens is positioned along the photosensitive path of the photosensitive element.

According to some embodiments, the base main body of the camera module is integrally formed with the photosensitive element and the circuit board main body.

According to some embodiments of the camera module, the integral encapsulation base comprises an interval medium protruded from the photosensitive element and at least a part of the interval medium is integrally encapsulated by the base main body so as to prevent the photosensitive element from being damaged during the manufacturing process.

According to some embodiments, the photosensitive component of the camera module has a gap located between the photosensitive element and the circuit board main body, wherein the integration base extends into the gap.

According to some embodiments, the photosensitive component of the camera module has a gap located between the photosensitive element and the circuit board main body, wherein the gap is filled with adhesive.

According to some embodiments, the base main body comprises a primary base and a secondary base, wherein the primary base comprises a substrate and a primary packaging base, wherein the secondary base comprises a packaging and encapsulating base and a secondary packaging base, wherein the substrate is protruded from the photosensitive element, wherein the primary packaging base is shaped and formed on at least a part of the photosensitive element, at least a part of the circuit board main body and at least a part of the substrate, wherein the packaging and encapsulating base connects another part of the photosensitive element and another part of the circuit board main body, wherein the packaging and encapsulating base and the primary base form a ring structure, wherein the secondary packaging base is shaped and formed on the ring structure to jointly form the optical window with the ring structure.

According to some embodiments, the photosensitive element of the camera module is electrically connected with the circuit board main body through at least one electrical connection element, wherein the primary base is arranged on the position where no electrical connection element is presented, wherein the packaging and encapsulating base packages and encapsulates the at least one electrical connection element.

According to some embodiments for the camera module, the secondary packaging base and the ring structure form and define a mounting groove communicated with the optical window and adapted for mounting a filter.

According to some embodiments of the camera module, the bottom liner and the packaging and encapsulating base are formed by adhesive.

According to some embodiments, the photosensitive element of the camera module is electrically connected with the circuit board main body through at least one electrical connection element and the base main body covers, encloses, encapsulates and/or wraps up the electrical connection element.

According to some embodiments, the circuit board of the camera module comprises at least one electronic component, protruded from the circuit board main body, wherein the base main body covers, encloses, encapsulates and/or wraps up the electronic component.

According to some embodiments of the camera module, the base main body comprises a lens portion extended integrally and upwardly along the base main body and adapted for mounting a lens.

According to some embodiments, the disposing area of the camera module is a groove.

According to some embodiments of the camera module, the disposing area is a through hole, communicating both sides of the circuit board main body.

According to some embodiments, a front side of the photosensitive element of the camera module and a top side of the circuit board main body are on the same plane.

According to some embodiments, a back side of the photosensitive element of the camera module and a bottom side of the circuit board main body are on the same plane.

According to some embodiments, the method of integral formation of the camera module is by transfer molding.

According to some embodiments, the camera module comprises a plurality of the camera modules forming an array camera module.

Another aspect of the present invention provides an electronic device, comprising:

a device main body; and one or more of the camera modules, wherein each of the camera modules is installed on the device main body to coordinately function with the device main body in achieving image capturing and reproduction.

According to some embodiments, the device main body of the electronic device is selected from the group consisting of smartphone, wearable device, computing device, television, vehicle, camera, surveillance device, and etc.

According to another aspect of the present invention, the present invention also provides a manufacturing method of photosensitive component, comprising the following steps:

(A) providing a circuit board, having a disposing area, on a peelable basal plate;

(B) providing a photosensitive element on the disposing area of the circuit board which is supported by the peelable basal plate;

(C) integrally encapsulating at least a part of the photosensitive element and at least a part of the circuit board to form an integral encapsulation base that has an optical window to form a photosensitive component; and (D) peeling off the peelable basal plate from the photosensitive component.

According to some embodiments, in the manufacturing method of the photosensitive component, the step (A) comprises a step of: (A1) arranging a circuit board main body, which has a disposing area, on a peelable basal plate; and the step (B) comprises the steps of: (B1) arranging at least an electronic components on a circuit board main body, which has the disposing area; and (B2) electrically connecting the circuit board main body and the photosensitive element through at least one electrical connection element.

According to some embodiments, the step (C) of the manufacturing method of the photosensitive component further comprises a step of: integrally forming a base main body to integrally encapsulate at least a part of the non-photosensitive area of the photosensitive element and at least a part of the circuit board main body.

According to some embodiments, the integrally forming step of the manufacturing method of photosensitive component is by transfer molding.

According to some embodiments, in the manufacturing method of the photosensitive component, the base main body has a mounting groove which is communicated with the optical window and adapted for mounting a filter.

According to some embodiments, in the manufacturing method of the photosensitive component, the step (A) comprises a step of: (A1) arranging a circuit board main body, which has a disposing area, on a peelable basal plate; and the step (B) comprises the steps of: (B1) arranging at least one electronic component on the circuit board main body, which has the disposing area; (B2) electrically connecting the circuit board main body and the photosensitive element through at least one electrical connection element; and (B3) arranging an interval medium on the photosensitive element so as for supporting a formation mould.

According to some embodiments of the manufacturing method of photosensitive component, the step (C) further comprises the following steps: clamping the circuit board within a formation mould, which has a base forming guide groove, wherein the circuit board is also supported by the interval medium, and integrally forming a base main body to form the integral encapsulation base.

According to some embodiments, the step (B) further comprises the steps of: providing a gap between the photosensitive element and the circuit board main body and pre-fixing the photosensitive element and the circuit board main body through a filling medium.

According to some embodiments, the step (B) of the manufacturing method of photosensitive component further comprises a step of: providing a gap between the photosensitive element and the circuit board main body for the base main body to extend into the gap.

According to some embodiments, in the manufacturing method of photosensitive component, the step (A) comprises a step of: (A1) arranging a circuit board main body, which has a disposing area, on a peelable basal plate; and the step (C) comprises the steps of: (C1) forming a bottom liner on the photosensitive element for supporting a first formation mould; (C2) integrally forming a primary packaging base to form a primary base by the first formation mould to pre-fix the photosensitive element and the circuit board main body that has the disposing area provided thereon.

According to some embodiments, the manufacturing method of photosensitive component further comprises a step after the step (C): electrically connecting the photosensitive element and the circuit board main body through an electrical connection element.

According to some embodiments, the step (C) of the manufacturing method of photosensitive component further comprises a step of: forming a packaging and encapsulating base to package and encapsulate the electrical connection element and forming a ring structure with the packaging and encapsulating base and the primary base.

According to some embodiments, in the manufacturing method of photosensitive component, the step (C) further comprises a step of: utilizing the ring structure as a basis to integrally form a secondary packaging base and form the optical window.

According to some embodiments, in the manufacturing method of photosensitive component, the secondary packaging base and the ring structure form and define a mounting groove adapted for mounting a filter.

According to some embodiments, in the manufacturing method of photosensitive component, the bottom liner and the packaging and encapsulating base are formed by adhesive.

According to some embodiments, in the manufacturing method of photosensitive component, the back side of the photosensitive element and with the bottom side of the circuit board main body are on the same plane.

According to some embodiments, in the manufacturing method of photosensitive component, the peelable basal plate comprises at least a prop, wherein the photosensitive element is peelably supported by the prop.

According to some embodiments, in the manufacturing method of photosensitive component, the integral encapsulation base comprises a lens barrel portion provided thereon and adapted for mounting a lens.

According to some embodiments, in the manufacturing method of photosensitive component, the peeling method is selected from the group consisting of peeling, exposure, hot melting, etching, dissolving, and grinding.

According to some embodiments, the integrally forming step of the manufacturing method of photosensitive component is by transfer molding.

According to some embodiments, the manufacturing method of photosensitive component further comprises a step before the step (C): covering a filter on the photosensitive element.

According to an aspect of the present invention, the present invention provides a molded circuit board component, comprising:

at least a photosensitive element;

a circuit board, having at least an accommodating space provided therein, wherein the photosensitive element is accommodated and received in the accommodating space and communicatively connected with the circuit board; and a retaining portion, having at least an optical window formed therein while integrally formed on the non-photosensitive area of the photosensitive element and the circuit board, wherein the photosensitive area of the photosensitive element is positioned corresponding to the optical window.

According to an embodiment of the present invention, the retaining portion has a coupling side and an attaching side in an opposing manner and an inner surface, wherein the coupling side and the attaching side are corresponding with each other, wherein the coupling side of the retaining portion, the circuit board, and the non-photosensitive area of the photosensitive element are integrally bonded, wherein the inner surface of the retaining portion defines the optical window.

According to an embodiment of the present invention, a size of the opening of the optical window on the coupling side of the retaining portion is smaller than a size of the opening of the optical window on the attaching side.

According to an embodiment of the present invention, at least a part of the inner surface of the retaining portion extends from the coupling side to the attaching side in an inclining and sloping manner, such that a first included angle α formed and defined between at least a part of the inner surface of the retaining portion and the photosensitive axis of the photosensitive element is a sharp angle.

According to an embodiment of the present invention, the inner surface of the retaining portion has a first inner surface, a second inner surface and a third inner surface, wherein the first inner surface is extended from the coupling side toward the attaching side, forming a first included angle α, which is a sharp angle, between the first inner surface and the photosensitive axis of the photosensitive element, wherein the third inner surface is extended from the attaching side toward the coupling side, wherein the second inner surface is extended between two sides to be respectively connected with the first inner surface and the third inner surface, wherein the second inner surface is parallel to the photosensitive element.

According to an embodiment of the present invention, the third inner surface is extended from the attaching side toward the coupling side in an inclining and sloping manner, and a third included angle γ formed and defined between the third inner surface and the photosensitive axis of the photosensitive element is a sharp angle.

According to an embodiment of the present invention, the outer surface of the retaining portion is extended between the coupling side and the attaching side in an inclining and sloping manner, wherein a size of the attaching surface of the attaching side is smaller than a size of the coupling surface of the coupling side.

According to an embodiment of the present invention, the outer surface of the retaining portion is extended between the coupling side and the attaching side in a inclining and sloping manner, wherein the outer surface and the photosensitive axis of the photosensitive element define a second included angle β therebetween, wherein the second included angle β is a sharp angle.

According to an embodiment of the present invention, the value range of the first included angle α is 1°~85°.

According to an embodiment of the present invention, the value range of the first included angle α is 35°~75°.

According to an embodiment of the present invention, the value range of the first included angle α is selected from the group consisting of 5°~10°, 10°~15°, 15°~20°, 20°~25°, 25°~30°, 30°~35°, 35°~40°, 40°~45°, 45°~50°, 50°~55°, 55°~60°, 60°~65°, 65°~70°, 70°~75°, 75°~80°, and 80°~85°.

According to an embodiment of the present invention, the value range of the third included angle γ is 1°~60°. According to an embodiment of the present invention, the value range of the second included angle β is 1°~65°.

According to an embodiment of the present invention, the circuit board has a basal plate inner wall provided to define the accommodating space, wherein the photosensitive element has a chip outer surface, wherein the chip outer surface and the basal plate inner wall has a first safe distance L therebetween, so as to keep the photosensitive element and the circuit board from not contacting with each other.

According to an embodiment of the present invention, the value range of the first safe distance L is 0 mm<L≤5 mm.

According to an embodiment of the present invention, the value range of the first safe distance L is 0.03 mm~5 mm.

According to an embodiment of the present invention, a third safe distance H is provided between the second inner surface and the non-photosensitive area of the photosensitive element, wherein the value range of the third safe distance H is 0 mm<H≤3 mm.

According to an embodiment of the present invention, the value range of the third safe distance H is 0.05 mm~0.2 mm.

According to an embodiment of the present invention, a part of the retaining portion is integrally formed between the basal plate inner wall of the circuit board and the chip outer surface of the photosensitive element.

According to an embodiment of the present invention, a filler is filled between the chip outer surface of the photosensitive element and the basal plate inner wall of the circuit board, wherein the material of the filler is different from the material to form the retaining portion.

According to an embodiment of the present invention, the molded circuit board member further comprises a framework shaped protecting element, wherein the protecting element is formed outside of the photosensitive area of the photosensitive element, wherein the retaining portion covers, encloses, encapsulates and/or wraps up at least a part of the protecting element.

According to an embodiment of the present invention, a part of the protecting element is integrally formed between the basal plate inner wall of the circuit board and the chip outer surface of the photosensitive element.

According to an embodiment of the present invention, the chip upper surface of the photosensitive element and the basal plate upper surface of the circuit board are flatly levelled on the same plane or the chip upper surface of the photosensitive element is lower than the basal plate upper surface of the circuit board.

According to an aspect of the present invention, the present invention further provides a camera module, comprising:

at least an optical lens; and
a molded circuit board member, which further comprises:
at least a photosensitive element;
a circuit board, having at least an accommodating space provided therein, wherein the photosensitive element is accommodated and received in the accommodating space and communicatively connected with the circuit board; and
a retaining portion, having at least an optical window while integrally formed on the non-photosensitive area of the photosensitive element and the circuit board, wherein the photosensitive area of the photosensitive element is positioned corresponding to the optical window, wherein the optical lens is provided along the photosensitive path of the photosensitive element, so as to provide a light path for the optical lens and the photosensitive element through the optical window.

According to an embodiment of the present invention, the camera module further comprises at least a filter mounted on the retaining portion so as to retain the filter between the photosensitive element and the optical lens.

According to an embodiment of the present invention, the camera module further comprises at least an actuator, wherein the optical lens is drivably arranged on the actuator, wherein the actuator is assembled on the retaining portion, so as to retain the optical lens in the photosensitive path of the photosensitive element by the actuator.

According to an aspect of the present invention, the present invention further provides an electronic device with camera module, comprising:

an electronic device body; and
at least a camera module, arranged on the electronic device body for capturing image, wherein the camera module further comprises:
at least an optical lens; and
a molded circuit board member, which further comprises:
at least a photosensitive element;
a circuit board, having at least an accommodating space provided therein, wherein the photosensitive element is accommodated and received in the accommodating space and communicatively connected with the circuit board; and
a retaining portion, having at least an optical window while integrally formed on the non-photosensitive area of the photosensitive element and the circuit board, wherein the photosensitive area of the photosensitive element is arranged corresponding to the optical window, wherein the optical lens is provided along the photosensitive path of the photosensitive element, so as to provide a light path for the optical lens and the photosensitive element through the optical window.

According to an embodiment of the present invention, at least one of the camera modules is arranged on a back portion of the electronic device body to form a back camera module; or that at least one of the camera modules is arranged on a front portion of the electronic device body to form a front camera module; or that at least one of the camera modules is arranged on the back portion of the electronic device to form a back camera module and at least one of the camera modules is arranged on the front portion of the electronic device to form a front camera module.

According to an aspect of the present invention, the present invention further provides a manufacturing method of molded circuit board member, wherein the manufacturing method comprises the following steps:

(a) electrically connecting a circuit board and a photosensitive element accommodated in an accommodating space of the circuit board;

(b) placing the circuit board and the photosensitive element, which are electrically connected with each other, in a lower mold of a formation mould;

(c) clamping an upper mold and the lower mold of the formation mould to form and define a molding space between the upper mold and the lower mold for accommodating the electrically connected circuit board and photosensitive element therein, and positioning a part of the circuit board and a part of the non-photosensitive area of the photosensitive element corresponding to a forming guide groove of an surrounding member of the upper mold, and positioning the photosensitive area of the photosensitive element corresponding to an optical window molding member of the upper mold; and (d) filling a fluid molding material into the molding space to integrally form a retaining portion at the circuit board and the photosensitive element after the molding material in the forming guide groove is solidified and to form an optical window of the retaining portion at a position corresponding to the optical window molding member, so as to make the molded circuit board member.

According to an embodiment of the present invention, in the step (a), a first safe distance L is formed and defined between the inner wall of the basal plate of the circuit board and the chip outer surface of the photosensitive element, wherein the value range of the first safe distance L is 0 mm<L≤5 mm.

According to an embodiment of the present invention, in the step (c), a second safe distance h is formed and defined between the pressing surface of the optical window molding member and the photosensitive area of the photosensitive element, wherein the value range of the second safe distance h is 0 mm<h≤1 mm.

According to an embodiment of the present invention, the manufacturing method further comprises a step of: forming a groove in a middle of a pressing surface of the optical window molding member, wherein the groove is positioned corresponding to the photosensitive area of the photosensitive element, so as to form and define a second safe distance h between the pressing surface of the optical window molding member and the photosensitive area of the photosensitive element.

According to an embodiment of the present invention, the manufacturing method further comprises a step of: forming a framework shaped protecting element outside the photosensitive area of the photosensitive element, wherein the pressing surface of the optical window molding member exerts pressure on the protecting element, so as to form and define a second safe distance h between the pressing surface of the optical window molding member and the photosensitive area of the photosensitive element.

According to an embodiment of the present invention, in the step (c), the surrounding member comprises an internal guide groove forming side wall, an external guide groove forming side wall, and a guide groove forming roof, wherein the internal guide groove forming side wall and the external guide groove forming side wall respectively extend from two sides of the guide groove forming roof, so as to form and define the forming guide groove, wherein the guide groove forming roof and the non-photosensitive area of the photosensitive element have a third safe distance H therebetween, wherein the value range of the third safe distance H is 0 mm<H≤3 mm.

According to an embodiment of the present invention, in the step (c), the surrounding member comprises an internal guide groove forming side wall, an external guide groove forming side wall and a guide groove forming roof, wherein the internal guide groove forming side wall and the external guide groove forming side wall respectively extend from two sides of the guide groove forming roof, so as to form and define the forming guide groove, wherein inner forming guide groove has a first inner wall, a second inner wall and a third inner wall, wherein the first inner wall, the second inner wall and the third inner wall are respectively extended from the opening of the forming guide groove to the guide groove forming roof, wherein the second inner wall and the photosensitive element are parallel, wherein the second inner wall and the non-photosensitive area of the photosensitive element have a third safe distance H therebetween, wherein the value range of the third safe distance H is 0 mm<H≤3 mm.

According to an embodiment of the present invention, the internal guide groove forming side wall and the photosensitive axis of the photosensitive element form and define a first included angle α therebetween, wherein the value range of the first included angle α is 1°~85°.

According to an embodiment of the present invention, the first inner wall and the photosensitive axis of the photosensitive element form and define a first included angle α therebetween, wherein the value range of the first included angle α is 1°~85°.

According to an embodiment of the present invention, the third inner wall and the photosensitive axis of the photosensitive element form and define a third included angle γ therebetween, wherein the value range of the third included angle γ is 1°~60°.

According to an embodiment of the present invention, the external guide groove forming side wall and the photosensitive axis of the photosensitive element form and define a second included angle β therebetween, wherein the value range of the second included angle β is 1°~65°.

According to an embodiment of the present invention, the value range of the first included angle α is 35°~75°.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1:
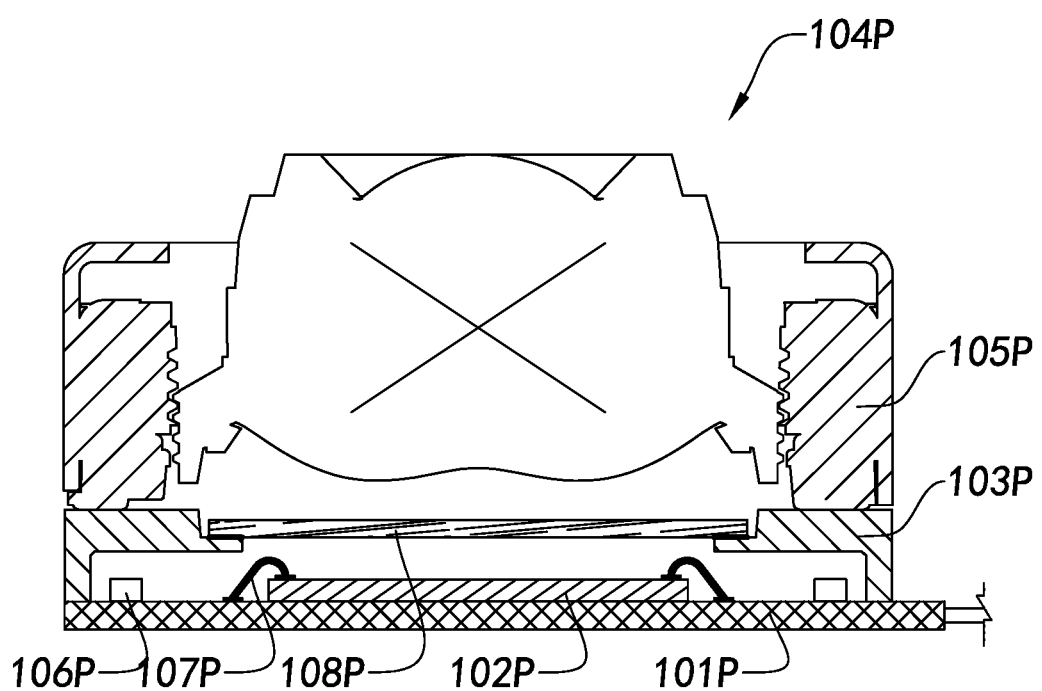
FIG. 1 is a sectional view illustrating a camera module packaged through conventional COB technique.
Figure 2:
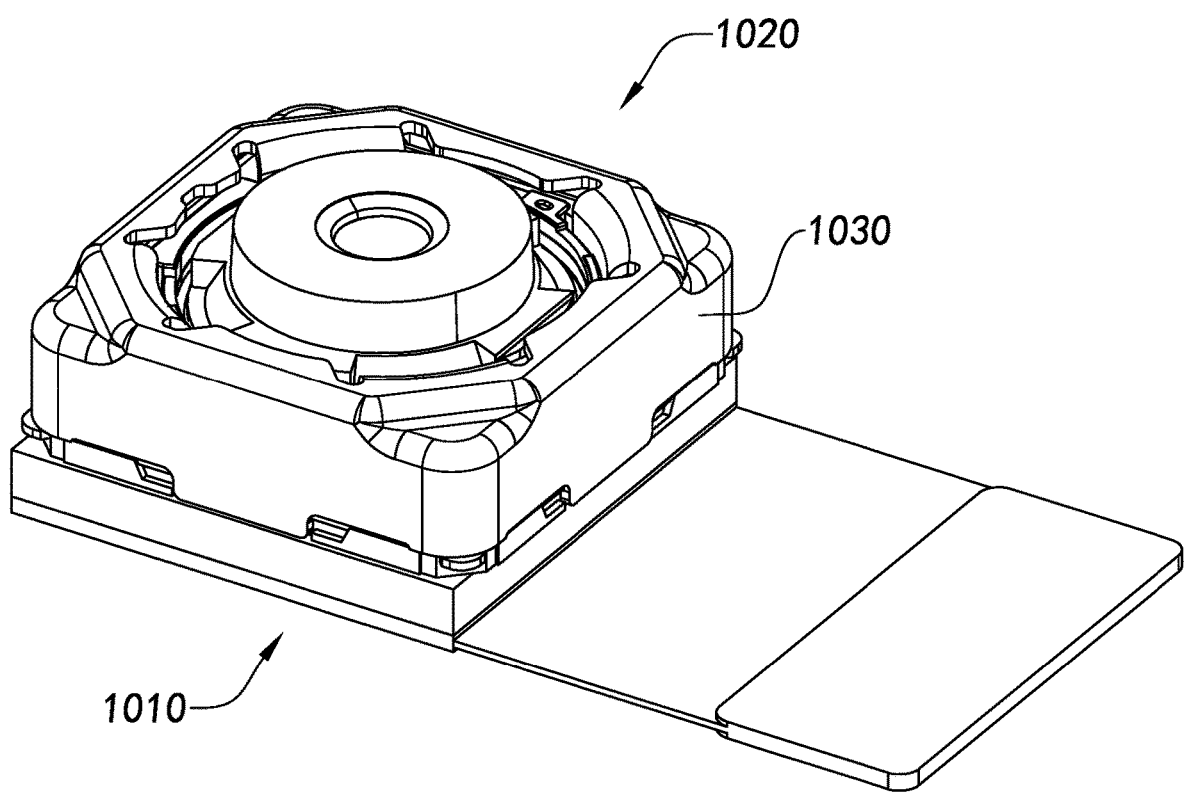
FIG. 2 is a perspective view of a camera module according to a first preferred embodiment of the present invention.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Those skilled in the art should understand that, in the disclosure of the present invention, terminologies of "longitudinal," "lateral," "upper," "front," "back," "left," "right," "perpendicular," "horizontal," "top," "bottom," "inner," "outer," and more that indicate relations of direction or position are based on the relations of direction or position shown in the appended drawings, which is only for ease of describing the present invention and simplifying the description, rather than to indicate or imply that the referred device or element has to apply specific direction or to be operated or structured in specific direction. Therefore the above-mentioned terminologies shall not be interpreted as confine to the present invention.

FIGS. 2-5 illustrate a camera module according to a first preferred embodiment of the present invention. The camera module comprises at least a photosensitive component 1010, at least a lens 1020, and at least an optical filter 1040.

The optical filter 1040 is mounted on the photosensitive component 1010 and positioned along a photosensitive path of the photosensitive component 1010. The lens 1020 is installed along the photosensitive path of the photosensitive component 1010. For example, during capturing images, the light reflected form an object enters into the camera module through the lens 1020. The light reaches the photosensitive component 1010 after optical effect of the lens 1020 and the optical filter 1040. After sensing the light by the photosensitive component 1010 for photoelectric conversion, the light is converted into electric signal(s) which is transmitted by the photosensitive component 1010 to an electronic device equipped with the camera module to display the corresponding image(s) so as to complete an image capturing process of the object.

Further, the camera module may also comprise at least an actuator 1030. The lens 1020 is installed on the actuator 1030. The actuator 1030 is installed on the photosensitive component 1010. Accordingly, the lens 1020 is positioned in the photosensitive path of the photosensitive component 1010 while a focal length of the camera module can be adjusted through the actuator 1030. The actuator 1030 can be embodied as a motor unit, for example but not limited to a voice coil motor, piezoelectricity motor, and etc. In other words, according to this embodiment of the present invention, the camera module can be an automatic focus model (AFM). Certainly, according to other embodiments of the present invention, the camera module can also be other types, such as a fix focus model (FFM) type and etc. Those skilled in the art should understand that specific type of the camera module shall not limit the scope the present invention.

The optical filter 1040 can be infrared-cut filter, wafer level infrared-cut filter or blue glass infrared-cut filter. Those skilled in the art should understand that specific type of the optical filter 1040 would not limit the scope the present invention.

The photosensitive component 1010 comprises at least a photosensitive element 1011, at least a window-form circuit board 1012 and at least a packaging body 1013. The photosensitive element 1011 and the window-form circuit board 1012 are arranged in a spatially overlapping manner, so as to reduce a relative height between the photosensitive element 1011 and the window-form circuit board 1012. The photosensitive element 1011 and the window-form circuit board 1012 are integrally encapsulated through the packaging body 1013.

The packaging body 1013 has at least an optical window 10134 for providing a light path for the photosensitive element 1011. In other words, light entered through the lens 1020 passes through the optical window 10134 and reaches the photosensitive element 1011 for photoelectric conversion.

In the present embodiment of the present invention, the packaging body 1013 forms a step structure internally, adapted for mounting the optical filter 1040. Certainly, the step structure may also be utilized for mounting the actuator 1030 or the lens 1020. Therefore, those skilled in the art should understand that the element being mounted on the packaging body 1013 shall not limit the present invention.

The photosensitive element 1011 has a top surface 10111 and a bottom surface 10112. The top surface 10111 and the lens 1020 are arranged correspondingly in face to face manner for conducting photoelectric conversion.

Further, the top surface 10111 of the photosensitive element 1011 provides a photosensitive area 101111 and a non-photosensitive area 101112. The photosensitive area 101111 is adapted for sensing light. The non-photosensitive area 101112 is adapted to be electrically connected with the window-form circuit board 1012, so as to transmit the photoelectrically converted electrical signal of the photosensitive area 101111 to the window-form circuit board 1012. According to one implementation, the photosensitive element 1011 may be embodied to be a square shaped CCD or CMOS chip and the non-photosensitive area 101112 is arranged around a periphery of the photosensitive area 101111. The window-form circuit board 1012 may comprise an embedded electric circuit that is utilized for handling and processing electrical signal transmitted from the photosensitive element 1011.

The packaging body 1013 integrally encapsulates at least a part of the non-photosensitive area 101112 of the photosensitive element 1011. In other words, the packaging body 1013 is capable of encapsulating a part of the non-photosensitive area 101112 of the photosensitive element 1011 or encapsulating the entire non-photosensitive area 101112 of the photosensitive element 1011.

The photosensitive element 1011 is electrically connected with the window-form circuit board 1012 through one or more electrical connection elements 1014 for allowing and achieving the electrical signal transmission between the photosensitive element 1011 and the window-form circuit board 1012. The electrical connection element 1014 can be a connection element made of material selected from the group consisting of gold, silver, copper, aluminum, and conductive nonmetal, such that it can be, for example but not limited to, gold wire, silver wire, copper wire, aluminum wire, and etc. According to a manufacturing method, each of the one or more electrical connection elements 1014 is deployed and connected to the photosensitive element 1011 and the window-form circuit board 1012 through Wired/Bond (W/B) technology. In particular, each of the electrical connection elements 1014 electrically connects the non-photosensitive area 101112 of the photosensitive element 1011 and the window-form circuit board 1012.

The photosensitive component 1010 comprises one or more electronic components 10123 protruded from the window-form circuit board 1012. The one or more electronic components 10123 are electrically connected with the window-form circuit board 1012. The electronic component 10123 can be a resistor, a capacitor, a driving component, a signal processing component, a storage element, and etc. The one or more electronic components 10123 are electronic components 10123 of the window-form circuit board 1012 for making electrical signal transmission. Nevertheless, according to other embodiments, the window-form circuit board 1012 may not have electronic component 10123 protruded therefrom, or that the electronic components are embedded in the window-form circuit board 1012. Those skilled in the art should understand that specific type and arrangement of the electronic components 10123 shall not limit the scope the present invention.

The one or more electronic components 10123 and the one or more electrical connection elements 1014 are encapsulated in the packaging body 1013. In other words, the one or more electrical connection elements 1014 and the one or more electronic components 10123 are covered, packaged, and enclosed by the packaging body 1013, so as not to be exposed to the outside environment. While in the conventional manner, the connecting gold wires and the resistance-capacitance components are usually exploded to outside. On one hand, dirt on gold wires and the resistance-capacitance components substantially affect the quality of the camera module. On the other hand, it needs spaces to mount the gold wires and resistance-capacitance components in position, which causes a waste of space in the camera module.

The window-form circuit board 1012 comprises a circuit board main body 10121 and has a window 10122. The window 10122 is provided in the circuit board main body 10121 to form the window-formed circuit board 1012. The photosensitive element 1011 is accommodated and received in the window 10122, so as to minimize the space additionally occupied by the photosensitive element 1011 with respect to the size of the window-formed circuit board 1012.

In other words, the photosensitive element 1011 is accommodated and received in the window 10122 of the window-form circuit board 1012, such that the photosensitive element 1011 is sunken with respect to the position of the circuit board main body 10121, so as to lower a relative height between the photosensitive element 1011 and the circuit board main body 10121. When a height of the top surface 10111 of the photosensitive element 1011 is not higher than the top side 101211 of the circuit board main body 10121, the circuit board main body 1011 provides sufficient space in the window 10122 for completely receiving the photosensitive element 1011 therein and the overall height of the photosensitive element 1011 and the circuit board main body 10121 is merely equal to the height of the circuit board main body 10121.

Figure 3:
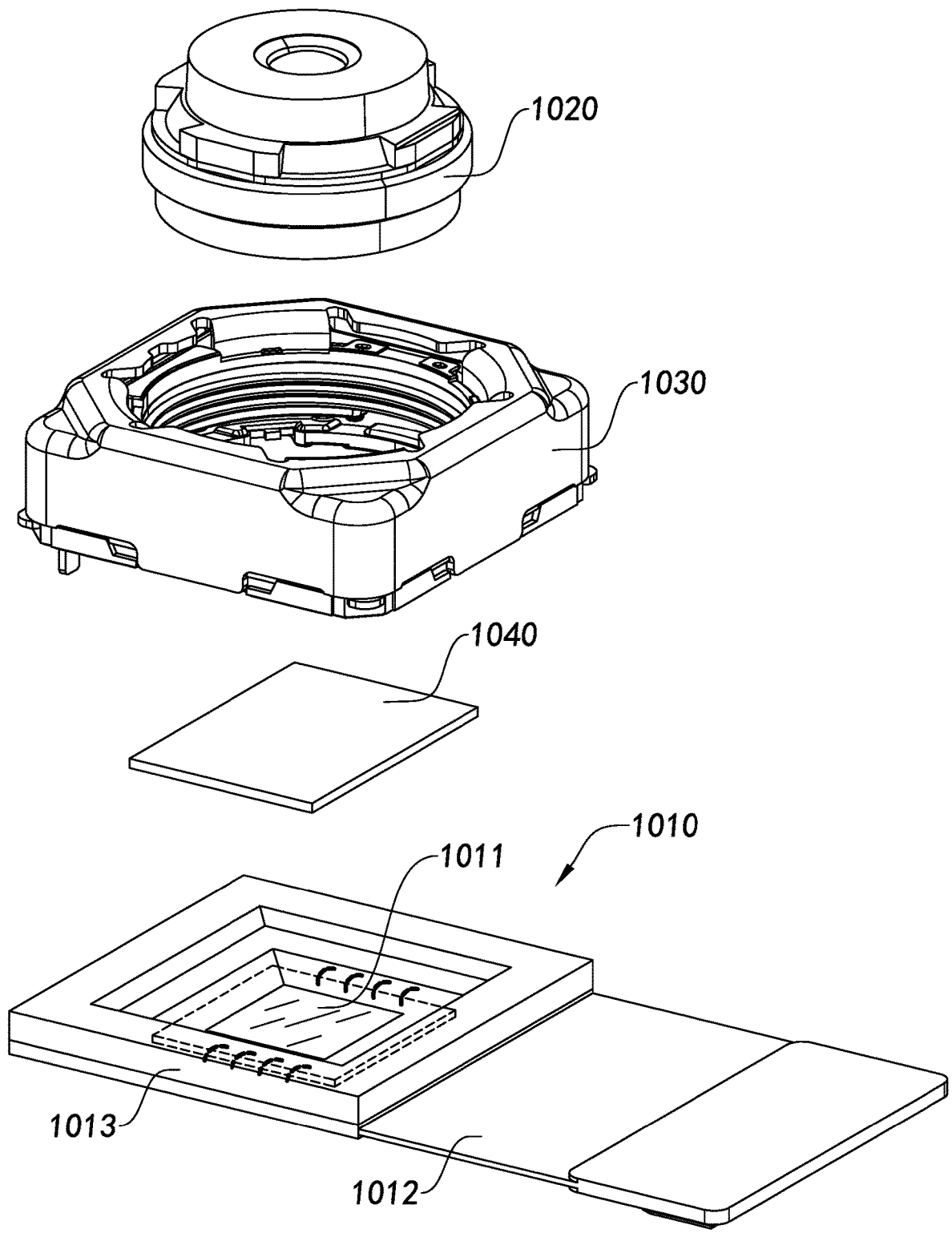
FIG. 3 is an exploded view of a camera module according to the above first preferred embodiment of the present invention.
Figure 4:
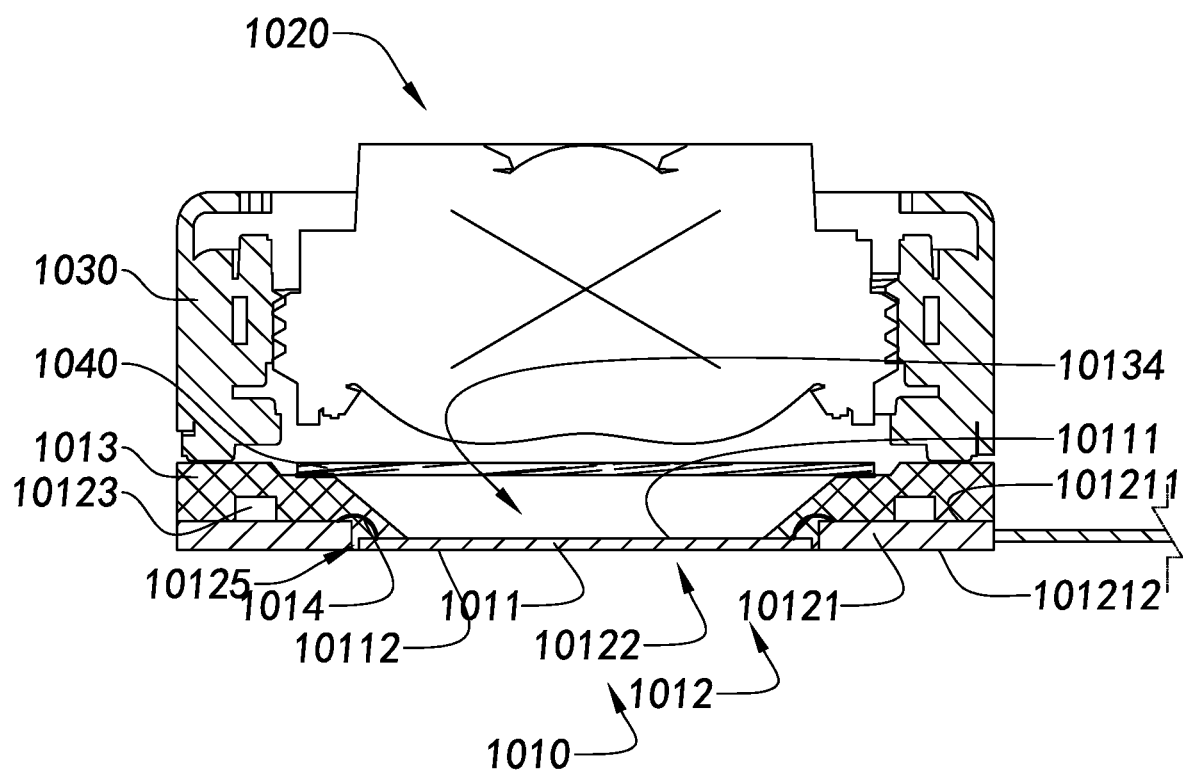
FIG. 4 is a sectional perspective view of a camera module according to the above first preferred embodiment of the present invention.
Figure 5:
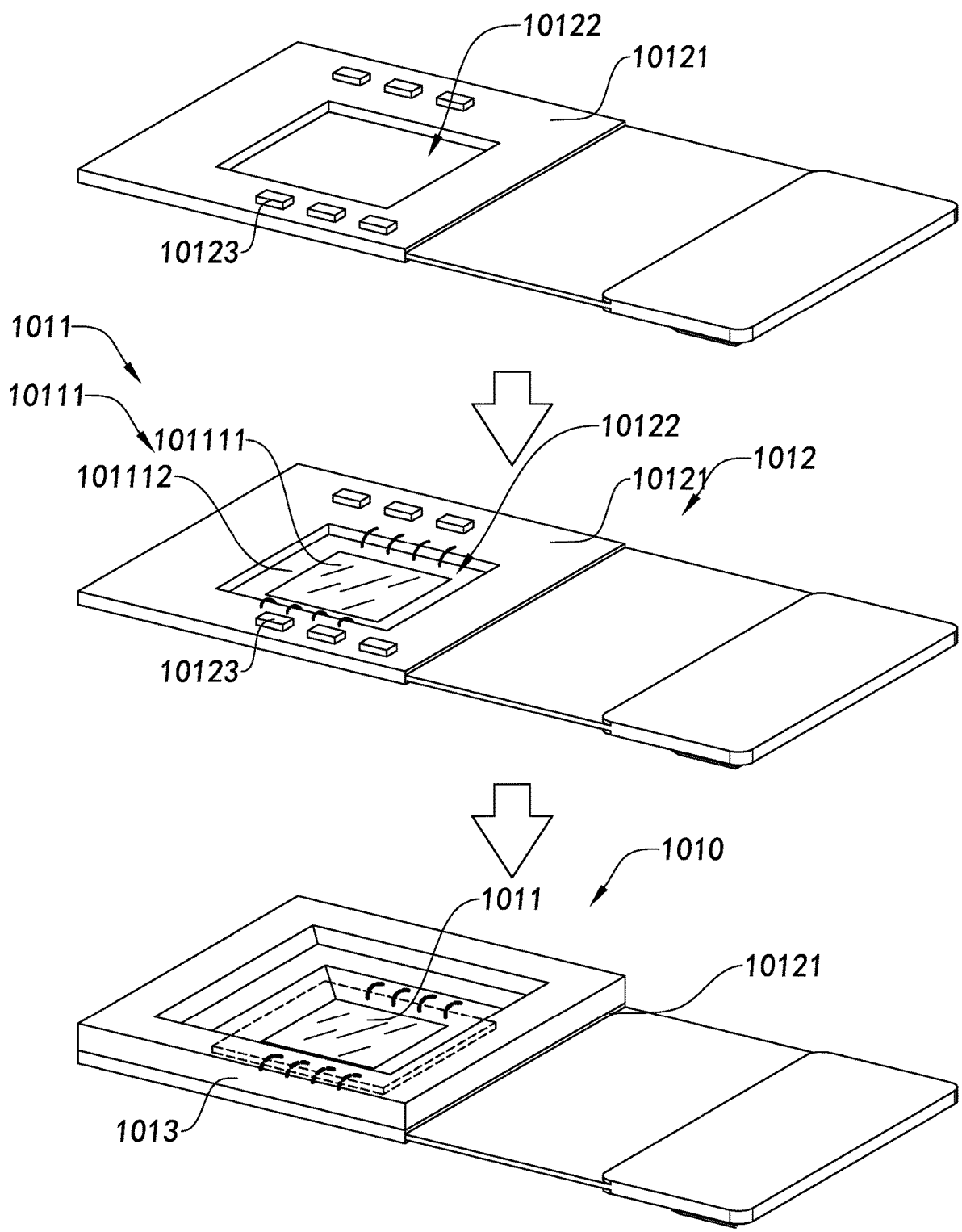
FIG. 5 is a perspective view illustrating a manufacturing process of the photosensitive component of the camera module according to the above first preferred embodiment of the present invention.

The circuit board main body 10121 has a top side 101211 and a bottom side 101212. The packaging body 1013 is encapsulated on the top side 101211 of the circuit board main body 10121 and the non-photosensitive area 101112 of the top surface 10111 of the photosensitive element 1011. The size of the window 10122 of the window-form circuit board 1012 is arranged according to the size of the photosensitive element 1011, which can be equal to the size of the photosensitive element 1011, so that the window 10122 is adapted for accommodating the photosensitive element 1011. Alternatively, it can be larger than the photosensitive element 1011, so as to not only accommodate the photosensitive element 1011 therein, but also enable adjustment of the position of the photosensitive element 1011 therein. According to one implementation, a gap 10125 can be reserved between the photosensitive element 1011 and the window-form circuit board 1012 so as to facilitate the assembling and affix the photosensitive element 1011 in position by filling up the gap 10125 by the packaging body 1013. Referring to FIG. 3, according to one implementation, the packaging body 1013 is extended in the gap 10125 and fills up the space between the circuit board main body 10121 and the photosensitive element 1011. In addition, the packaging body 1013 extended into the gap 10125 generally has the same level with the bottom surface 10112 of the photosensitive element 1011 and the bottom side 101212 of the circuit board main body 10121. Accordingly, the packaging body 1013 can reinforce the mounting of the photosensitive element 1011 with the window-form circuit board 1012.

Figure 6A:
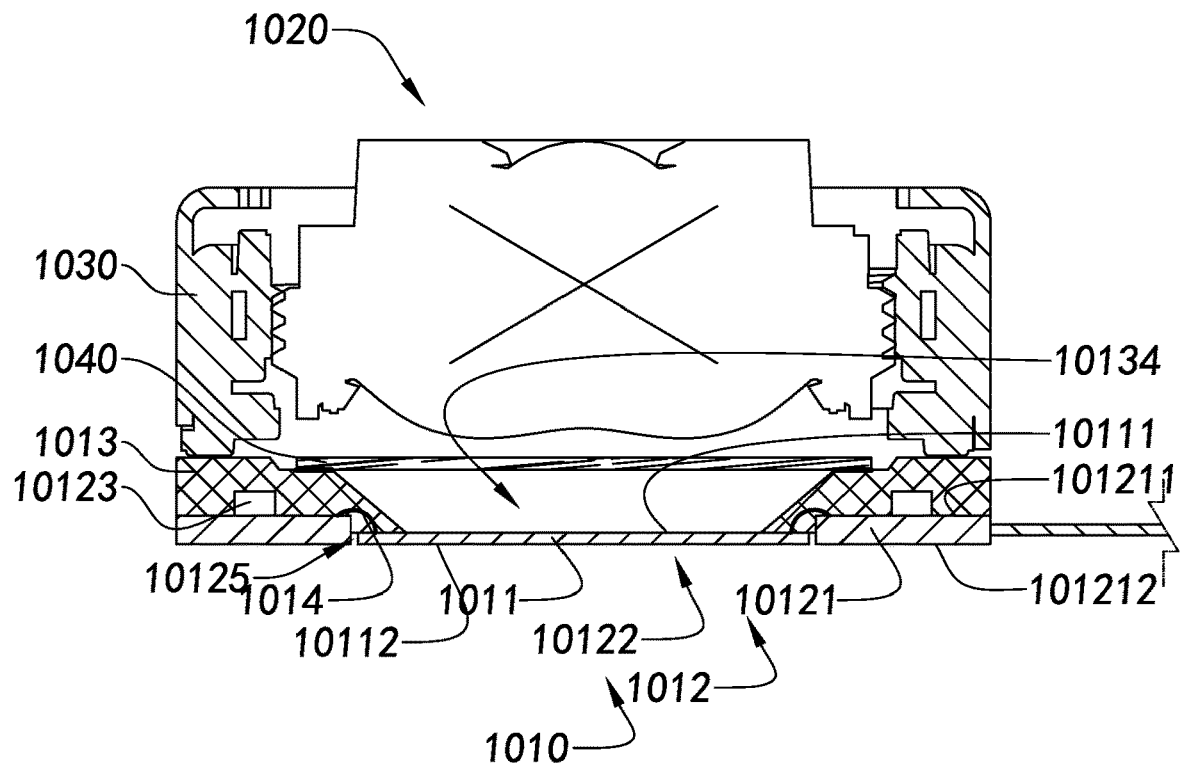
FIGS. 6A and 6B illustrate two first equivalent implementations of the packaging body of the photosensitive component of the camera module according to the above first preferred embodiment of the present invention.
Figure 6B:
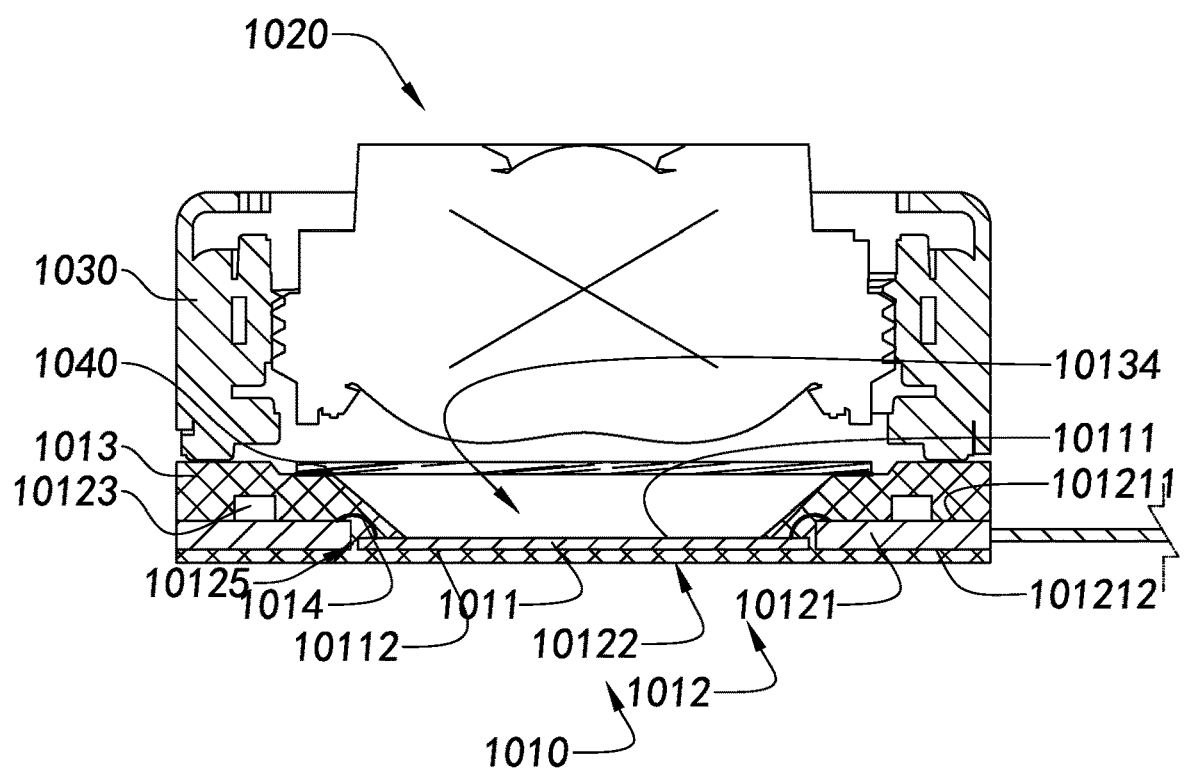

Referring to FIG. 6A, according to another embodiment, the packaging body 1013 does not extend into the gap 10125 and the heights of the packaging body 1013, the top surface 10111 of the photosensitive element 1011, and the top side 101211 of the circuit board main body 10121 are approximately the same, wherein during the implementation process, an adhesive, such as glue and etc., is used to adhere the photosensitive element 1011 with the circuit board main body 10121 that prevents the packaging body 1013 from entering the gap 10125. Referring to FIG. 6B, according to another embodiment, the packaging body 1013 extends into the gap 10125 and passes through the gap 10125 to cover, enclose, encapsulate and/or wrap up a bottom of the photosensitive component 1010. Person skilled in the art should understand that the gap 10125 and the relationship between the gap 10125 and the packaging body 1013 can both be arranged according to the needs. Accordingly, the size of the gap 10125 and the position of the packaging body 1013 extending in the gap 10125 shall not be considered as limitation of the present invention.

It is worth mentioning that, according to other embodiment, the circuit board main body 10121 may directly contact with the photosensitive element 1011 instead of having the gap 10125 therebetween. It is worth mentioning that when the packaging body 1013 is extended to cover the bottom of the window-form circuit board 1012 to reinforce the window-form circuit board 1012 and the photosensitive element 1011, a conventional reinforcing plate has no need to attach on the bottom of the circuit board as in the conventional art. Instead, the packaging body 1013 itself is capable of serving as a reinforcement to the window-form circuit board 1012. Certainly, it may further provide an additional reinforcing plate attached on the back side of the window-form circuit board 1012 encapsulated by the packaging body 1013 according to the present invention to further reinforce the packaging intensity and strength of the photosensitive component 1010.

During the manufacture of the photosensitive component 1010, firstly a window 10122 is formed in the circuit base board to form the window-form circuit board 1012 with the window 10122. Secondly, the photosensitive element 1011 is provided inside the window 10122 (or the photosensitive element 1011 is affixed with the window-form circuit board 1012 by adhesive). Then, the photosensitive element 1011 is electrically connected with the circuit board main body 10121 by one or more electrical connection elements 1014 by means of bonding and etc. Further, the non-photosensitive area 101112 of the photosensitive element 1011, the electrical connection element 1014, the electronic components 10123, and the window-form circuit board 1012 are integrally encapsulated by the packaging body 1013 by means of encapsulation.

The material of the circuit board main body 10121 can be rigid-flex circuit board (RG), flex print circuit board (FPC), printed circuit board (PCB), ceramic board, and etc.

It is worth mentioning that, an encapsulated part of the non-photosensitive area 101112 of the photosensitive element 1011 can be formed as required. In other words, the non-photosensitive area 101112 can be completely covered, or be partially covered. One skilled in the art would understand that the size and the shape of the encapsulated part of the non-photosensitive area 101112 shall not be limited in the present invention.

In the present invention, the packaging body 1013 is integrally formed by means of molding, which is different from the conventional base adhered on the circuit board. During the manufacture of the photosensitive component 1010, the photosensitive element 1011 and the window-form circuit board 1012 are placed in a mould, and then molding material is filled into the mould to form the packaging body 1013 after solidification, wherein the photosensitive element 1011 with the window-form circuit board 1012 are affixed by the packaging body 1013. The molding material can be nylon, liquid crystal polymer (LCP), polypropylene (PP), epoxy resin, other thermoplastic or thermosetting material, and etc.

By means of this encapsulation manner, the conventional step of adhering the base is eliminated. And, since the packaging body 1013 is made by molding, it is more easy to control and provides flatter surface, so as to provide a flatness mounting condition for the optical filter 1040, the actuator 1030 and the lens 1020 to ensure the alignment of the optical axis of the camera module. On the other hand, the adhesive space used in conventional art is minimized that substantially helps to reduce the height of the camera module. Furthermore, in the embodiment of the present invention, the photosensitive element 1011 is placed inside the window 10122 for integral encapsulation subsequently. Therefore, there is no need to consider the thickness of the photosensitive elements 1011 while ensuring the room of reducing the height of the camera module.

The packaging body 1013 has a ring-shape from its top view, examplary as squared-ring, circle-ring or triangle-ring, to provide an installation place for the optical filter 1040, the actuator 1030 or the lens 1020 to form a concealed inner environment when the actuator 1030 or the lens 1020 is installed on the packaging body 1013. With the advantages of integral molding, the flatness of the surface of the packaging body 1013 is ensured to provide flat, level, and smooth installation conditions for the optical filter 1040, the lens 1020 or the actuator 1030.

According to this embodiment of the present invention, the window 10122 is a through hole. In other words, the window 10122 communicates the two sides of the circuit board main body 10121 to provide an adjustable space for the photosensitive element 1011. In other words, the relative position of the photosensitive element 1011 in the window 10122 with respect to the circuit board main body 10121 may also be determined according to the needs.

It is worth mentioning that, according to the present invention, the photosensitive element 1011 and the window-form circuit board 1012 are integrally encapsulated by the packaging body 1013, so that when the photosensitive element 1011 is installed in the window 10122, it does not require any additional supporting element to affix the photosensitive element 1011, that, as a result, allows the position of the photosensitive element 1011 to be freely arranged and determined relatively. In other words, the packaging body 1013 affixes the photosensitive element 1011 and the circuit board main body 10121 from the top, without the need to support and affix the photosensitive element 1011 by the circuit board main body 10121 or other components from other direction, for example a lower direction. Besides, the integral encapsulation of the packaging body 1013 can also reinforce a structural strength of the circuit board main body 10121 and the photosensitive element 1011.

Further, according to this implementation of the present invention, the photosensitive element 1011 is arranged at a position close to the underneath of the window 10122, wherein each of the electrical connection element 1014 has an end electrically connected with the non-photosensitive area 101112 of the photosensitive element 1011 and another end passing through the window 10122 to electrically connected with the circuit board main body 10121.

Further, the bottom surface 10112 of the photosensitive element 1011 and the bottom side 101212 of the circuit board main body 10121 are relatively arranged on the same plane, such that the bottom of the photosensitive component 1010 is relatively flat and smooth without obvious rugged condition. In other words, the bottom surface 10112 of the photosensitive element 1011 and the bottom side 101212 of the circuit board main body 101212 provide a generally flat and and even surface.

In this implementation, the bottom surface 10112 of the photosensitive element 1011 is exposed to outside so as to enhance the heat dissipation of the photosensitive element. It is different from the conventional way that the photosensitive element is directly attached on the circuit board so that the bottom of the photosensitive element is blocked by the circuit board that results in poorer heat dissipation than the present invention.

For example, the present invention provides two manufacturing methods of the window-form circuit board 1012. According to one of the methods, the window 10122 is made in the basal plate layers, where the size of the window 10122 is determined according to the size of the photosensitive element 1011. Then, the basal plate layers are overlappedly arranged and a circuit is embedded between the predetermined basal plate layers, so as to form and make the window-form circuit board 1012 having the window 10122. According to another method, the basal plates are overlapped arranged and a circuit is embedded between the basal plate layers along a predetermined route according to the deploying position of the photosensitive element 1011. Then, the window 10122 is formed in the overlapped basal plate layers and positioned outside the embedded circuit according to the shape of the photosensitive element 1011, which means that it will not damage the circuit.

Figure 7:
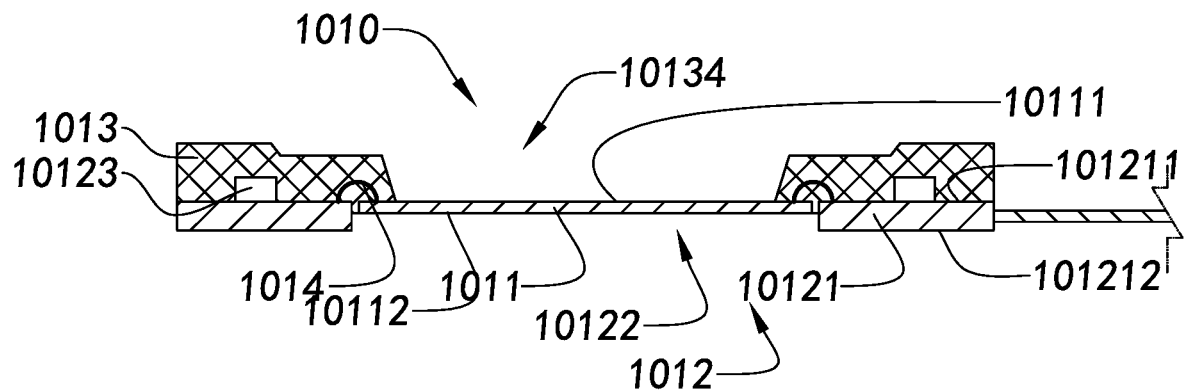
FIG. 7 illustrates a first alternative mode of the photosensitive component of the camera module according to the above first preferred embodiment of the present invention.

Referring to FIG. 7, a first alternative mode of the photosensitive component 1010 of the camera module according to the above first preferred embodiment of the present invention is illustrated, which is different from the above preferred embodiments that, the heights of the top surface 10111 of the photosensitive element 1011 and the top side 101211 of the circuit board main body 10121 are relatively the same. In other words, the top surface 10111 of the photosensitive element 1011 and the top side 10121 of the circuit board main body 101211 form a generally flat and even upper surface, wherein a space is reserved below the photosensitive element 1011. Under the condition that the upper surface of the top surface 10111 of the photosensitive element 1011 an the top side of the circuit board main body 101211 is flat and even, the photosensitive element 1011 and the window-form circuit board 1012 are electrically connected through the one or more electrical connection elements 1014.

During the manufacturing of this type of photosensitive element 1011, a protruding table fixture can be provided for supporting the photosensitive element 1011, so as to ensure the top surface of the photosensitive element 1011 and the top side of the window-form circuit board 1012 forming a flat and even upper surface. Then, the photosensitive element 1011 and the window-form circuit board 1012 are integrally encapsulated to form the packaging body 1013, so as to hold and affix the photosensitive element 1011 and the window-form circuit board 1012 in position by the packaging body 1013.

Figure 8:
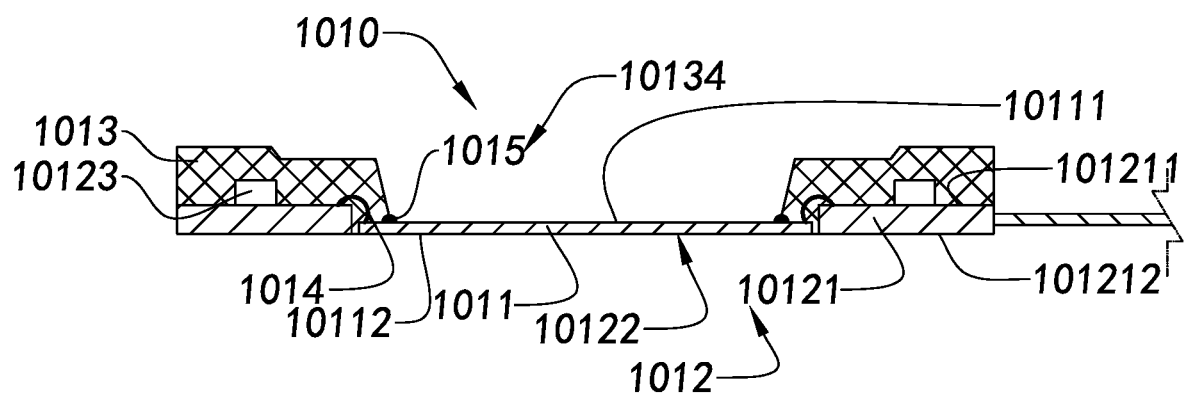
FIG. 8 illustrates a second alternative mode of the photosensitive component of the camera module according to the above first preferred embodiment of the present invention.

Referring to FIG. 8, a second alternative mode of the photosensitive component 1010 of the camera module according to the above first preferred embodiment of the present invention is illustrated, which is different from the above implementation that, the photosensitive element 1011 comprises a blocking element 1015 which is arranged at a junction positioned between the packaging body 1013 and the photosensitive element 1011, so as to avoid the packaging body 1013 from affecting an inner area of the photosensitive element 1011, such as polluting the photosensitive area 101111 and etc. In particular, the blocking element 1015 is arranged surrounding an outer side of the photosensitive area 10111, so as to block and prevent the fluid molding material for molding the packaging body 1013 from entering into the photosensitive area 101111 during the manufacturing process and to protect the photosensitive element 1011 during the mold clamping process.

The blocking element 1015 has a ring shape or frame shape structure, arranged on the photosensitive element 1011. In other words, the inner edge of the packaging body 1013 is blocked with the adjacent position of the photosensitive element 1011 by the blocking element 1015.

The blocking element 1015 may also be formed with adhesive colloid or plastic material having a predetermined shape.

During the manufacturing process of the photosensitive component 1010, before integrally encapsulating and packaging the photosensitive element 1011 and the window-form circuit board 1012, the blocking element 1015 is required to be arranged on the photosensitive element 1011, such as applying adhesive thereon as the blocking element 1015, so that the blocking element 1015 is utilized as a boundary to form the packaging body 1013 and prevent the material of the packaging body 1013 from polluting the area of the photosensitive element 1011 surrounded by the inner side of the blocking element 1015.

Figure 9:
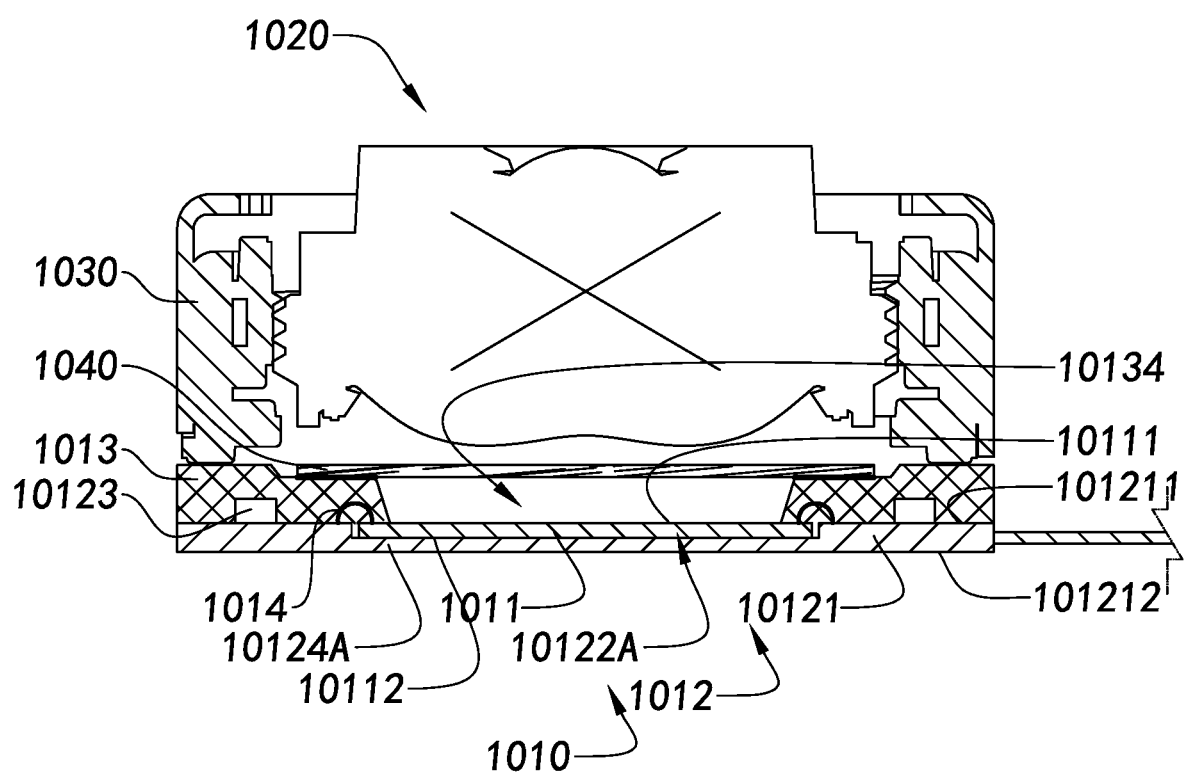
FIG. 9 is a sectional perspective view of a camera module according to a second preferred embodiment of the present invention.
Figure 10:
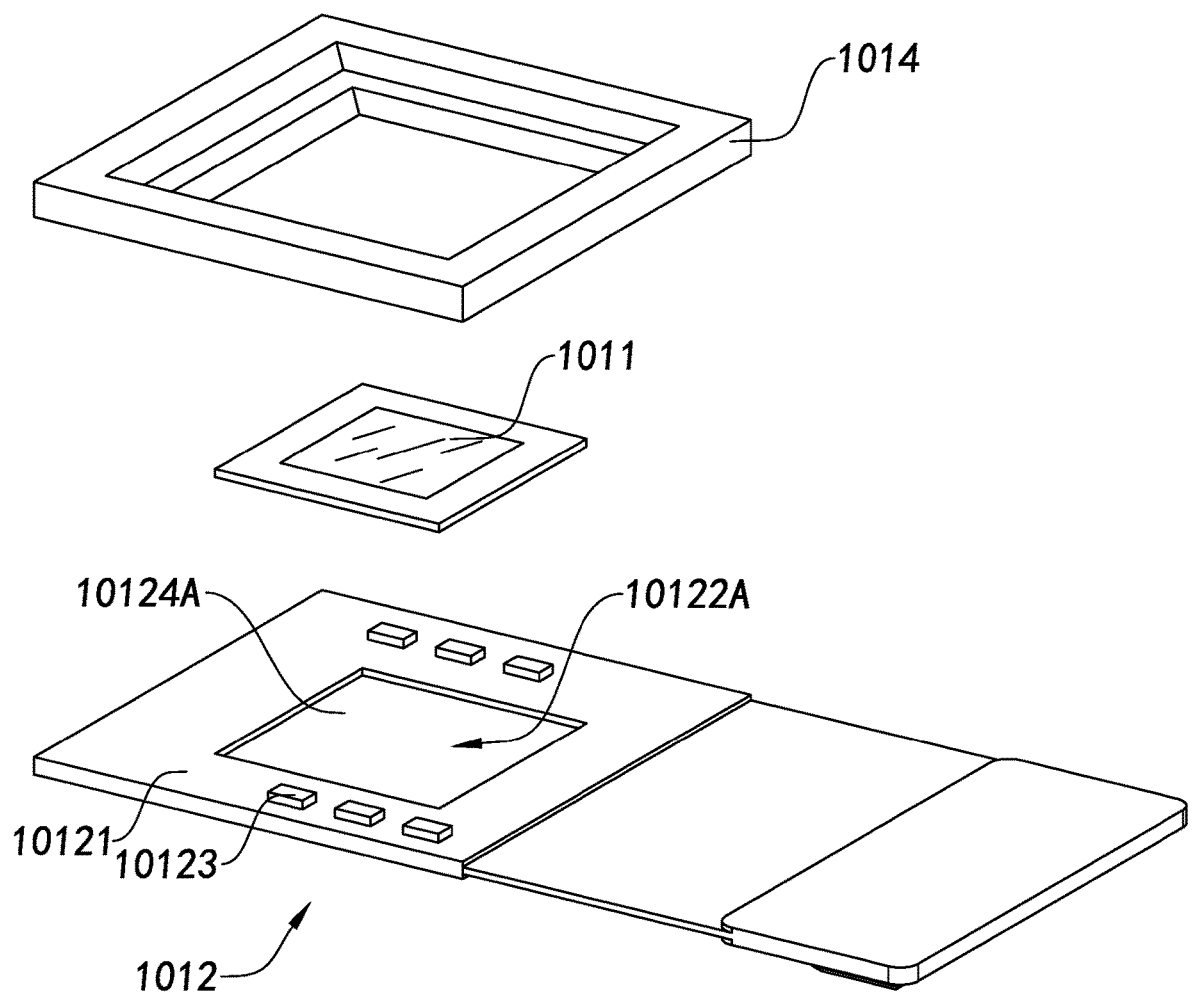
FIG. 10 is an exploded view of a photosensitive component of the camera module according to the above second preferred embodiment of the present invention.

Referring to FIGS. 9-10, a camera module according to a second preferred embodiment of the present invention is illustrated, which is different from the above preferred embodiments that, the window 10122A is a recess rather than a through hole. In other words, the photosensitive element 1011 is accommodated and received in the recess structure, such that a relative height difference between the top surfaces of the photosensitive element 1011 and the window-form circuit board 1012 can be reduced. In addition, when a depth of the recess is larger than or equal to the thickness of the photosensitive element 1011, the overall thickness of the photosensitive element 1011 and the window-form circuit board 1012 is equal to the thickness of the window-form circuit board 1012.

The window 10122A has a window bottom 10124A, wherein the photosensitive element 1011 is provided on the window bottom 10124A. The size of the window bottom 10124A matches with the size of the photosensitive element 1011 to ensure the top surfaces of the photosensitive element 1011 and the circuit board main body 10121 forming a flat and even surface. Of course, a gap may be formed between the photosensitive element 1011 and the circuit board main body 10121 for filling with adhesive to connect and affix the photosensitive element 1011 and the circuit board main body 10121 in position.

In the present embodiment of the present invention, the one or more electrical connection elements 1014 are used to electrically connect the photosensitive element 1011 with the circuit board main body 10121. In particular, the one or more electrical connection elements 1014 are connected to the photosensitive element 1011 located inside the window 10122A and the top side 101211 of the circuit board main body located outside the window 10122A.

Figure 11:
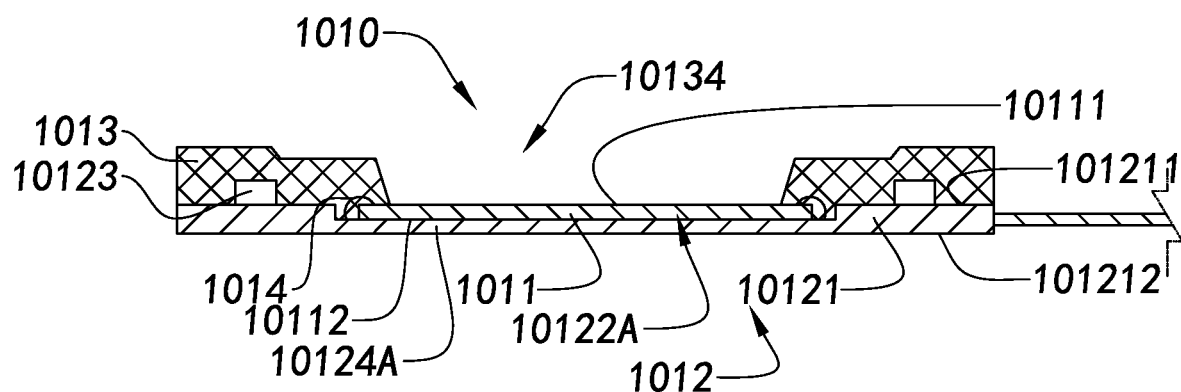
FIG. 11 illustrates an alternative mode of the photosensitive component of the camera module according to the above second preferred embodiment of the present invention.

Referring to FIG. 11, an alternative mode of the photosensitive component 1010 of the camera module according to the above second preferred embodiment of the present invention is illustrated, which is different from the above embodiments that, the one or more electrical connection elements 1014 are arranged inside the window 10122A of the window-form circuit board 1012. Further, each of the one or more electrical connection elements 1014 has one end electrically connected to the non-photosensitive area 101112 of the photosensitive element 1011 and another end electrically connected to the corresponding surface of the circuit board within the window bottom 10124A of the window 10122A of the window-form circuit board 1012. The technical difficulty of this alterative mode is higher than the above implementations because it has to deploy electrical connection for the one or more electrical connection elements 1014 on the window bottom 10124A of the window 10122A of the circuit board main body 10121, that is to electrically connect the electrical connection elements with the photosensitive element 1011 within such relatively smaller space.

In comparison with the above first preferred embodiment in view of the manufacturing art, it is more difficult to make the recess form window 10122A in the second embodiment than making the through hole form window 10122. Higher manufacturing precision is required to form such recess window 10122A on such thinner circuit board. In addition, it is even more difficult to provide electrical circuit on such recess form window 10122A with thinner thickness. Therefore, one would prefer to embody the through hole form window 10122 and electrically connect the one or more electrical connection elements 1014 with circuit board outside the through hole form window 10122 for more adjustable space for the photosensitive element 1011 and preforming better heat dissipation.

Figure 12:
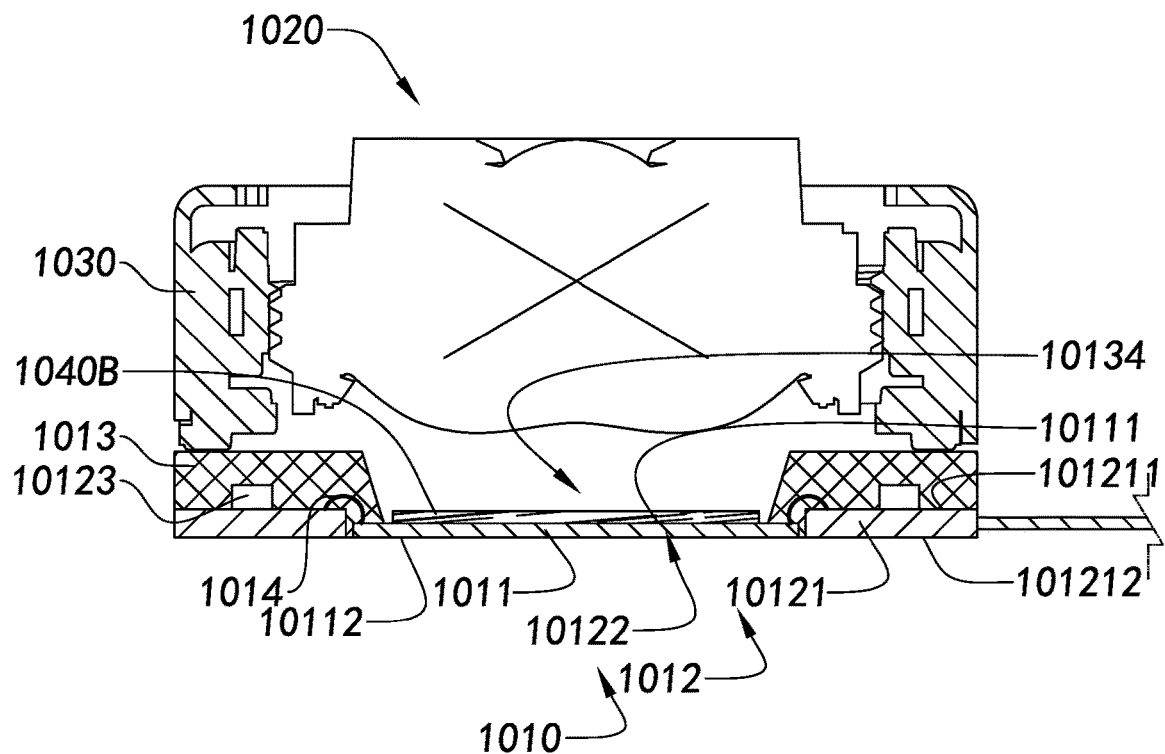
FIG. 12 is a sectional perspective view of a camera module according to a third preferred embodiment of the present invention.
Figure 13:
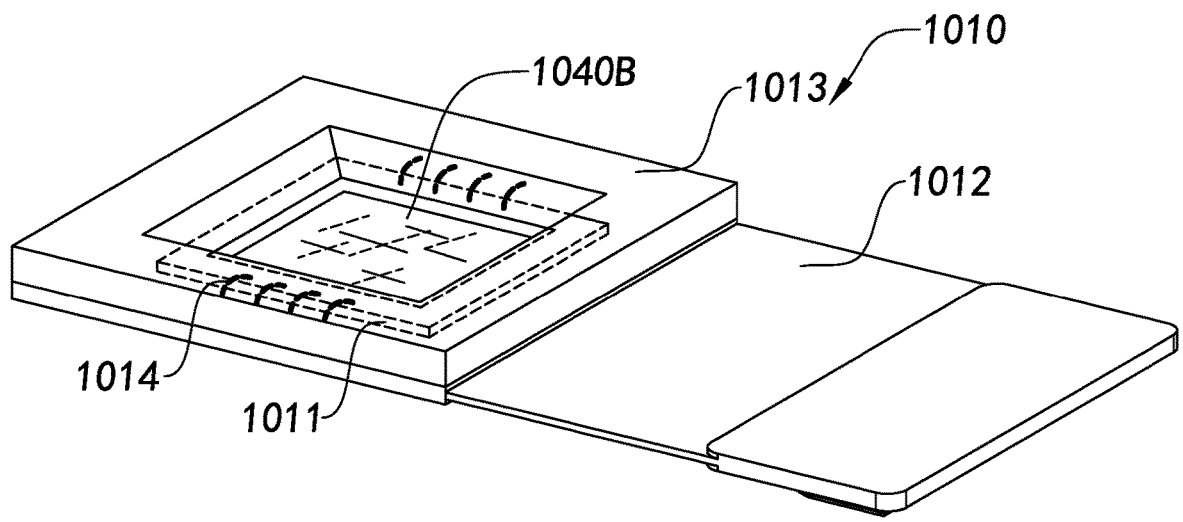
FIG. 13 is a perspective view of a photosensitive component of the camera module according to the above third preferred embodiment of the present invention.

Referring to FIGS. 12-13, a camera module according to a third preferred embodiment of the present invention is illustrated, which is different from the above preferred embodiments that, the photosensitive component 1010 further comprises an optical filter 1040B which is arranged on the photosensitive element 1011. In other words, the optical filter 1040B cover and shade the photosensitive element 1011 to reduce the pollution to the photosensitive element 1011 and the damage to the photosensitive element 1011 by the mould.

In this implementation, the upper surface of the packaging body 1013 can be a flat and smooth surface rather than a stepped or rugged surface adapted for mounting the optical filter 1040B. The actuator 1030 or the lens 1020 is installed on the packaging body 1013.

For example, the optical filter 1040B can be adhered on the photosensitive element 1011. According to other implementations, the optical filter 1040B may also be attached on the photosensitive element 1011. Therefore, those skilled in the art should understand that a specific connection mode between the optical filter 1040B and the photosensitive element 1011 shall not limit the present invention.

In this implementation, the optical filter 1040B is arranged on the photosensitive element 1011. Accordingly, it does not have to mount the optical filter 1040B on the packaging body 1013. By doing so, the distance between the optical filter 1040B and the photosensitive element 1011 is decreased, such that the back focal length of the camera module is reduced, which therefore allows the overall height of the camera module to be further reduced.

In the manufacturing process of the photosensitive component 1010, the optical filter 1040B can be attached on the photosensitive element 1011 before integrally encapsulating the photosensitive element 1011, wherein the window-form circuit board 1012 is used to cover and shade the photosensitive element 1011, especially the photosensitive area 101111 of the photosensitive element 1011, by the filter 1040B. Therefore, during the integral encapsulation process, the photosensitive element 1011 is shaded and protected by the optical filter 1040B from being polluted by the packaging material of the packaging body 1013, so as to enhance the image quality of the camera module. Certainly, in other embodiments of the present invention, the optical filter 1040B can be deployed after the packaging body 1013 is formed to reduce the back focal length of the camera module. Person skilled in the art should understand that the order of mounting and deploying of the optical filter 1040B shall not limit the scope of the present invention.

Figure 14:
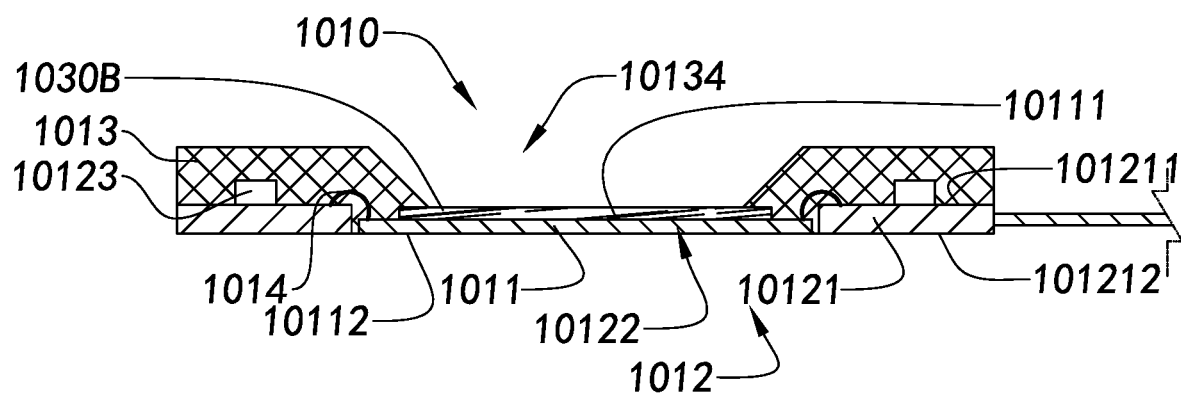
FIG. 14 illustrates an alternative mode of the photosensitive component of the camera module according to the above third preferred embodiment of the present invention.

Referring to FIG. 14, an alternative mode of the photosensitive component 1010 of the camera module according to the above third preferred embodiment of the present invention is illustrated, which is different from the above preferred embodiments that, in this implementation, the photosensitive element 1011 further comprises an optical filter 1040B which is attached on the photosensitive element 1011, wherein the outer edge of the optical filter 1040B is integrally encapsulated by the packaging body 1013. In other words, the photosensitive element 1011, the window-form circuit board 1012 and the optical filter 1040B are integrally encapsulated by the packaging body 1013 so as to affix the optical filter 1040B in position. When producing this type of photosensitive component 1010, before the packaging body 1013 being formed, the optical filter 1040B is overlapped on the photosensitive element 1011 through adhesive bonding or integral encapsulation to affix the filter 1040B in position.

Figure 15:
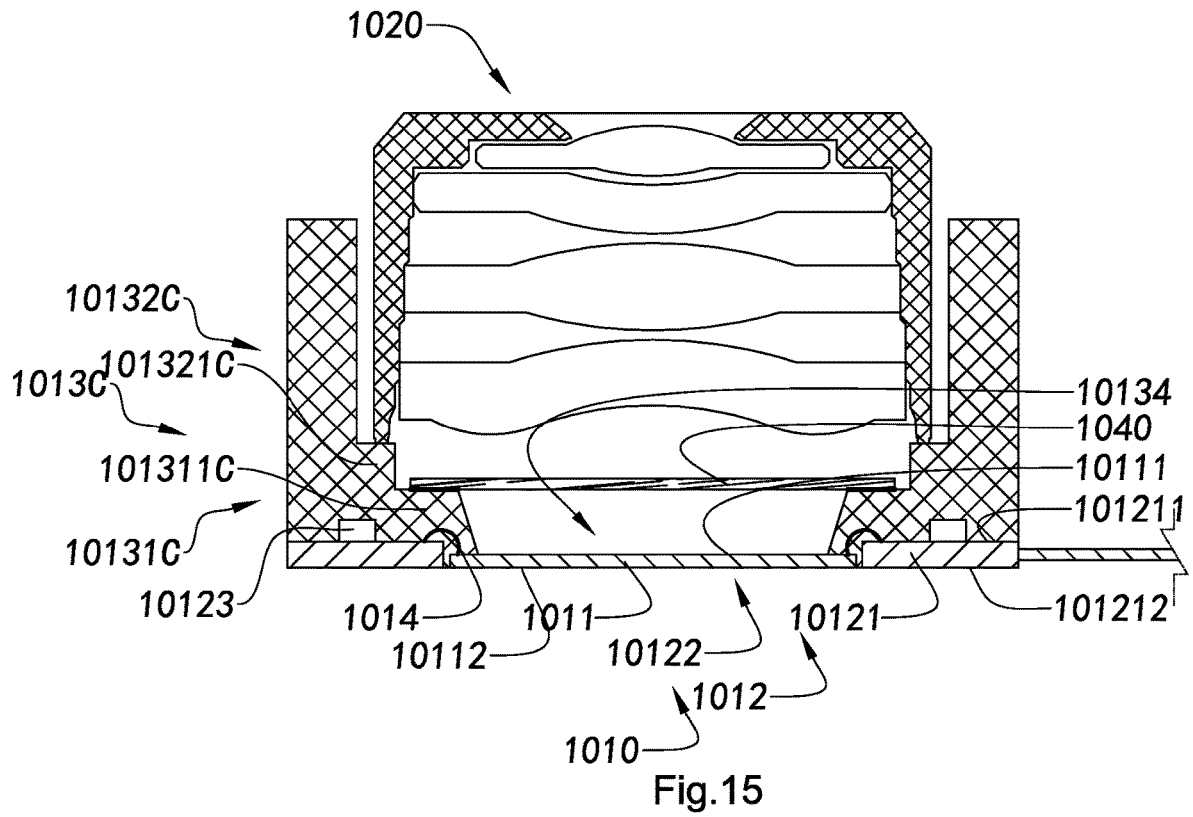
FIG. 15 is a sectional perspective view of a camera module according to the above fourth preferred embodiment of the present invention.

Referring to FIG. 15, the camera module according to a fourth preferred embodiment of the present invention is illustrated, which is different from the above preferred embodiments that, the photosensitive component 1010 further comprises a packaging body 1013C, which comprises a support portion 10131C and a lens portion 10132C. The support portion 10131C is configured for installing the optical filter 1040 and the lens portion 10132C is configured for installing the lens 1020.

Further, the exterior of the lens portion 10132C is integrally and upwardly extended along the support portion 10131C and the interior of the lens portion 10132C forms a step-shaped configuration. The support portion 10131C comprises a first supporting platform 101311C and the optical filter 1040 is mounted on the first supporting platform 101311C. The lens portion 10132C comprises a second supporting platform 101321C and the lens 1020 is installed on the second supporting platform 101321C. In other words, the first supporting platform 101311C and the second supporting platform 101321C form a two-step configuration.

The lens portion 10132C is integrally extended to provide a stable installation surrounding for the lens 1020. According to the present embodiment of the present invention, the depth of the lens portion 10132C can be determined according to the height of the lens 1020, so as for stably mounting the lens 1020 and enhancing the precision of the camera module.

In this manner, an installation surrounding is provided for the lens 1020 to make a prime lens camera module, wherein by means of integral encapsulation of molding, a flat, smooth and stable installation surrounding for the lens 1020 is provided.

Further, in this implementation, the inner surrounding wall of the lens portion 10132C is flat and smooth, which is adapted for mounting a threadless lens.

Figure 16:
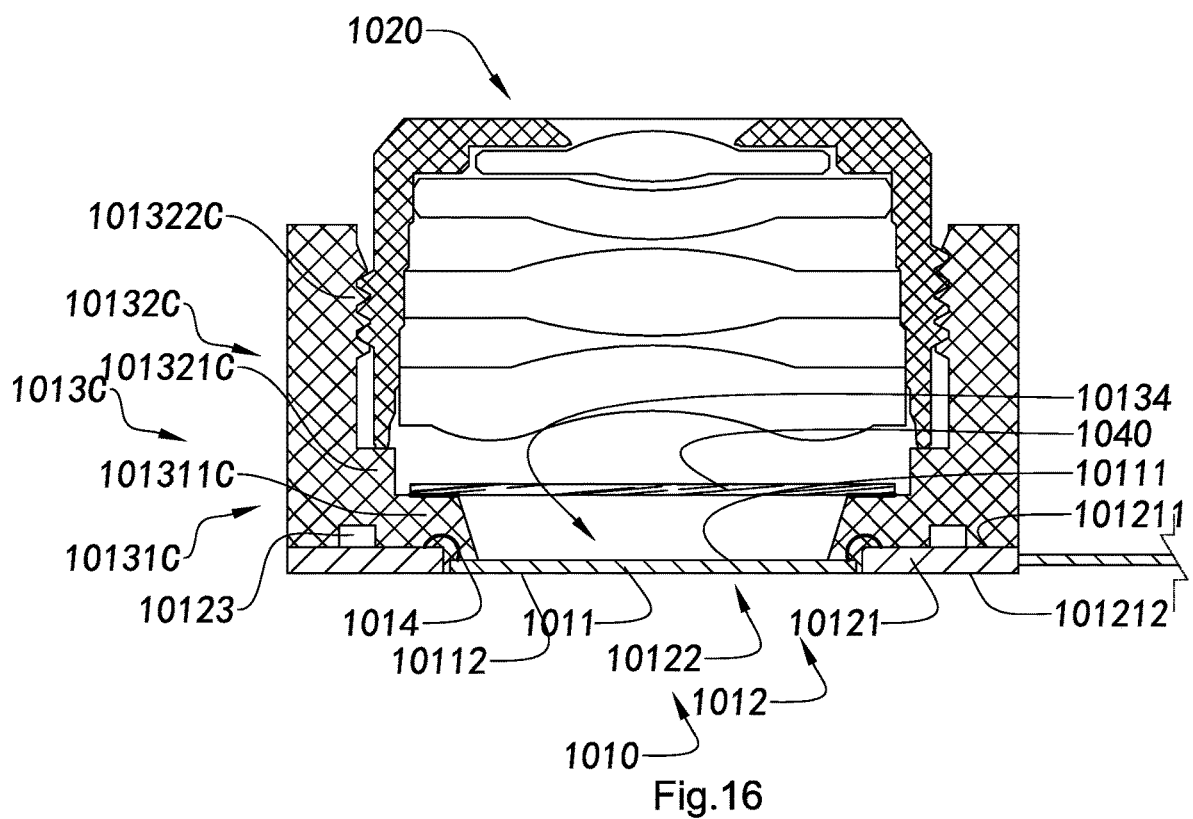
FIG. 16 illustrates an alternative mode of the camera module according to the above fourth preferred embodiment of the present invention.

Referring to FIG. 16, an alternative mode of the camera module according to the above fourth preferred embodiment of the present invention is illustrated, which is different from the above preferred embodiments that, according to the present implementation, the lens portion 10132C has a threaded configuration 101322C arranged on its inner surrounding side, which is adapted for mounting a lens with threads. Certainly, according to other embodiments, the lens portion 10132C may also have other different configurations arranged on its inner side for mounting various types of lens.

Figure 17:
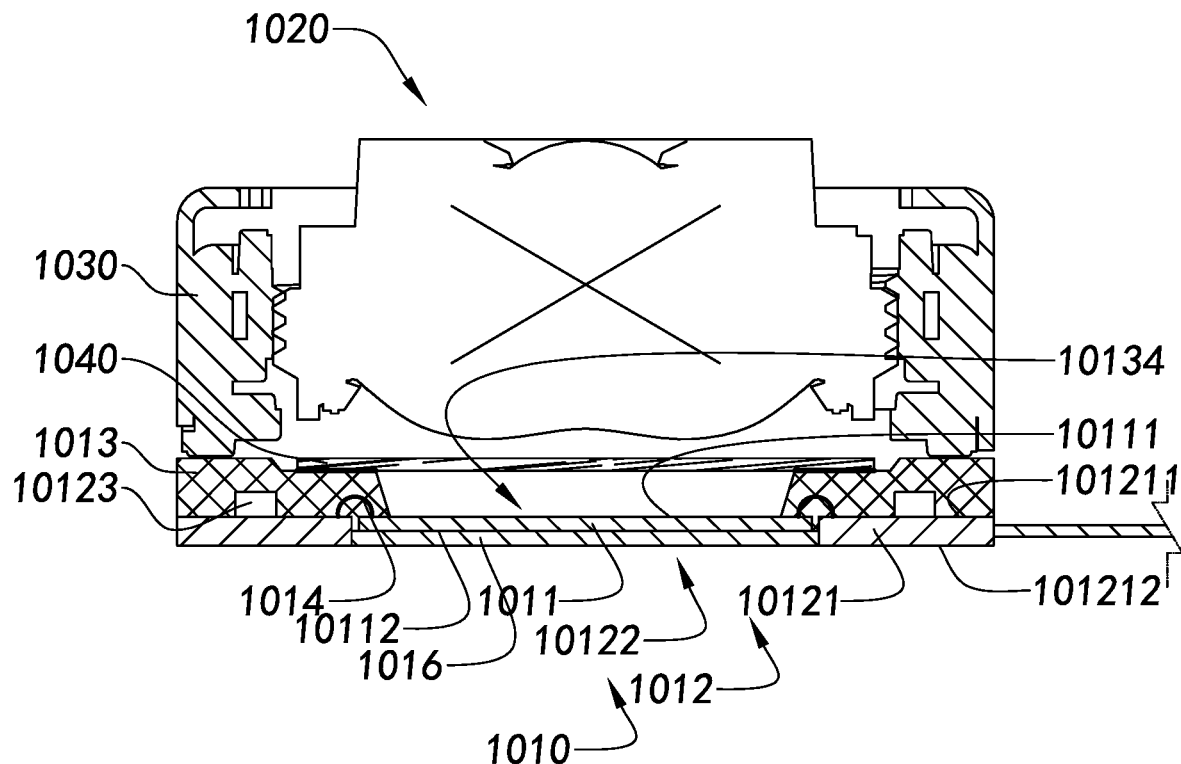
FIG. 17 is a sectional perspective view of a camera module according to a fifth preferred embodiment of the present invention.

FIG. 17 illustrates a sectional perspective view of a camera module according to a fifth preferred embodiment of the present invention. It is different from the above preferred embodiments that the photosensitive component 1010 further comprises a substrate 1016 attached below the photosensitive element 1011.

Further, the bottom of the substrate 1016 and the bottom side 101212 of the circuit board main body 10121 are on the same plane so as to ensure the photosensitive component 1010 having flat and even bottom. In other words, the substrate 1016 fills up the remainder space of the window 10122 below the photosensitive element 1011, such that as the thickness of the photosensitive element 1011 is smaller than the thickness of the circuit board main body 10121 and the photosensitive element 1011 is arranged closely to the position of the top side 101211 of the circuit board main body 10121, the bottom of the photosensitive component 1010 can still be remained flat, level, and smooth without presenting a significant stepped or rugged structure.

The substrate 1016 can reinforce the structural strength and heat dissipation of the photosensitive component 1010. In one embodiment, the substrate 1016 can be metal plate or plastic plate. Nevertheless, in another embodiment, the substrate 1016 can be a film layer attached on the lower surface 10112 of the photosensitive element 1011, so as to protect the photosensitive element 1011 and to enhance the heat dissipation and structural strength of the photosensitive element 1011. For example, but not limited to, the film layer is a metallic coated layer.

The substrate 1016 can be attached on the circuit board main body 10121 or the photosensitive element 1011 by adhering.

Certainly, according to other embodiments, the substrate 1016 may also be arranged underneath the circuit board main body 10121. For instance, when the thickness of the photosensitive element 1011 is thicker than the thickness of the circuit board main body 10121, the substrate 1016 can be used to compensate the height difference between the photosensitive element 1011 and the circuit board main body 10121, so as to keep the bottom of the photosensitive component 1010 flat, level, and smooth.

Figure 18:
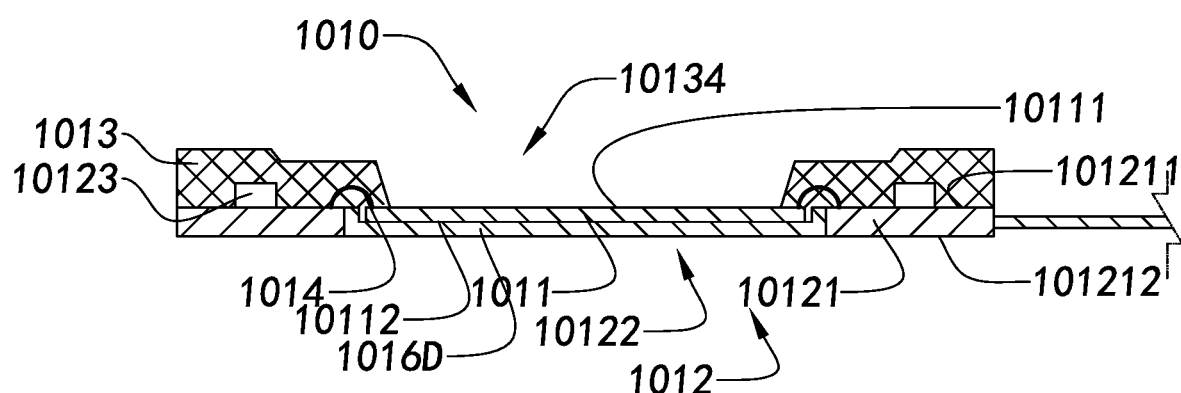
FIG. 18 illustrates an alternative mode of the photosensitive component of the camera module according to the above fifth preferred embodiment of the present invention.

Referring to FIG. 18, an alternative mode of the photosensitive component of the camera module according to the above fifth preferred embodiment of the present invention is illustrated, which is different from the above preferred embodiments that, the window-form circuit board 1012 further comprises a substrate 1016D arranged to be accommodated and received in the window 10122 of the window-form circuit board 1012. The substrate 1016D has a groove shaped configuration, wherein the photosensitive element 1011 is accommodated and received in the substrate 1016D. In other words, the substrate 1016D provides an installation site for the photosensitive element 1011 so as to ensure the photosensitive element 1011 and the top side 101211 of the circuit board main body 10121 remaining flat and even. Besides, the lower surface of the substrate 1016D and the bottom side 101212 of the circuit board main body 10121 are generally on the same plane to keep the bottom of the photosensitive component 1010 flat and smooth.

Figure 19:
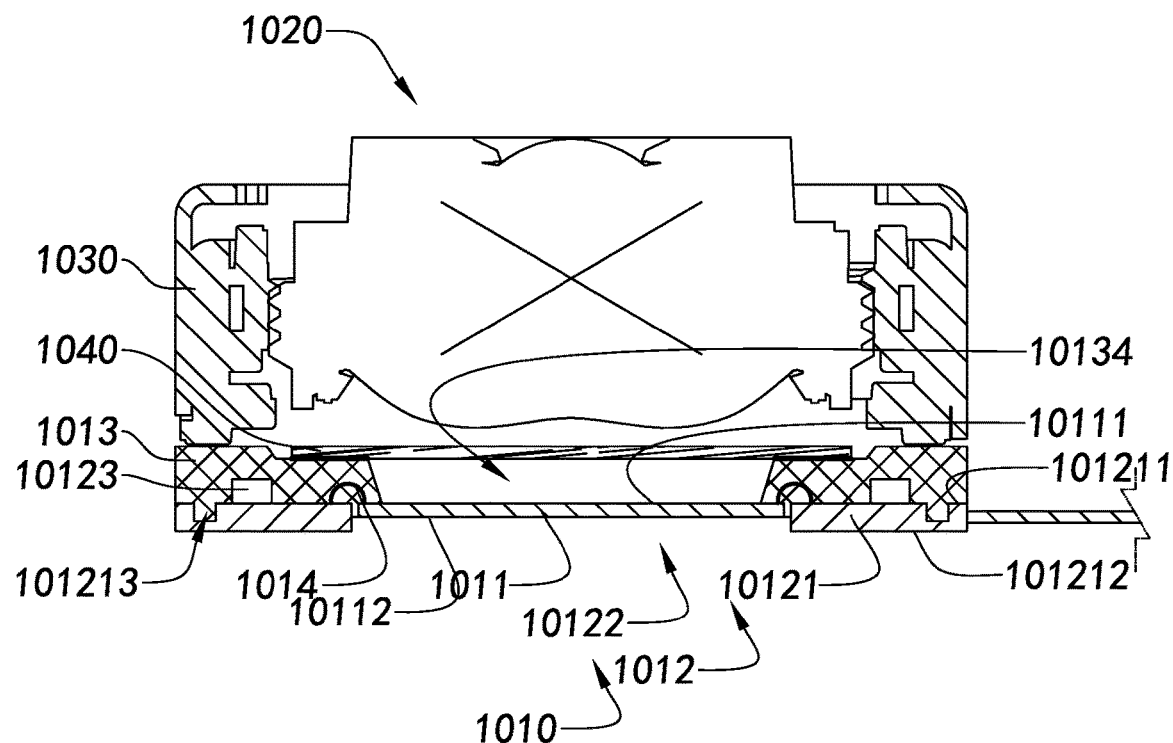
FIG. 19 is a sectional perspective view of a camera module according to a sixth preferred embodiment of the present invention.

Referring to FIG. 19, the camera module according to a sixth preferred embodiment of the present invention is illustrated, which is different from the above embodiments that, the circuit board main body 10121 of the window-form circuit board 1012 has one or more reinforced holes 101213 formed therein, wherein the packaging body 1013 extends into the reinforced holes 101213, so as to enhance the structural strength of the circuit board main body 10121. The quantity and depth of each of the reinforced holes 101213 can be determined according to the needs. The one or more reinforced holes 101213 are formed in the window-form circuit board 1012 at the positions without electric circuit.

In this implementation, the one or more reinforced holes 101213 are indented holes, wherein the top and bottom sides of the circuit board main body 10121 are not communicating through the reinforced hole 101213.

Figure 20:
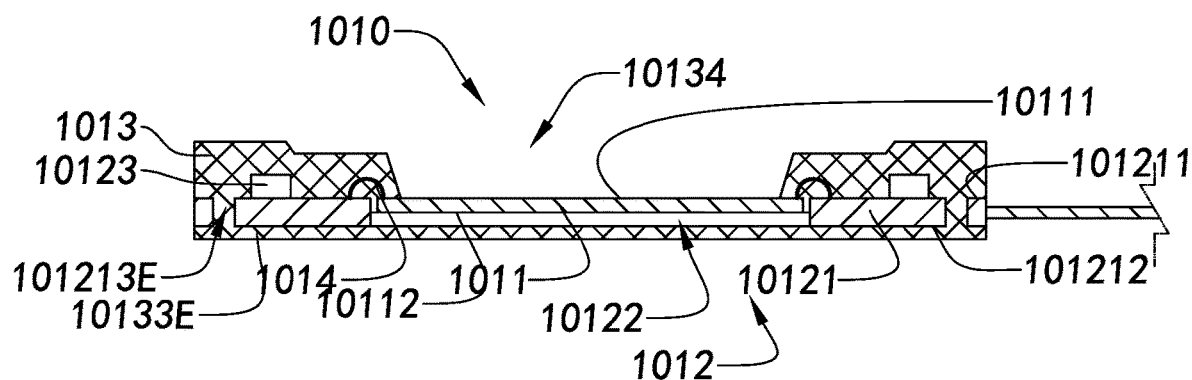
FIG. 20 illustrates an alternative mode of the photosensitive component of the camera module according to the above sixth preferred embodiment of the present invention.

Referring to FIG. 20, an alternative mode of the photosensitive component 1010 of the camera module according to the above sixth preferred embodiment of the present invention is illustrated, which is different from the above embodiments that, the circuit board main body 10121 of the window-form circuit board 1012 comprises at least one reinforced hole 101213E formed therein, wherein the packaging body 1013 extends into the reinforced hole 101213E while it is embodied as through hole that communicating the top side with the bottom side of the circuit board main body 10121.

In addition, the packaging body 1013 extends to pass through the reinforced hole 101213E and extends to cover the bottom of the photosensitive element 1011 and the circuit board main body 10121, so that a packaging layer 10133E is formed on the bottom of the photosensitive component 1010 to reinforce the structural strength of the photosensitive component 1010.

In other words, in this implementation, the packaging body 1013 is not only deployed on the upper portion of the circuit board main body 10121 and the photosensitive element 1011, but also integrally deployed on the lower portion of the photosensitive element 1011. Certainly, in embodiments, the packaging layer 10133E may also be arranged underneath the circuit board main body 10121 only but not extended underneath of the photosensitive element 1011.

Figure 21:
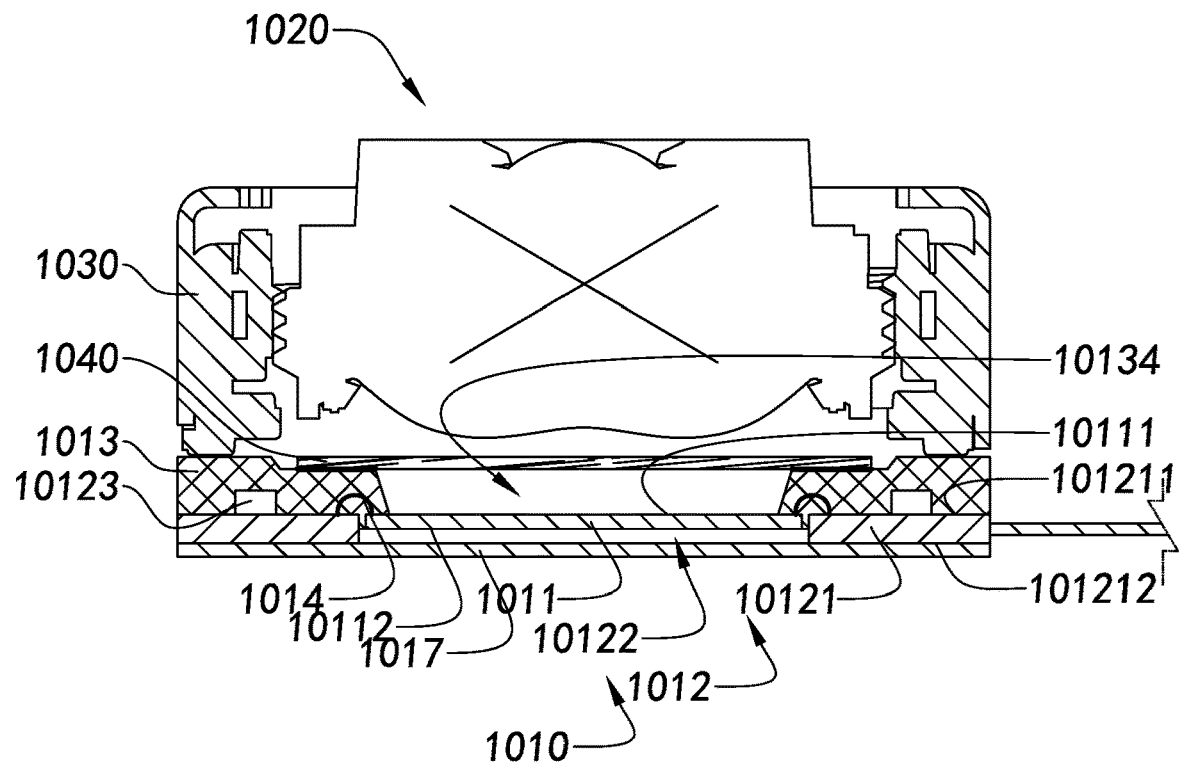
FIG. 21 is a sectional perspective view of a camera module according to the above seventh preferred embodiment of the present invention.

Referring to FIG. 21, the camera module according to a seventh preferred embodiment of the present invention is illustrated, which is different from the above preferred embodiments that, the photosensitive component 1010 includes a back board 1017 arranged on the bottom of the circuit board main body 10121, so as to not only reinforce the structural strength of the circuit board main body 10121, but also ensure the flatness and smoothness of the bottom of the photosensitive component 1010. In one embodiment, the back board 1017 can be a metal plate, so as to not only reinforce the structural strength of the photosensitive component 1010, but also enhance the heat dissipation of the photosensitive component 1010. Nevertheless, in another embodiment, the back board 1017 can be a film layer attached on the bottom surface 10112 of the photosensitive element 1011 and the bottom side 101212 of the circuit board 10121, so as to protect the photosensitive element 1011 and the circuit board main body 10121 and to enhance the heat dissipation and structural strength of the photosensitive element 1011. For example, but not limited to, the film layer is a coated layer containing metallic material.

Figure 22:
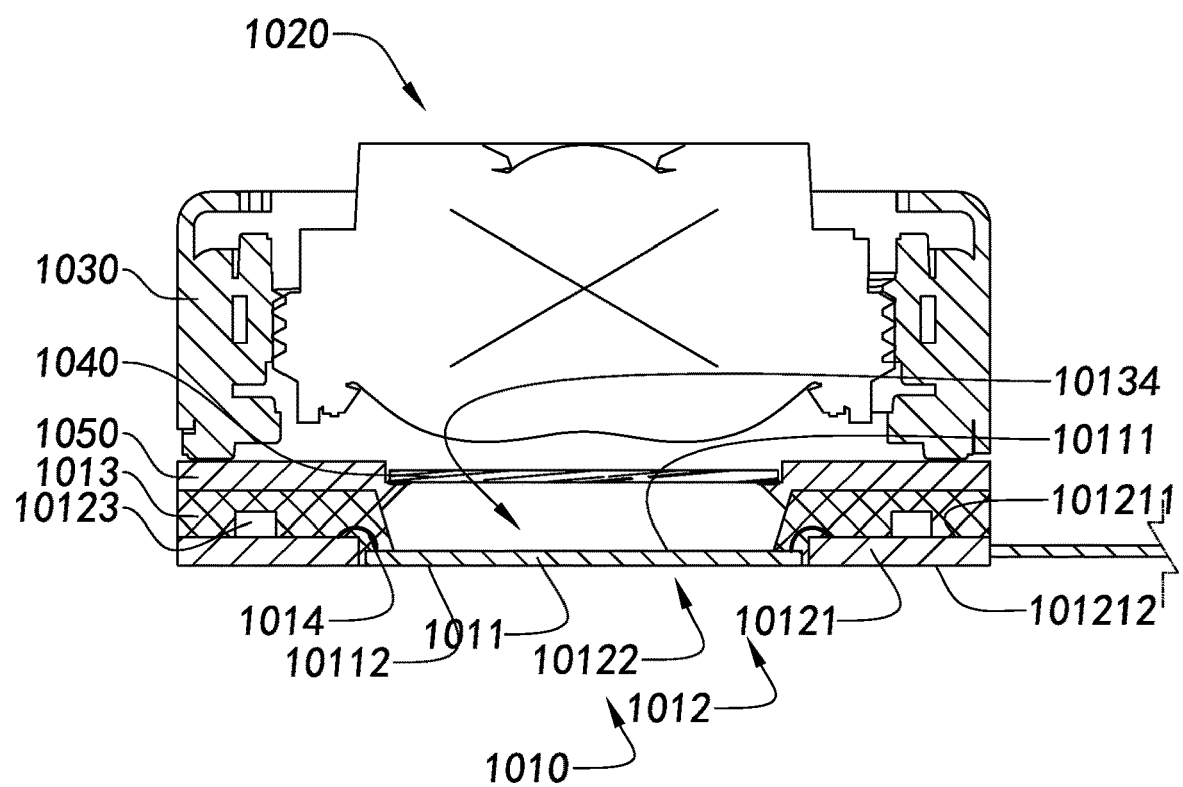
FIG. 22 is a sectional perspective view of a camera module according to the above eighth preferred embodiment of the present invention.

Referring to FIG. 22, the camera module according to an eighth preferred embodiment of the present invention is illustrated, which is different from the above embodiment that, the camera module further comprises a ring-shaped support frame 1050 mounted on the packaging body 1013, wherein the optical filter 1040 is mounted on the support frame 1050.

Further, the support frame 1050 may have an outer edge for mounting on the packaging body and an inner stepped edge for supporting the optical filter 1040.

The support frame 1050 can extend inwardly and downwardly so as to minimize the distance between the optical filter 1040 and the photosensitive element 1011 and decrease the back focal length of the camera module.

According to this implementation, the support frame 1050 provides an installation site for the optical filter 1040 rather than directly mounting the optical filter 1040 on the packaging body 1013. It is worth mentioning that the structure of the support frame 1050, as illustrated in FIG. 22 of the drawings, is just an example, which should not be considered as limitation to the scope of the present invention. Since the structural strength of the optical filter 1040 is weaker, it requires a larger installation site and space for its installation. Nevertheless, it can reduce the required width of the installation site of the integral encapsulation portion and cushion the stress to the optical filter 1040 generated when the module receives external impact by means of the support frame 1050 having stronger structural strength.

The support frame 1050 can be a close-ring shaped or frame shaped structure, viewed at top, which can be selectivity arranged on one side or multiple sides of the packaging body 1013 or the optical filter 1040.

Figure 23:
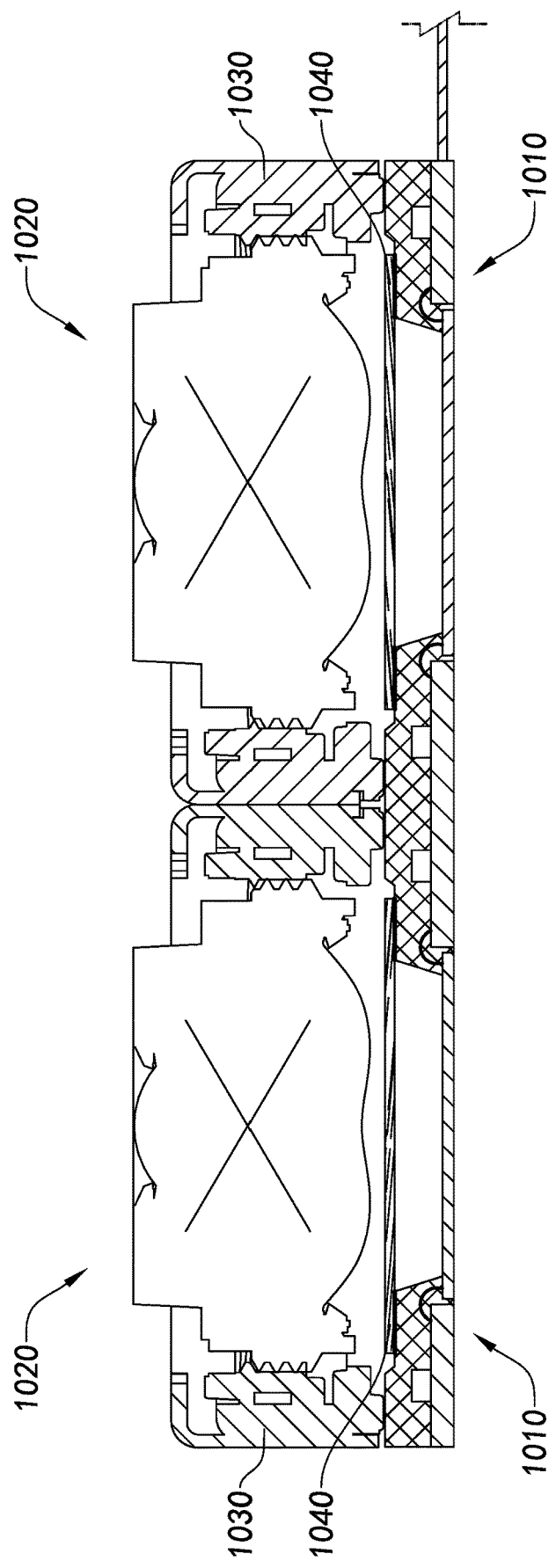
FIG. 23 is a sectional perspective view of a camera module according to the above ninth preferred embodiment of the present invention.

Referring to FIG. 23, the camera module according to a ninth preferred embodiment of the present invention is illustrated, which is different from the above embodiment that, the camera module is an array camera module, which comprises two photosensitive components 1010, two lenses 1020, two actuators 1030, and two optical filters 1040.

It is worth mentioning that, a dual camera module composed of two lenses 1020 is an example for ease of illustration of the present embodiment according to the present invention. Nevertheless, in other embodiments of the present invention, the quantity of the lenses 1020 can be more, such as three or more. Person skilled in the art should understand that the quantity of lens and the quantity of the corresponding components, such as the actuator 1030, the support frame 1050, the optical filter 1040, and etc. shall not be limitation of the present invention.

More specifically, in the present embodiment of the present invention, the window-form circuit boards 1012 of the two photosensitive components 1010 are integrally connected with each other, so as to form an array configuration. Two packaging bodies 1013 can be an integral structure. That is two square shaped window-form structures is provided integrally to provide two light paths for the two lenses 1020 respectively.

Preferred embodiments and different modifications are disclosed in the invention. In the description, for clear and concise purposes, the general principles with subject matters are illustrated in the embodiments and modifications. However, for actual implements, subject matters in different embodiments and modifications may also be combined to form the camera module or photosensitive component. One skilled in the art will understand that the camera module and the photosensitive component 1010 shall not be limited to the disclosure of any particular embodiment or modification.

Figure 24:
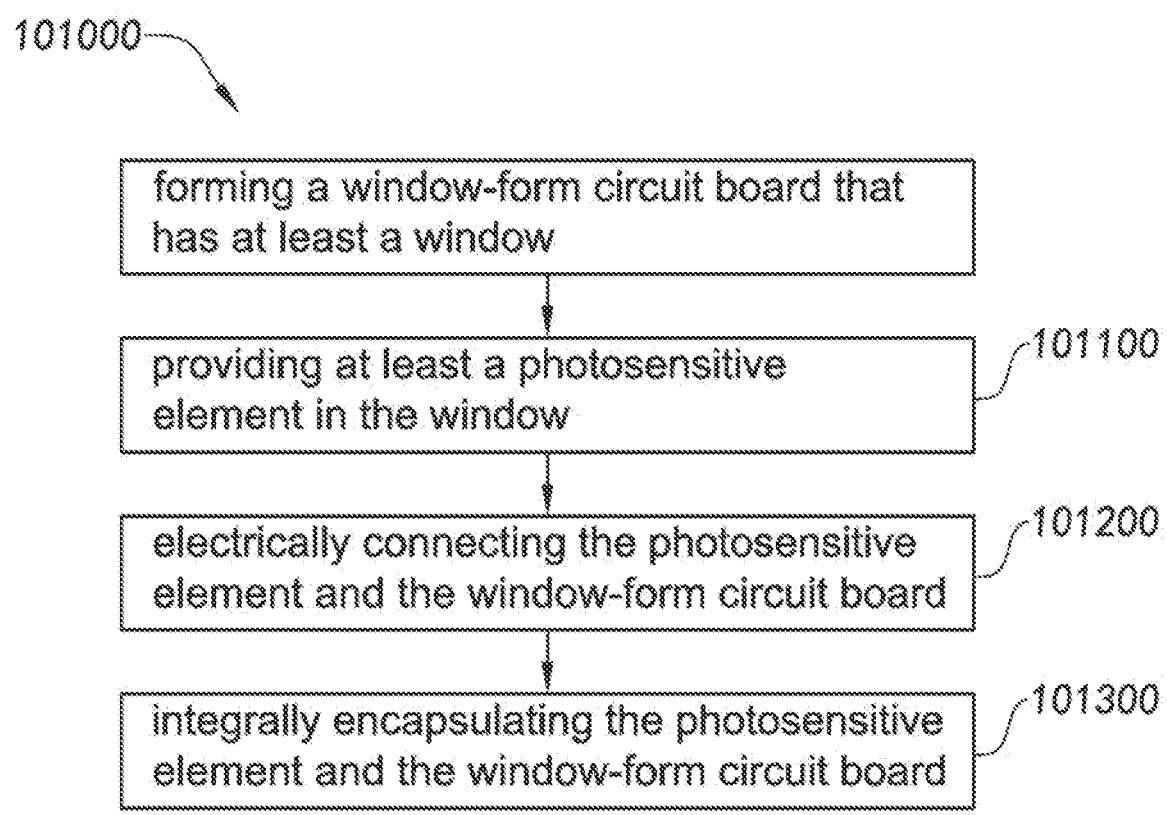
FIG. 24 is a block diagram of a manufacturing method of the photosensitive component according to the above preferred embodiment of the present invention.
Figure 25A:
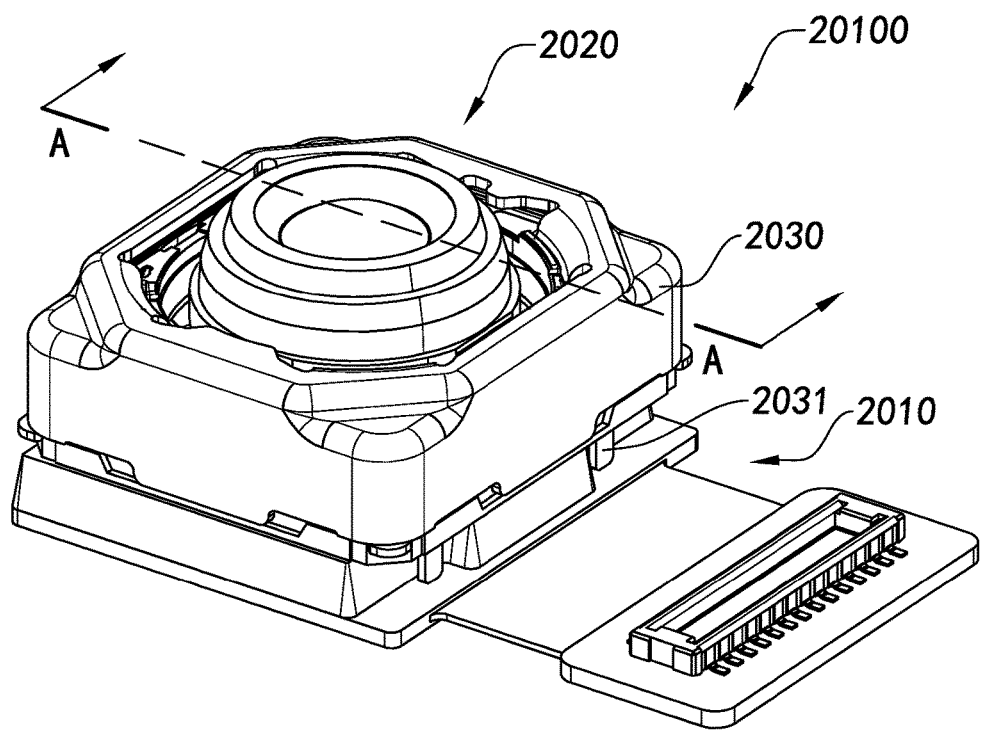
FIG. 25A is a perspective view of a camera module according to a tenth preferred embodiment of the present invention.
Figure 25B:
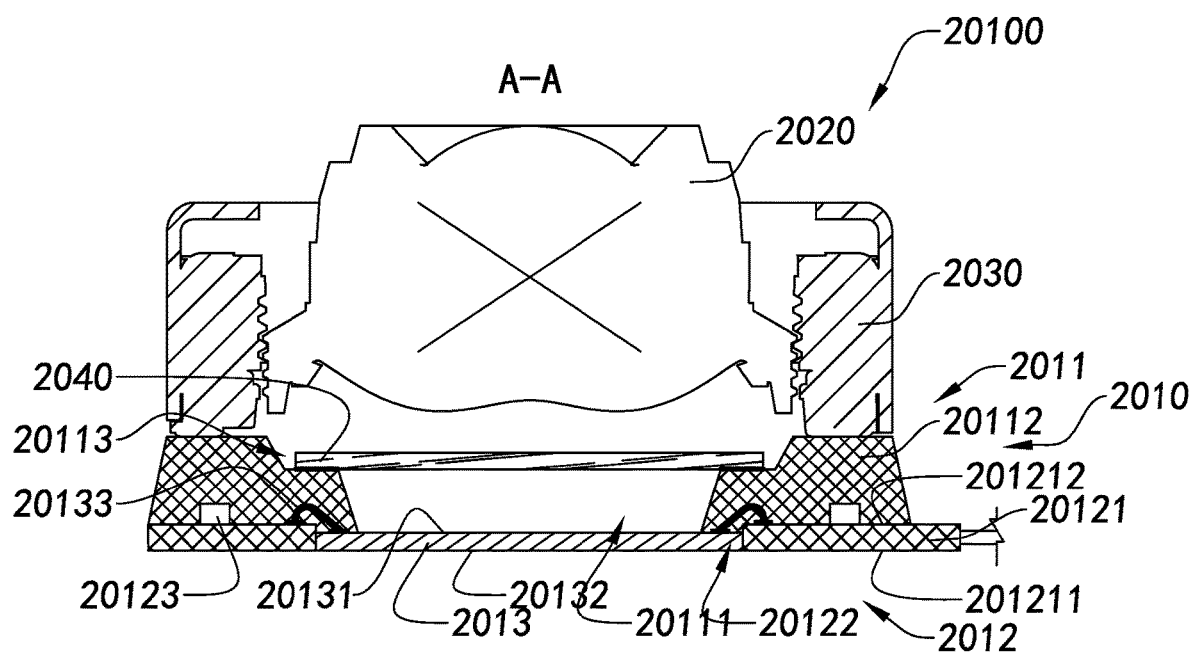
FIG. 25B is a sectional view of FIG. 25A along the A-A line.

Referring to FIG. 24, according to the above preferred embodiments of the present invention, the present invention provides a manufacturing method 101000 of a photosensitive component 1010. The manufacturing method 101000 of the photosensitive component 1010 comprises the following steps:

101100: providing at least a photosensitive element 1011 in a window 10122 of a window-form circuit board 1012;

101200: electrically connecting the photosensitive element 1011 with the window-form circuit board 1012; and 101300: integrally packaging the photosensitive element and the window-form circuit board 1012 to form a packaging body 1013 having an optical window 10131 defined therein and aligned with the photosensitive element.

In the step 101100, the window 10122 can be a recess or a through hole.

The step 101100 may also comprise a step of: forming a window-form circuit board 1012 which has at least a window 10122.

In the step 101100, the photosensitive element 1011 can be arranged in a side close to a top surface of the window-form circuit board 1012, such that the photosensitive element 1011 and the top surface of the window-form circuit board 1012 are on the same plane to form a flat and even upper surface. The photosensitive element 1011 also can be arranged at a side close to a bottom surface of the window-form circuit board 1012, such that the photosensitive element 1011 and the bottom surface of the window-form circuit board 1012 are on the same plane to form a flat and even bottom surface. It is understandable that the upper surface or the bottom surface is just an exemplar that should not be consider as limitation to the present invention.

In the step 101200, the photosensitive element 1011 and the window-form circuit board 1012 are electrically connected by one or more electrical connection elements 1014. Each of the electrical connection elements 1014 has one end electrically connected to the photosensitive element 1011 and another end electrically connected to the top surface of the window-form circuit board 1012.

The step 101300 comprises a step of integrally encapsulating the photosensitive element 1011, the one or more electrical connection elements 1014, and the electronic components 10123 protruded from the window-form circuit board 1012.

The method 101000 can also comprises a step of:

101400: attaching an optical filter 1040 on the photosensitive element 1011. The step 101400 may be processed before or after the step 101300. The attaching method can be adhesive bonding.

The method 101000 can further comprises a step of:

101500: providing at least a reinforced hole 101213 in the main body of the window-form circuit board 1012.

The method 101000 can also comprises a step of:

101600: attaching a back board 1017 on a bottom of the window-form circuit board 1012.

In one embodiment, in the step 101300, the photosensitive element and the window-form circuit board are contacted with each other, wherein the packaging body integrally connects the photosensitive element 1011 and the window-form circuit board 1012.

In another embodiment, in the step 101300, the photosensitive element 1011 and the window-form circuit board 1012 are spaced with each other, wherein the packaging body 1013 is integrally connected with and filled up between the photosensitive element 1011 and the window-form circuit board 1012, so as to reinforce the photosensitive element 1011 and the window-form circuit board 1012 to be affixed in position.

In other embodiments, in the step 101300, the photosensitive element 1011 and the window-form circuit board 1012 are indirectly contacted with each other through a medium, wherein the packaging body 1013 integrally connects the photosensitive element 1011, the medium, and the window-form circuit board 1012. For instance, adhesive is provided on at least a part of the area around the non-photosensitive area 101112 of the photosensitive element 1011 for solidification, so as to render the photosensitive element 1011 indirectly contacting with the window-form circuit board 1012.

The integral encapsulation method is a molding formation method by means of, for example, insert molding by an injection molding machine, compression molding, transfer molding and the like.

Referring to FIGS. 25A-26B, a camera module according to a tenth preferred embodiment of the present invention is illustrated. The camera module 20100 can also be called sunken camera module, which comprises a photosensitive component 2010 and a lens 2020, wherein the photosensitive component 2010 can also be called sunken photosensitive component.

Further, the photosensitive component 2010 includes an integral encapsulation base 2011, a circuit board 2012, and a photosensitive element 2013. The circuit board 2012 can also be called sunken circuit board. The photosensitive element 2013 is sunken in the circuit board 2012. The integral encapsulation base 2011 integrally encapsulates the circuit board 2012 and the photosensitive element 2013. Such integral encapsulation can be completed through, for example but not limited to, transfer molding.

It is worth to mention that, according to the conventional packaging structure, the lens holder is individually made, such as injection molding. And, after finishing the manufacture independently, to assemble, the lens holder is adhered on the circuit board. So, there are lots of disadvantages in this conventional assembling process. However, according to the present invention, on one hand, the photosensitive element 2013 is sunken in the circuit board 2012 that substantially reduces a height difference between the surface of the photosensitive element 2013 and the surface of the circuit board 2012, so that the lens 2020 can be positioned closer to the circuit board 2012 and thus an overall height of the camera module is reduced. On the other hand, when the photosensitive element 2013 is sunken in the circuit board 2012, the integral encapsulation base 2011 is integrally packaged with the circuit board 2012 and the photosensitive element 2013, so that the photosensitive element has no need to use the circuit board to support the photosensitive element like the conventional COB process that the photosensitive element is adhered on the circuit board. In other words, in the present invention, no matter whether the photosensitive element 2013 is supported by the circuit board 2012 or not, the photosensitive element 2013 and the circuit board 2012 are affixed in position correspondingly by means of the integral encapsulation base 2011, that it is difficult for the conventional COB process to accomplish. Furthermore, the integral encapsulation base 2011 is integrally packaged and formed on the circuit board 2012 to replace the conventional lens holder. The advantages includes that: firstly, the integral encapsulation replaces the conventional adhesive process that does not require to retain the predetermining adjustable space for AA adjustment and reduces the overall height of the camera module; secondly, the integral encapsulation by means of molding can increase the flatness of surfaces to improve the assembling precision of the camera module; thirdly, the integral encapsulation enhances the structural strength of the circuit board 2012, so that as the circuit board 2012 provides recess or through hole for accommodating and receiving the photosensitive element 2013 in a sunken manner while satisfying the required structural strength, wherein the adhering attachment of the lens holder and the circuit board in the conventional manner fails to satisfy these requirements; fourthly, the protruding components on the circuit board 2012 are integrally covered by the integral encapsulation base 2011, such as the electronic components 2012 mentioned in the following description, that fully utilizes the position and space on the circuit board 2012, reduces the size of the camera module 20100 and prevents the photosensitive element 2013 from being polluted by the dirt on the electronic components 2012. According to the present invention, the sunken design of the photosensitive element 2013 and the integral encapsulation in combination significantly reduces the overall size of the camera module 20100.

Referring to FIGS. 25B-26B, the integral encapsulation base 2011 comprises a base main body 20112 and has an optical window 20111. The optical window 20111 is provided in the base main body 20112 for providing a light path for the photosensitive element 2013 correspondingly. In other words, the base main body 20112 forms the optical window 20111 for providing the light path for the photosensitive element 2013. In some embodiments, the base main body 20112 is in a close-ring shape, so as to form the optical window 20111 in an enclosing manner. In other embodiments, the base main body 20112 may have an opening communicating the optical window 20111 with outside. The present invention shall not be limited here. The molding material of the base main body 20112 can be, for example but not limited to, nylon, LCP, PP, resin, and etc. Preferably, the molding material of the base main body 20112 is a thermosetting material.

Further, the circuit board 2012 comprises a circuit board main body 20121 and has a disposing area 20122, wherein the disposing area 20122 is provided on the circuit board main body 20121. The disposing area 20122 can also be called sunken area. The photosensitive element 2013 is arranged on the disposing area 20122, such that the photosensitive element 2013 is in a sunken position lower than the circuit board main body 20121. In some embodiments, the disposing area 20122 is embodied as a recess and the photosensitive element 2013 is accommodated and received in the recess, such that the relative height difference between the photosensitive element 2013 and the circuit board main body 20121 can be lowered. In some embodiments, the disposing area 20122 is embodied as a through hole, communicating to both sides of the circuit board main body 20121. The photosensitive element 2013 is accommodated and received in the through hole, such that the relative height difference between the photosensitive element 2013 and the circuit board main body 20121 can be further reduced. As illustrated in this embodiment and its corresponding drawings, the disposing area 20122 is embodied as the through hole for illustration purposes, nonetheless those skilled in the art should understand that the present invention shall not be limited in such through hole manner. The circuit board main body 20121 can be, for example but not limited to, rigid-flex board, ceramic substrate (without flexible board), or rigid PCB (without flexible board).

The base main body 20112 integrally encapsulates the circuit board main body 20121 and the photosensitive element 2013, so as to hold the positions of the circuit board main body 20121 and the photosensitive element 2013 correspondingly.

The photosensitive element 2013 has a front side 20131 and a back side 20132, wherein the front side 20131 faces the lens 2020 and the back side 20132 faces a direction opposite to the lens 2020. The photosensitive element 2013 has a photosensitive area 201311 and a non-photosensitive area 201312 arranged on the front side 20131 thereof, wherein the photosensitive area 201311 is adapted for conducting photosensitive function and process, while the non-photosensitive area 201312 is positioned around the photosensitive area 201311. The circuit board main body 20121 has a top side 201212 and a bottom side 201211. The top side 201212 faces toward the lens 2020 and the bottom side 201211 faces the direction opposite to the lens 2020.

The base main body 20112 integrally encapsulates at least a part of the top side 201212 of the circuit board main body 20121 and at least a part of the non-photosensitive area 201312 of the photosensitive element 2013, so as to hold the circuit board 2012 and the photosensitive element 2013 in position with each other. In other words, when the photosensitive element 2013 is connected with the circuit board main body 20121 through the base main body 20112 so that the photosensitive element 2013 does not require the circuit board main body 20121 to provide supporting. It is worth mentioning that this sunken and integral encapsulation manner of the present invention is barely possible to be achieved in the conventional COB packaging method because it is difficult for the conventional technology to provide enough structural strength and it is hard to utilize the lens holder to integrally affix the circuit board and the photosensitive element.

Further, according to the present embodiment of the present invention and the appended drawings, the disposing area 20122 is a through hole, so as to provide more adjustment space for the photosensitive element 2013. For example, it helps to make the back side 20132 of the photosensitive element 2013 and the bottom side 201211 of the circuit board main body being levelled on the same plane, so as to provide a flat and even bottom surface of the camera module 20100 for subsequent installation and utilizing. Alternatively, it helps to make the front side 20131 of the photosensitive element 2013 and the top side 201212 of the circuit board main body 20121 being levelled on the same plane, or to make the front side 20131 of the photosensitive element 2013 being slightly lower than the top side 201212 of the circuit board main body 20121. Person skilled in the art should understand that the present invention shall not be limited here.

According to the drawings and the present embodiment of the present invention, the disposing area 20122 is embodied as a through hole for illustration. It is worth mentioning that when the disposing area 20122 is embodied as a through hole, the back side 20132 of the photosensitive element 2013 is able to be directly exposed to the outside environment, so as to enhance the heat dissipation of the photosensitive element 2013. In the conventional COB packaging and encapsulating process, the photosensitive element is usually overlappedly attached on top of the circuit board. Accordingly, heat generated by the photosensitive element has to be dissipated through the circuit board, resulting in relatively poor heat dissipation performance, wherein when the temperature of the photosensitive element is relatively higher, it adversely affects the image quality of the camera module.

Further, the photosensitive element 2013 is electrically connected with the circuit board main body 20121 through one or more electrical connection elements 20133, so as for transmitting electrical signals to the circuit board main body 20121, wherein the one or more electrical connection elements 20133 can be, for example but not limited to, gold wire, silver wire, copper wire, aluminum wire, and etc. The circuit board 2012 comprises one or more electronic components 20123 arranged on the circuit board main body 20121. The one or more electronic components 20123 can be, for example but are not limited to, resistors, capacitors, driving components, and etc. According to the present embodiment of the present invention, the one or more electronic components 20123 are protruded from the circuit board main body 20121, however according to another embodiments of the present invention, the electronic components 20123 may not have electronic components 20123 protruded from the circuit board main body 20121 or the comprised electrical components 20123 are not protruded from the circuit board main body 20121 that, for example, the electrical components 210123 are embedded in the circuit board main body 20121. In one implementation, the electronic components 20123 are arranged and deployed on the circuit board main body 20121 through SMT (Surface Mounting Technology).

Further, the base main body 20112 covers, encloses, encapsulates and/or wraps up the one or more electrical connection elements 20133 and the one or more electronic components 20123, so as to keep the electrical connection elements 20133 and the electronic components 20123 from being directly exposed to outside and avoid dusts remained on the electrical connection elements 20133 and the electronic components 20123 from polluting the photosensitive element 2013. Moreover, since the space around the electrical connection elements 20133 and the electronic components 20123 is filled up by the base main body 20112, such that the size of the camera module 20100 can be reduced.

It is worth mentioning that the quantity and positions of the one or more electrical connection elements 20133 can be determined based on the needs. For example, the one or more electrical connection elements 20133 can be arranged by one, two, three or four sides of the photosensitive element 2013, or arranged at the position(s) coordinately to the electronic components 20123, and etc.

Figure 27:
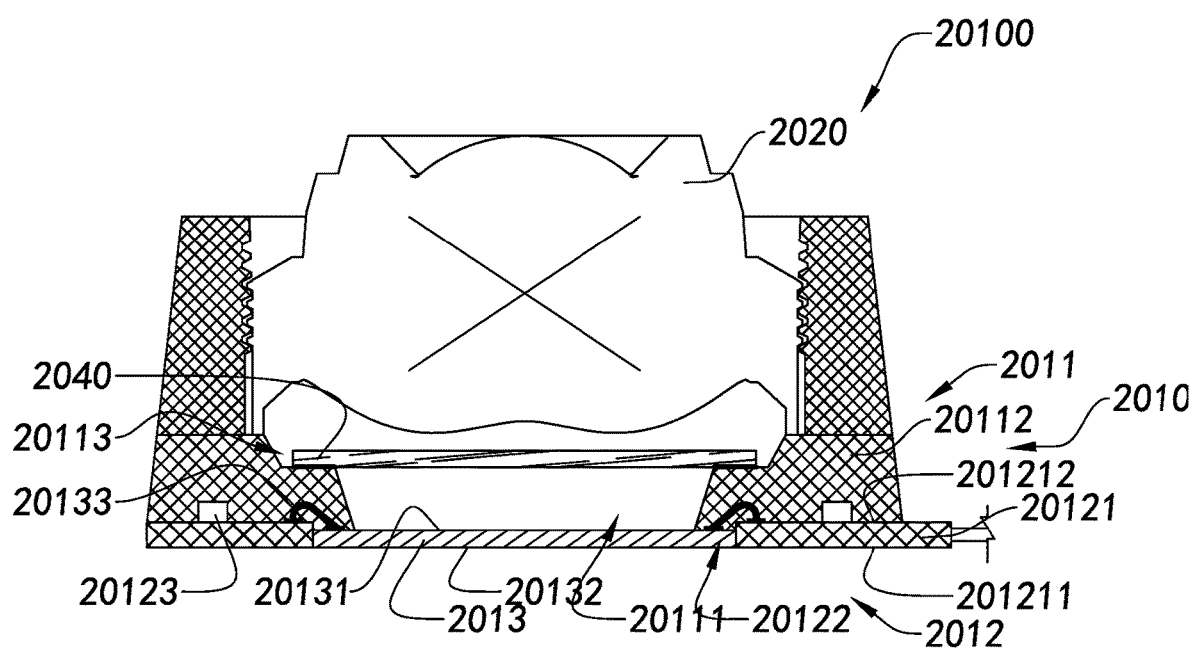
FIG. 27 is another implementation of the camera module according to a tenth preferred embodiment of the present invention.
Figure 28:
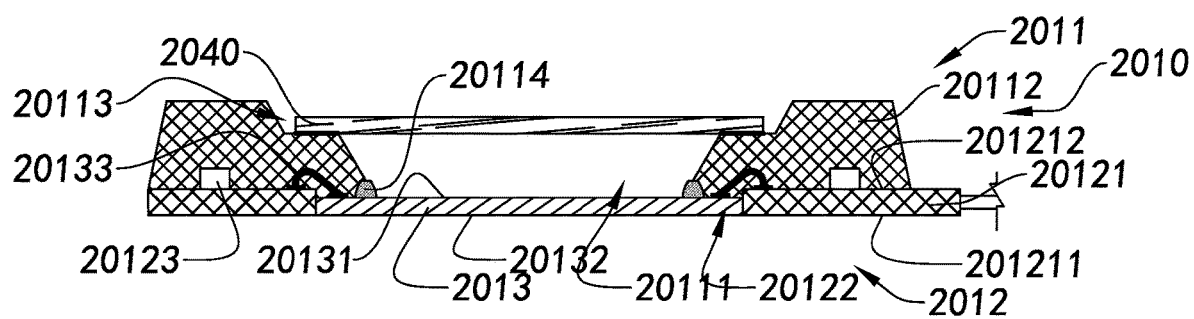
FIG. 28 illustrates a photosensitive component according to an eleventh preferred embodiment of the present invention.

Further, according to the present embodiment of the present invention, the camera module 20100 also comprises an actuator 2030, such as a voice coil motor, a piezoelectricity motor, and etc. The lens 2020 is mounted on the actuator 2030, so as to adjust the lens 2020 through the actuator 2030 forming an automatic focus (AF) camera module. The actuator 2030 can be electrically connected with the circuit board main body 20121 through a terminal 2031. The terminal 2031 can be embodied as single-pin, multi-pin, singlerow pin, multirow pin, and etc. Certainly, according to other implementations of the present invention, as illustrated in FIG. 27, the camera module 20100 may not include the actuator 2030 and that the lens 2020 is directly mounted on the photosensitive component 2010, forming a prime lens camera module or fix focus (FF) camera module. Those skilled in the art should understand that specific type of the camera module 20100 shall not limit the scope the present invention, and the specific type or structure of the actuator 2030 shall not limit the present invention too.

The camera module 20100 may also comprise a filter 2040 for filtering the light passing through the lens 2020. The filter 2040 can be, for example but not limited to, infrared-cut filter, blue glass infrared-cut filter, transparent lens, visible light filter, and etc. According to the present embodiment of the present invention, the filter 2040 is mounted on the integral encapsulation base 2011 of the photosensitive component 2010 and positioned in the light path of the photosensitive element 2013. According to other embodiments of the present invention, the filter 2040 can also be mounted on other element, such as an independent frame, the photosensitive element 2013, and etc., wherein the present invention shall not be limited here.

Further, the base main body 20112 of the integral encapsulation base 2011 has a mounting groove 20113 communicating with the optical window 20111. In the present embodiment of the present invention, the filter 2040 is mounted in the mounting groove 20113. More specifically, the edge of the filter 2040 extends to enter the mounting groove 20113, such that the filter 2040 is supported on the base main body 20112. According to other embodiments of the present invention, a frame is mounted in the mounting groove 20113 and the filter 2040 is mounted in the frame.

Figure 26A:
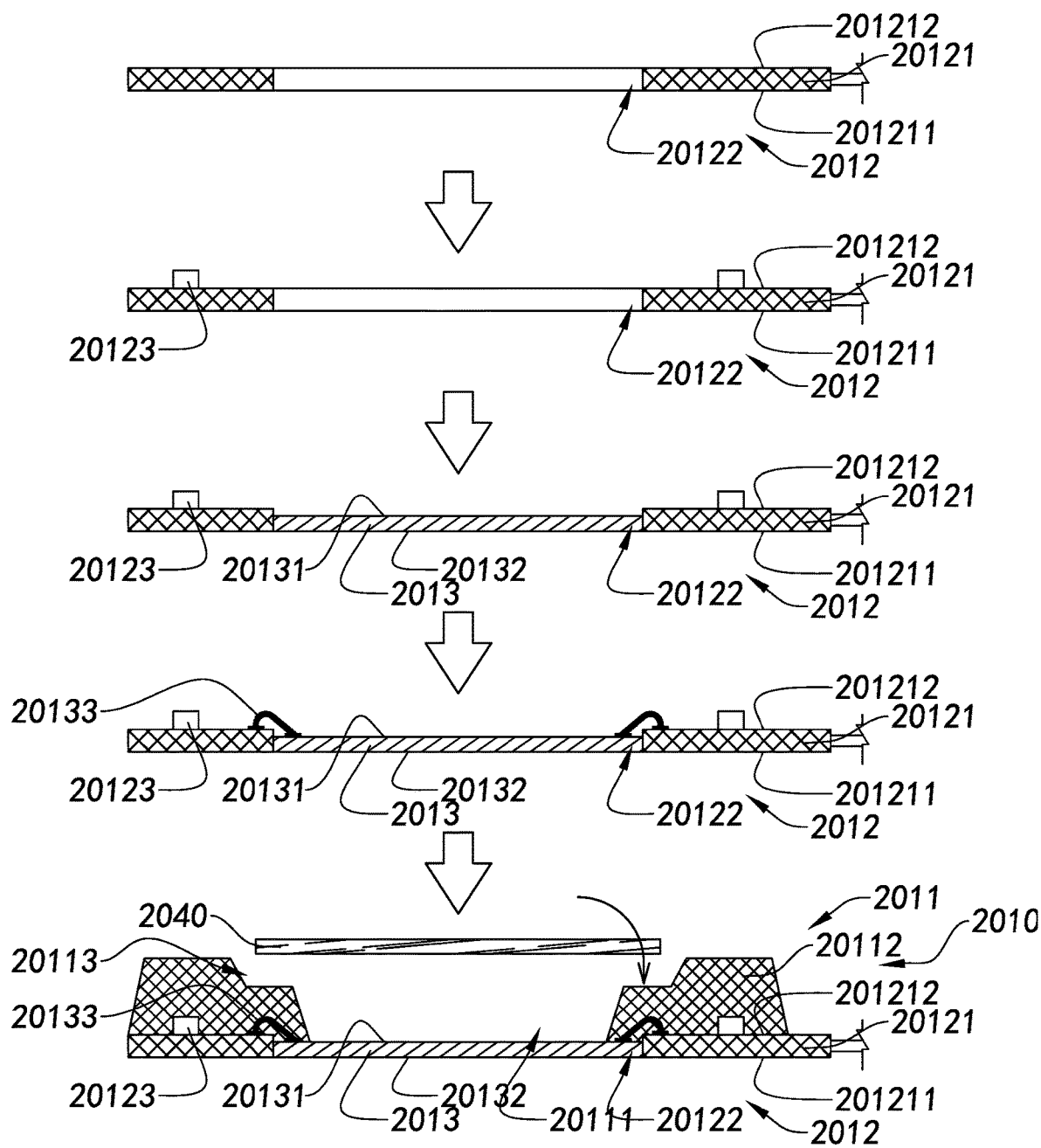
FIG. 26A is a sectional perspective view of a camera module according to a tenth preferred embodiment of the present invention.
Figure 26B:
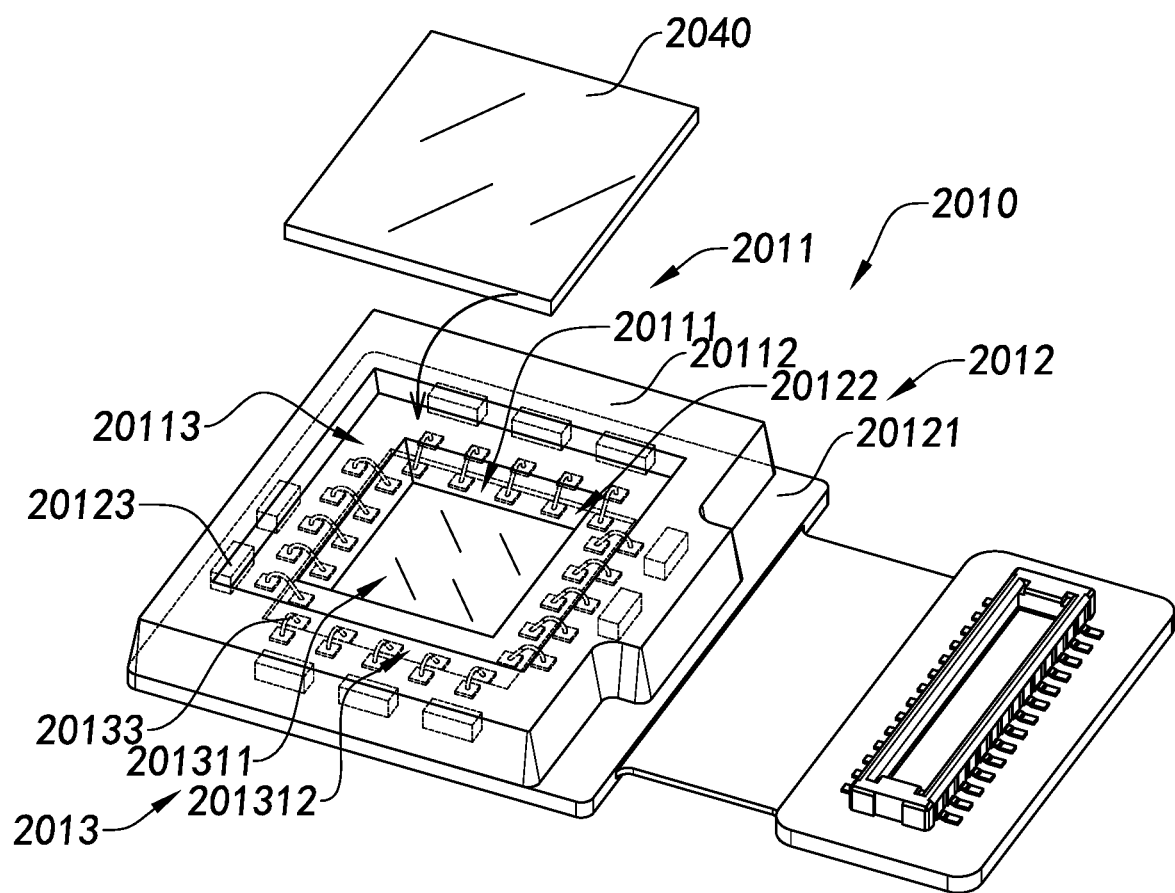
FIG. 26B is a perspective view of a photosensitive component according to an eleventh preferred embodiment of the present invention.

Referring to FIGS. 26A and 26B, the photosensitive component 2010 may be manufactured by the following process. First, surface mount on the circuit board main body 20121, including attaching the electronic components 20123 on the circuit board main body 20121, wherein the mounting positions of the electronic components 20123 can be determined based on the needs, such as on one or more sides and etc. Second, dispose and arrange the photosensitive element 2013 in the disposing area 20122 of the circuit board 2012, wherein the disposing area 20122 can be pre-formed on the circuit board main body 20121, such as opening a hole on a circuit board in order to form the circuit board main body 20121 with the disposing area 20122, providing a circuit board main body 20121 that has the disposing area 20122, and etc. Next, electrically connect the photosensitive element 2013 with the circuit board main body 20121 through the electrical connection elements 20133, so as to achieve the electrical signal transmission of the photosensitive element 2013 and the circuit board main body 20121, which can be implemented through, for example, wire bonding and etc., to electrically connect the photosensitive element 2013 and the circuit board main body 20121. Further, form the base main body 20112 to integrally encapsulate the circuit board main body 20121 and the photosensitive element 2013 and form the optical window 20111 as well as utilizing the base main body 20112 to cover, enclose, encapsulate and/or wrap up the electronic components 20123 and the electrical connection elements 20133, so as to form the photosensitive component 2010 adaptable for mounting the filter.

Further, after the photosensitive component 2010 has assembled and finished, the actuator 2030 is mounted and/or the lens 2020, so as to make a fixed focus camera module 20100 or a zoom lens camera module.

Referring to FIGS. 28-30B, the photosensitive component according to an eleventh preferred embodiment of the present invention is illustrated. The photosensitive component 2010 which is manufactured by a manufacturing device 20200 is different from the above preferred embodiment that, the integral encapsulation base 2011 comprises an interval medium 20114 sandwiched between the base main body 20112 and the photosensitive element 2013, so as to protect the photosensitive element 2013, prevent the manufacturing device 20200 from damaging the photosensitive element 2013, and block the integral encapsulation material from overflowing to the photosensitive area 201311 of the photosensitive element 2013 when the manufacturing device 20200 is utilized to mold the base main body 20112.

Preferably, according to the present embodiment of the present invention, the interval medium 20114 forms a ring-like protruding step, adapted for supporting the manufacturing device 20200 and blocking the integral encapsulation material when forming and producing the base main body 20112 through the manufacturing device 20200. Accordingly, the interval medium 20114 is utilized as a boundary to form the base main body 20112. The implementation of the interval medium 20114 can be, for example but not limited to, formed by applying and coating adhesive on the circuit board main body 20121, or formed through bonding a resilient element and etc., wherein the present invention shall not be limited here.

Figure 29A:
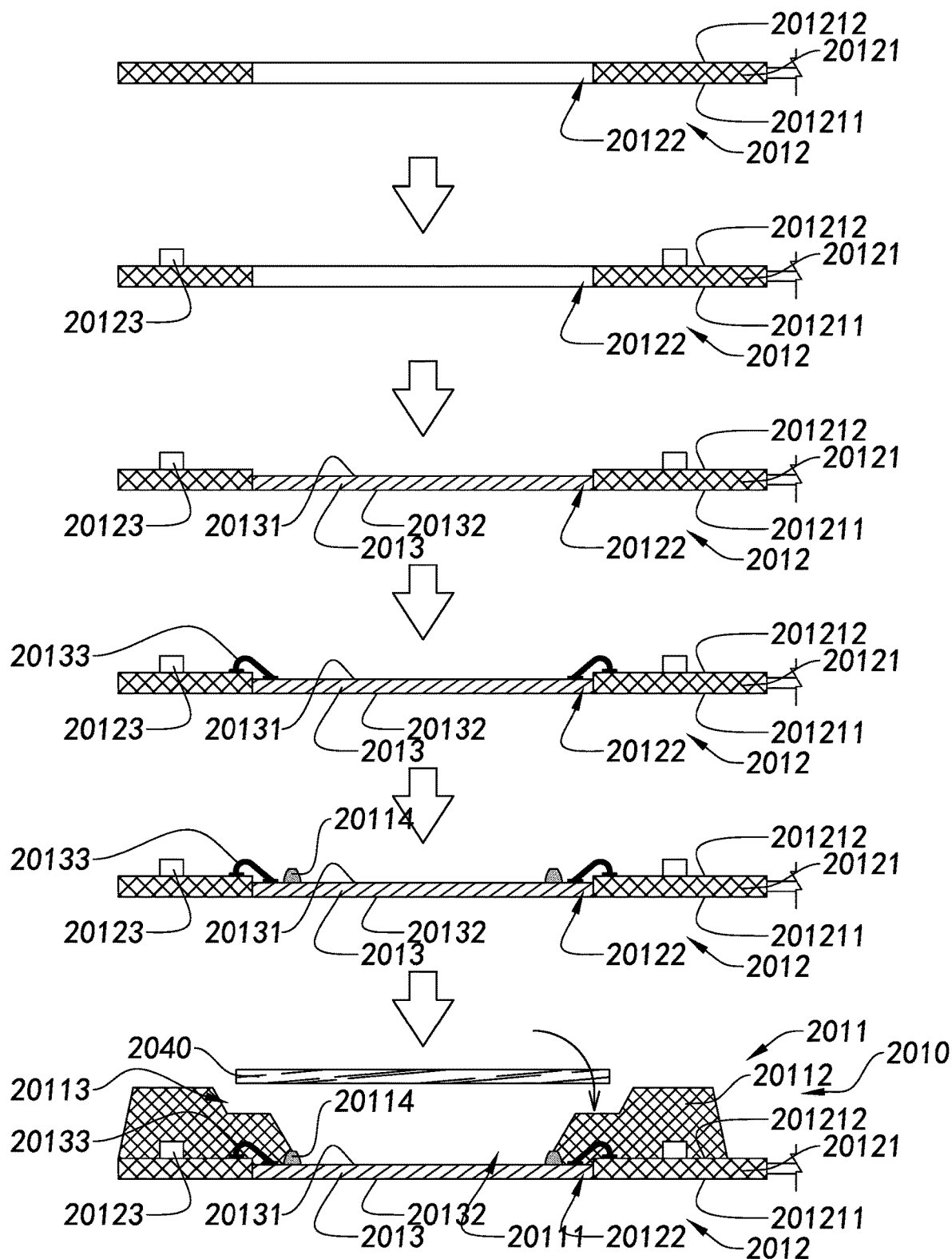
FIG. 29A is a forming process diagram of the photosensitive component according to the above ten first preferred embodiment of the present invention.
Figure 29B:
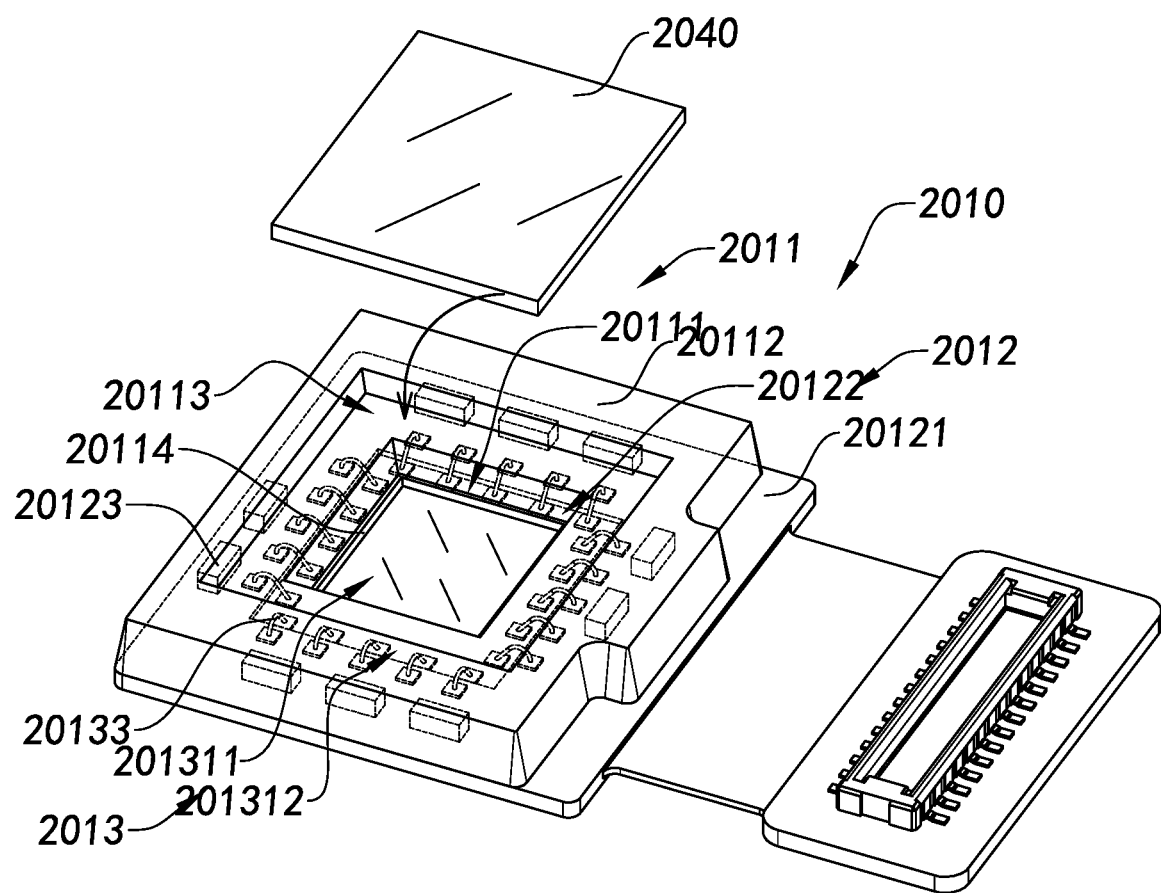
FIG. 29B is a perspective view of the photosensitive component according to the above eleventh preferred embodiment of the present invention.

Further, referring to FIGS. 29A and 29B, in the producing process of the photosensitive component 2010, before integrally encapsulating the photosensitive element 2013 of the circuit board main body 20121, the interval medium 20114 is required to be formed on a predetermined position of the photosensitive element 2013. Then, the photosensitive element 2013 and the circuit board main body 20121 are integrally encapsulated. The interval medium 20114 is arranged in the non-photosensitive area 201312 of the photosensitive element 2013, surrounding the periphery of the photosensitive area 201311, wherein the specific arranging position can be determined based on the needs. More specifically, the interval medium 20114 may be formed after the electronic components 20123 and the electrical connection elements 20133 are deployed and arranged, wherein the present invention shall not be limited here.

In the present embodiment of the present invention, the electrical connection elements 20133 are arranged on four sides of the photosensitive element 2013. Correspondingly, the interval medium 20114 is arranged and deployed on the corresponding positions of the electrical connection elements 20133, so as to utilize the interval medium 20114 to protect the electrical connection elements 20133 and prevent the manufacturing device 20200 from contacting or damaging the electrical connection elements 20133. The position and height of the interval medium 20114 can be determined and arranged according to the electrical connection elements 20133.

Further, according to some embodiments of the present invention, a gap 2014 is provided between the photosensitive element 2013 and the circuit board main body 20121, and an integration base of the base main body 20112 is extended into the gap 2014 for better affixing the circuit board main body 20121 and the photosensitive element 2013 in relative positions. More specifically, the gap 2014 may surround the photosensitive element 2013, so as to allow the base main body 20112 to fill up the periphery of the photosensitive element 2013 and affix the photosensitive element 2013 more firmly. Certainly, there may not have the gap 2014 provided according to other embodiments of the present invention. For example, when the size of the disposing area 20122 is greater than the size of the photosensitive element 2013, the gap 2014 is formed between the photosensitive element 2013 and the circuit board main body 20121. When the size of the disposing area 20122 is equal to the size of the photosensitive element 2013, no gap is formed between the photosensitive element 2013 and the circuit board main body 20121.

Figure 33:
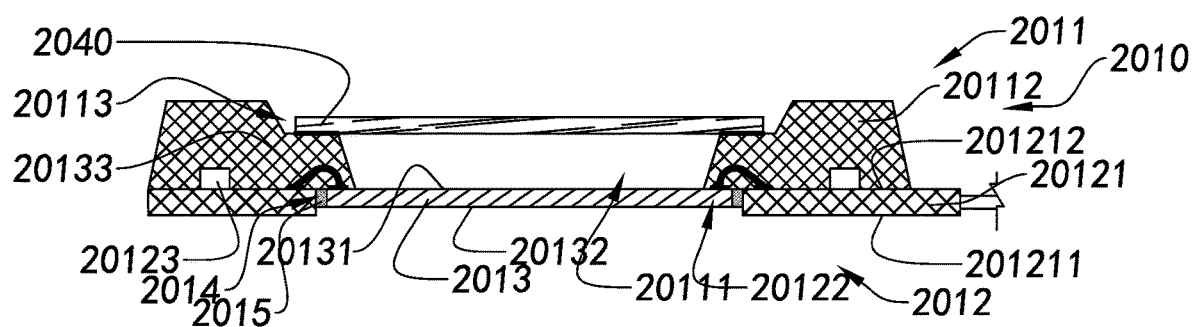
FIG. 33 illustrates the photosensitive component according to a second alternative mode of the above eleventh preferred embodiment of the present invention.

Referring to FIG. 33, according to another embodiment of the present invention, the gap 2014 can also be filled up with a filling medium 2015. The filling medium 2015 can be, for example but not limited to, glue, adhesive material, and etc., such that the filling medium 2015 can be utilized to pre-fix the photosensitive element 2013. In other words, in the producing process of the photosensitive component 2010, the filling medium 2015 may first be used to fill the gap 2014 between the photosensitive element 2013 and the circuit board main body 20121 to pre-fix the relative positions of the photosensitive element 2013 and the circuit board main body 20121 through the filling medium 2015, and then the photosensitive element 2013 and the circuit board main body 20121 are integrally encapsulated to further firmly affix the photosensitive element 2013 and the circuit board main body 20121 in position by the base main body 20112.

Figure 30A:
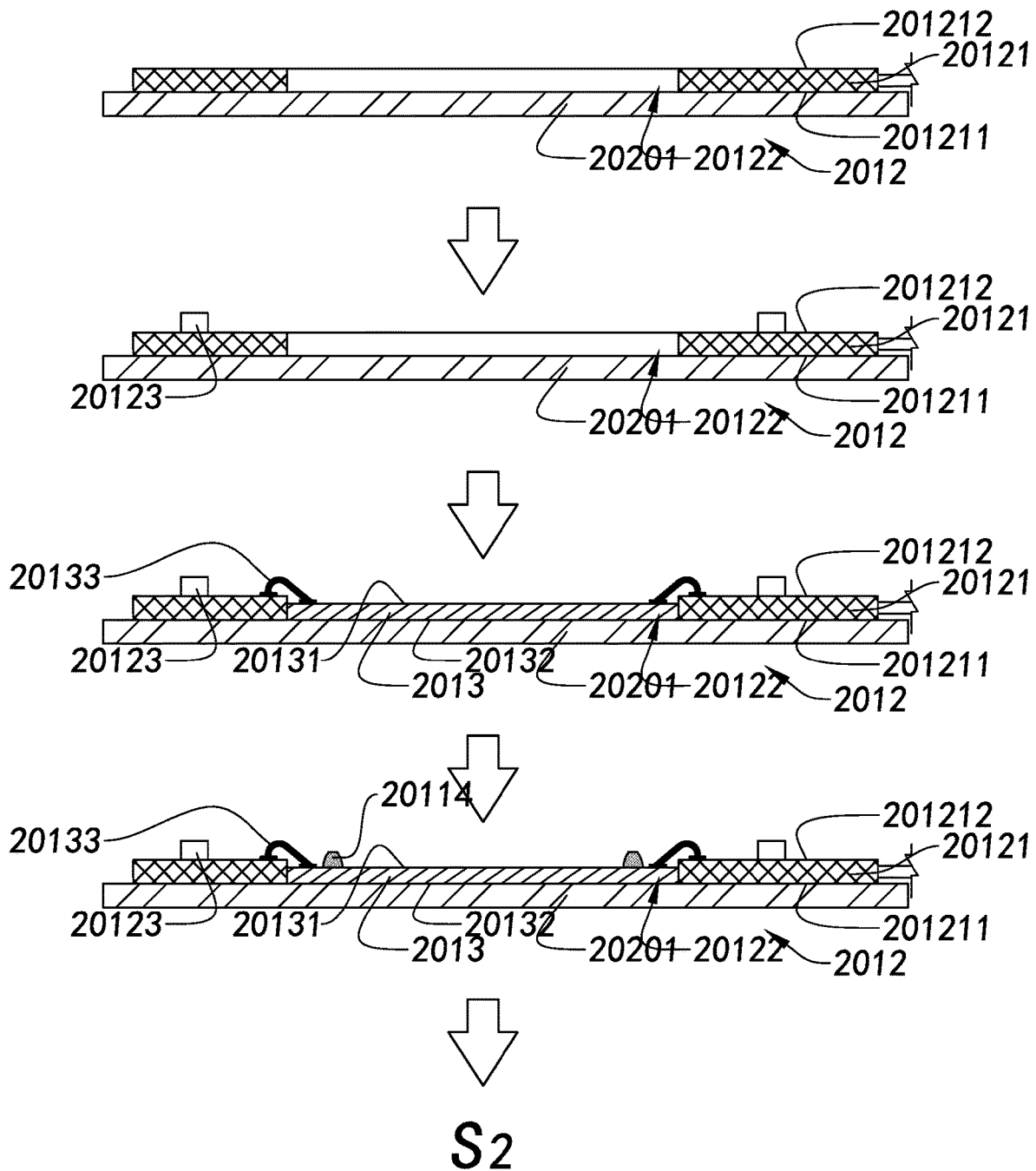
FIGS. 30A and 30B are manufacturing process diagrams illustrating a photosensitive component manufactured by a manufacturing device according to the above eleventh preferred embodiment of the present invention.
Figure 30B:
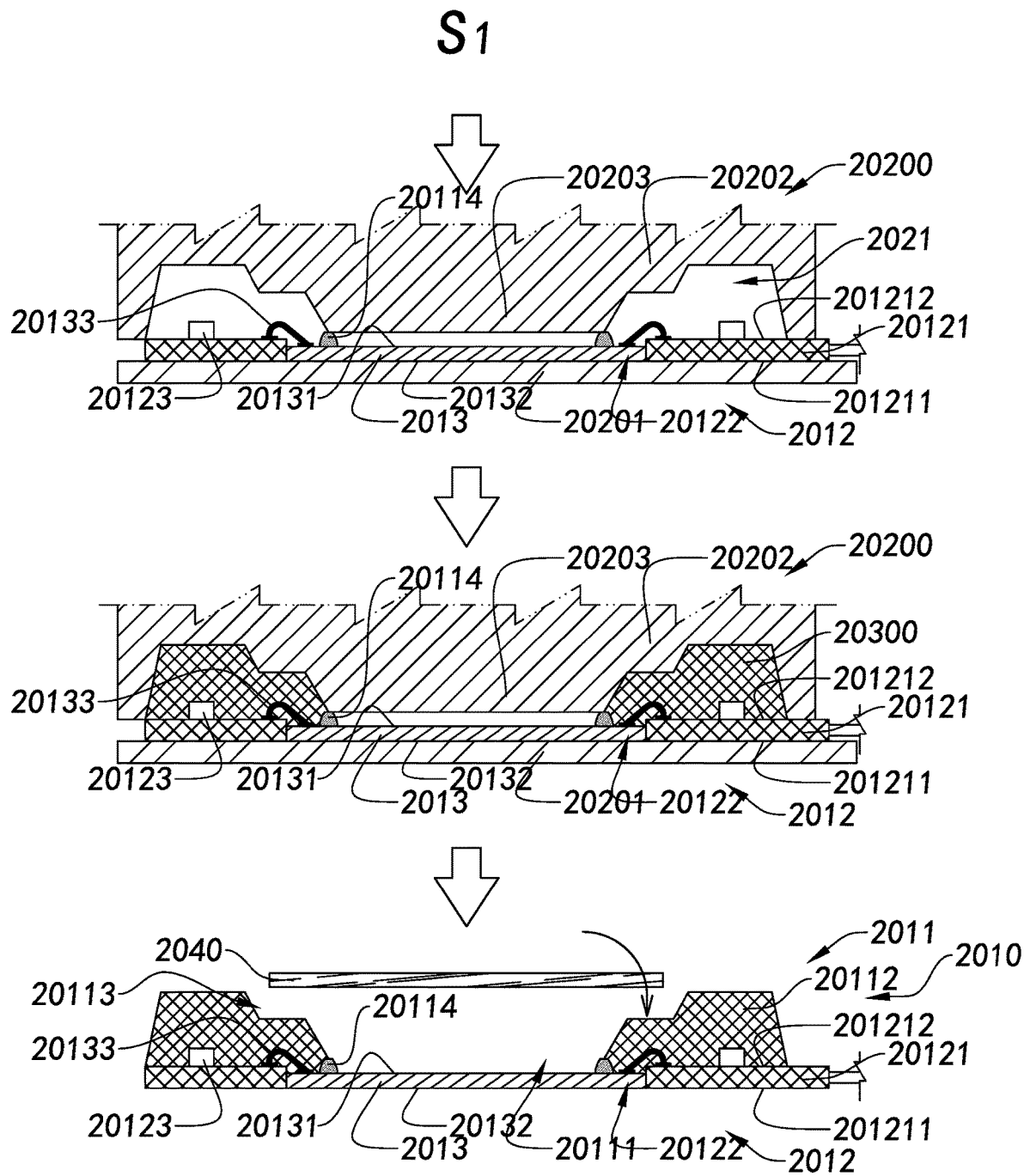

FIGS. 30A and 30B illustrate a manufacturing device 20200 and a manufacturing process of the photosensitive component 2010 according to the eleventh preferred embodiment of the present invention. The manufacturing device 20200 comprises a formation mould 20202 and a peelable basal plate 20201. The formation mould 20202 and the peelable basal plate 20201 are capable of opening and clamping, so as to make the base main body 20112 by molding on the circuit board main body 20121.

The manufacturing device 20200 comprises an optical window molding block for molding and forming the optical window 20111. According to this embodiment of the present invention, the formation mould 20202 provides the optical window molding block 20203 extended downwardly and forms a base forming guide groove 202021 around the optical window molding block 20203 and having the same shape of the base main body 20112 correspondingly, such that when the formation mould 20202 is clamped and the liquid molding material 20300 is added into the base forming guide groove 202021, the base main body 20112 is molded to make in a predetermined shape and encapsulated with the photosensitive element 2013 and the circuit board main body 20121. Preferably, the electronic components 20123 and the electrical connection elements 20133 are accommodated and received in the base forming guide groove 202021, so as to utilize the molding material 20300 to cover, enclose, encapsulate and/or wrap up the electronic components 20123 and the electrical connection elements 20133 during the integral forming process. That is, the base main body 20112 is formed while covering, enclosing, encapsulating and/or wrapping up the electronic components 20123 and the electrical connection elements 20133 and the mounting groove 20113 is formed on top of the base main body 20112.

It is worth mentioning that, according to some embodiments, a film is deployed on an inner side of the optical window molding block 20203 of the formation mould 20202 of the manufacturing device 20200, which is used for molding the respective side of the base main body 20112, for facilitating the formation of the base main body 2011, preventing the optical window molding block 20203 from damaging the photosensitive element 2013, and facilitating demolding.

Further, according to the present embodiment of the present invention, the peelable basal plate 20201 is an adhesive basal plate. When the circuit board main body 20121 is placed and deployed on the peelable basal plate 20201, the relative positions among the circuit board main body 20121, the photosensitive element 2013, and the peelable basal plate 20201 can be determined. It is worth mentioning that the photosensitive element 2013 and the circuit board main body 20121 are both supported on the plane-shaped peelable basal plate 20201, ensuring the bottom side 201211 of the circuit board main body 20121 and the back side 20132 of the photosensitive element 2013 are on the same plane and a flat and smooth bottom surface of the photosensitive component 2010. Certainly, according to other embodiments of the present invention, the peelable basal plate 20201 may also be in other forms, such as providing a groove or bulge to restrict the circuit board main body 20121 and the photosensitive element 2013.

It is worth mentioning that the optical window molding block 20203 of the formation mould 20202 is supported at the interval medium 20114 during clamping of the formation mould 20202, so that the optical window molding block 20203 would not directly contact with the photosensitive element 2013.

Further, the formation mould may also comprise a cover film, deployed on the inner surface of the formation mould 20202, adapted for forming the base main body 20112, protecting the photosensitive element 2013, and preventing the optical window molding block 20203 from damaging the photosensitive element 2013.

A manufacturing process of the photosensitive component 2010 comprises the following steps. First, arrange the circuit board main body 20121, which has a disposing area 20122 provided thereon, on the peelable basal plate 20201, wherein the electronic components 20123 may have been attached on the circuit board main body 20121. Next, electrically connect the photosensitive element 2013 with the circuit board main body 20121 through the one or more electrical connection elements 20133. Next, arrange and deploy the interval medium 20114 on the non-photosensitive area 201312 of the photosensitive element 2013. Next, clamp the formation mould 20202 and the peelable basal plate 20201, wherein the formation mould 20202 is supported by the interval medium 20114 or film to prevent the optical window molding block 20203 from directly contacting the photosensitive element 2013. Next, fill the molding material 20300 into the base forming guide groove 202021 to form the base main body 20112 and integrally encapsulate the photosensitive element 2013 and the circuit board main body 20121. Next, open the formation mould 20202 and the peelable basal plate 20201 and separate the peelable basal plate 20201 from the photosensitive element 2013 and the circuit board main body 20121 to obtain the photosensitive component 2010. The way to separate the peelable basal plate 20201 from the circuit board main body 20121 and the photosensitive element 2013 can be, for example but not limited to, peeling, exposure, hot melting, etching, dissolving, grinding, and etc. The peelable basal plate 20201 can also be placed on a lower mold of the formation mould 20202 for ease of replacement and maintenance.

Figure 31:
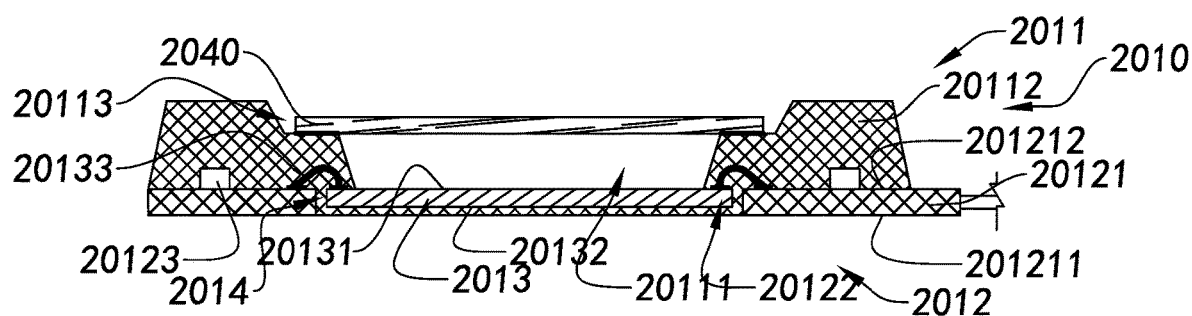
FIG. 31 illustrates the photosensitive component according to a first alternative mode of the above eleventh preferred embodiment of the present invention.
Figure 32A:
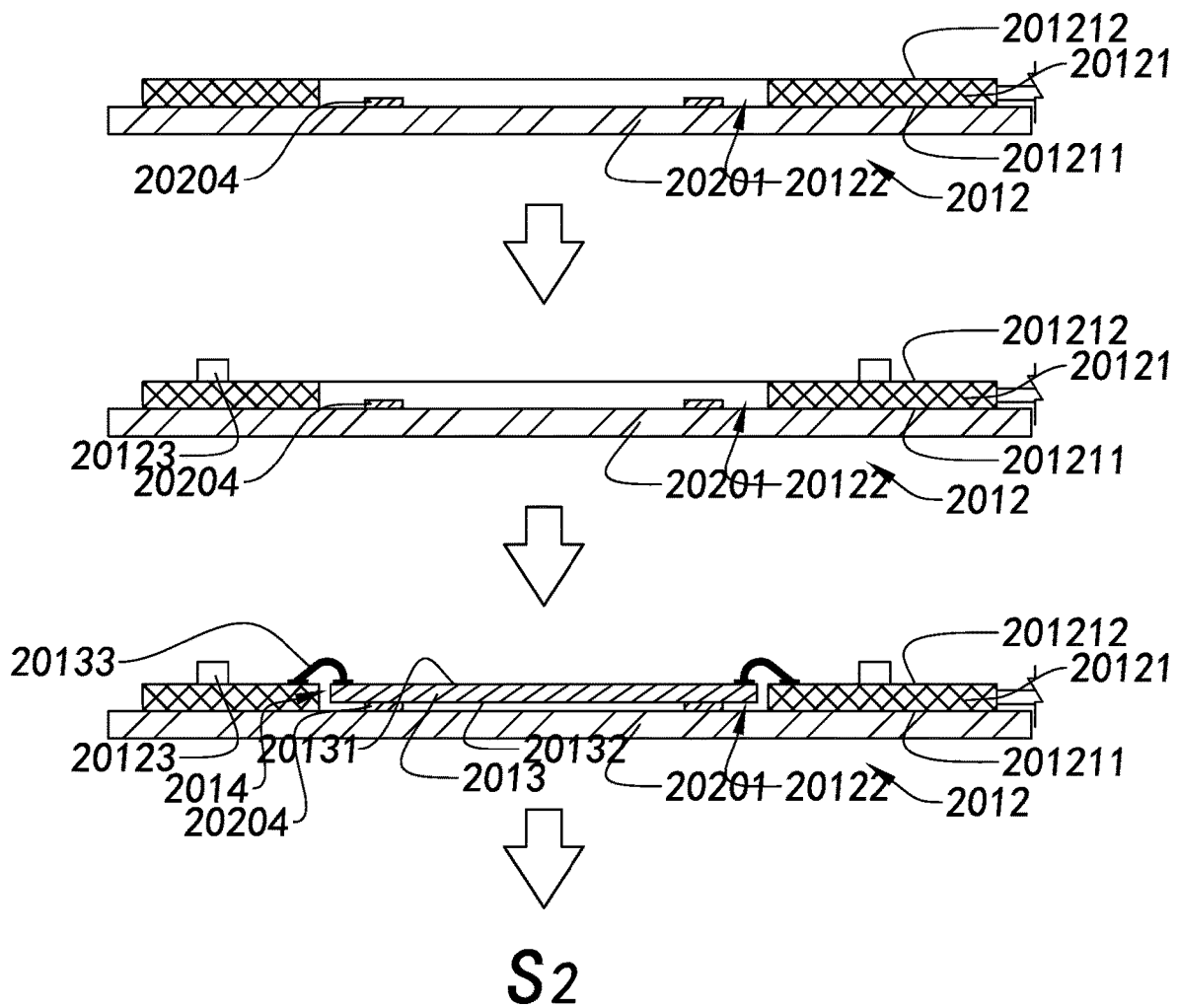
FIGS. 32A and 32B are manufacturing process diagrams illustrating an alternative mode of a photosensitive component manufactured by a manufacturing device according to the above eleventh preferred embodiment of the present invention.
Figure 32B:
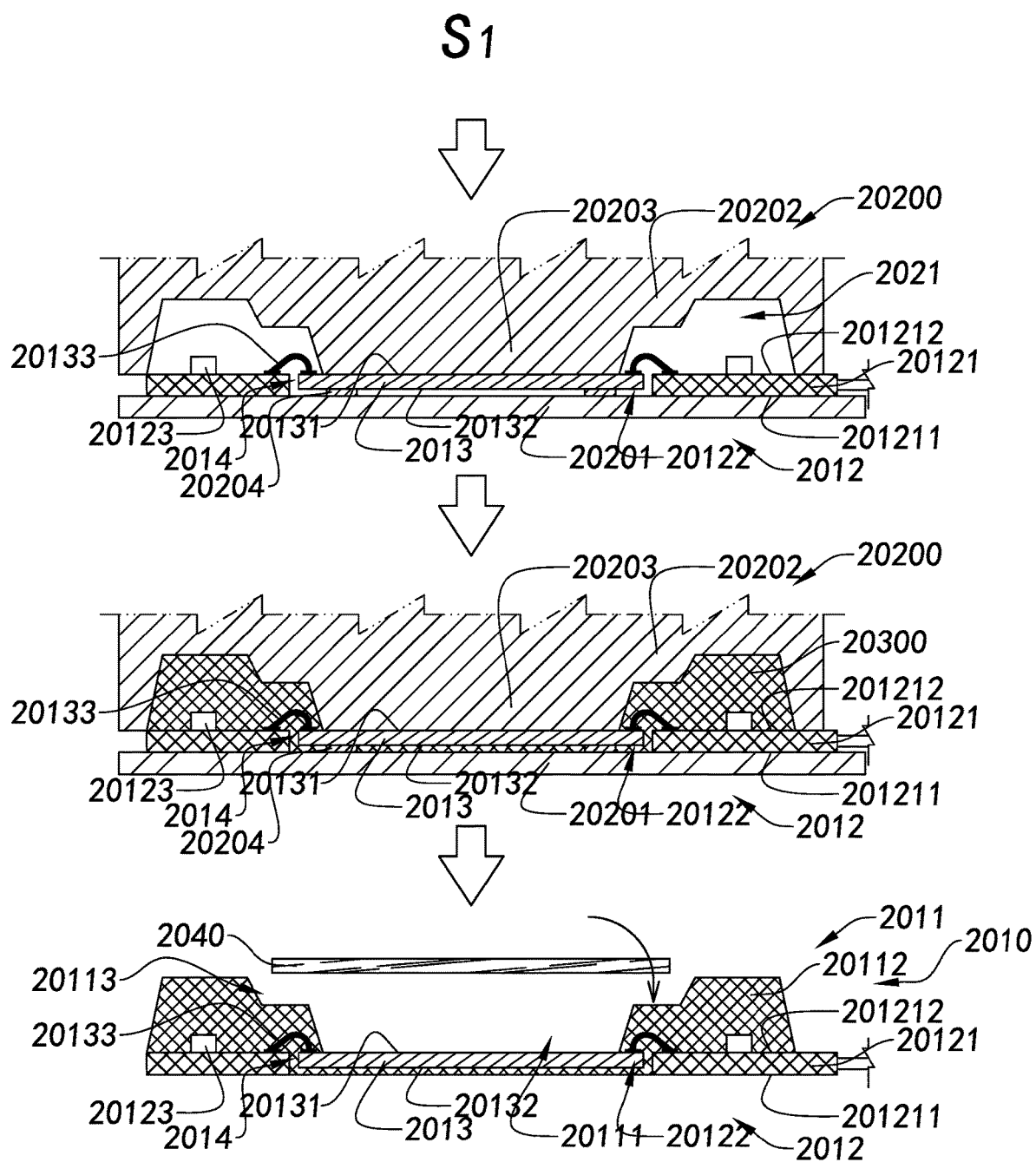

FIGS. 31-32B illustrate manufacturing processes and manufacturing device of a photosensitive component 2010 according to another alternative mode of the above eleventh preferred embodiment of the present invention, which is different from the above preferred embodiments that, the front side 20131 of the photosensitive element 2013 and the top side 201212 of the circuit board main body 20121 are arranged on the same plane. The base main body 20112 extends into the gap 2014 defined between the photosensitive element 2013 and the circuit board main body 20121 and extends to cover, enclose, encapsulate and/or wrap up the back side 20132 of the photosensitive element 2013.

Further, the peelable basal plate 20201 of the manufacturing device 20200 comprises at least a prop 20204 protruded from the peelable basal plate 20201 for supporting the photosensitive element 2013. The quantity and shape of the prop 20204 can be determined according to the needs.

The manufacturing process of the photosensitive component 2010 may include: the steps of arranging the circuit board main body 20121 on the peelable basal plate 20201, so as to support the circuit board main body 20121 on the peelable basal plate 20201 and arranging the photosensitive element 2013 on the disposing area 20122 of the circuit board main body 20121 so as to be supported on the prop 20204. Preferably, in one embodiment, when the photosensitive element 2013 is supported on the prop 20204, the front side 20131 of the photosensitive element 2013 and the top side 201212 of the circuit board main body 20121 are on the same plane. Preferably, the surfaces of the peelable basal plate 20201 and the prop 20204 are adhesive surfaces that are capable of being peeled off from whatever components in contact. Further, in the clamping state, the molding material 20300 is added into the base forming guide groove 202021 and extended into the gap 2014 and the space between the back side 20132 of the photosensitive element 2013 and the peelable basal plate 20201, so as to cover, enclose, encapsulate and/or wrap up the back side 20132 of the photosensitive element 2013. Then, after the base main body 20112 is formed, the formation mould 20202 and the peelable basal plate 20201 can be opened to detach and separate the peelable basal plate 20201 and/or the prop 20204 from the photosensitive component 2010. Certainly, in some embodiments, the prop 20204 can be detachably arranged on the peelable basal plate 20201, such that when the peelable basal plate 20201 is removed, the prop 20204 can be detached from the peelable basal plate 20201 and remains attaching on the base main body 20112. The peelable basal plate 20201 can also be placed on the lower mold of the formation mould 20202 for facilitating the replacement and maintenance of the peelable basal plate 20201.

Referring to FIGS. 34-36C, the photosensitive component and the manufacturing device thereof according to a twelfth preferred embodiment of the present invention are illustrated. The photosensitive component 2010 which is manufactured by the manufacturing device 20200 is different from the above preferred embodiment that the base main body 20112 comprises a primary base 201121 and a secondary base 201122, wherein the optical window 20111 is defined between the primary base 201121 and the secondary base 201122 for providing a light path for the photosensitive element 2013.

Figure 34:
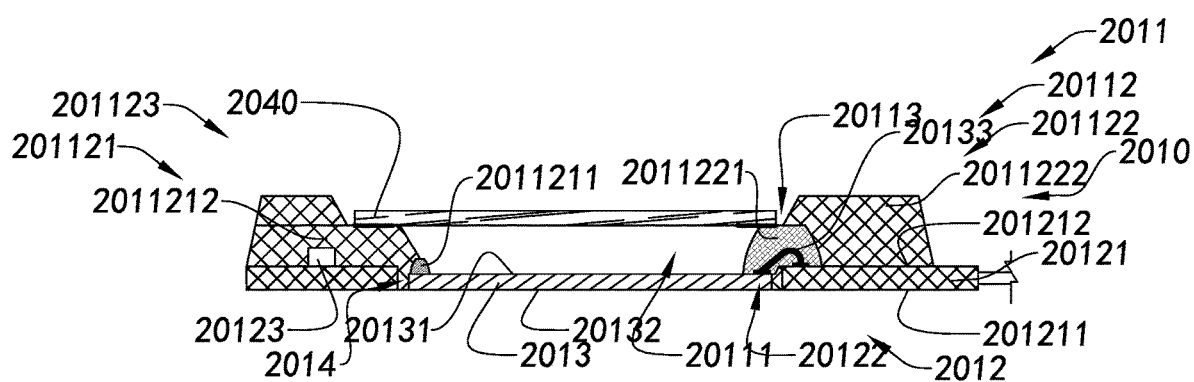
FIG. 34 illustrates a photosensitive component according to a twelfth preferred embodiment of the present invention.
Figure 36A:
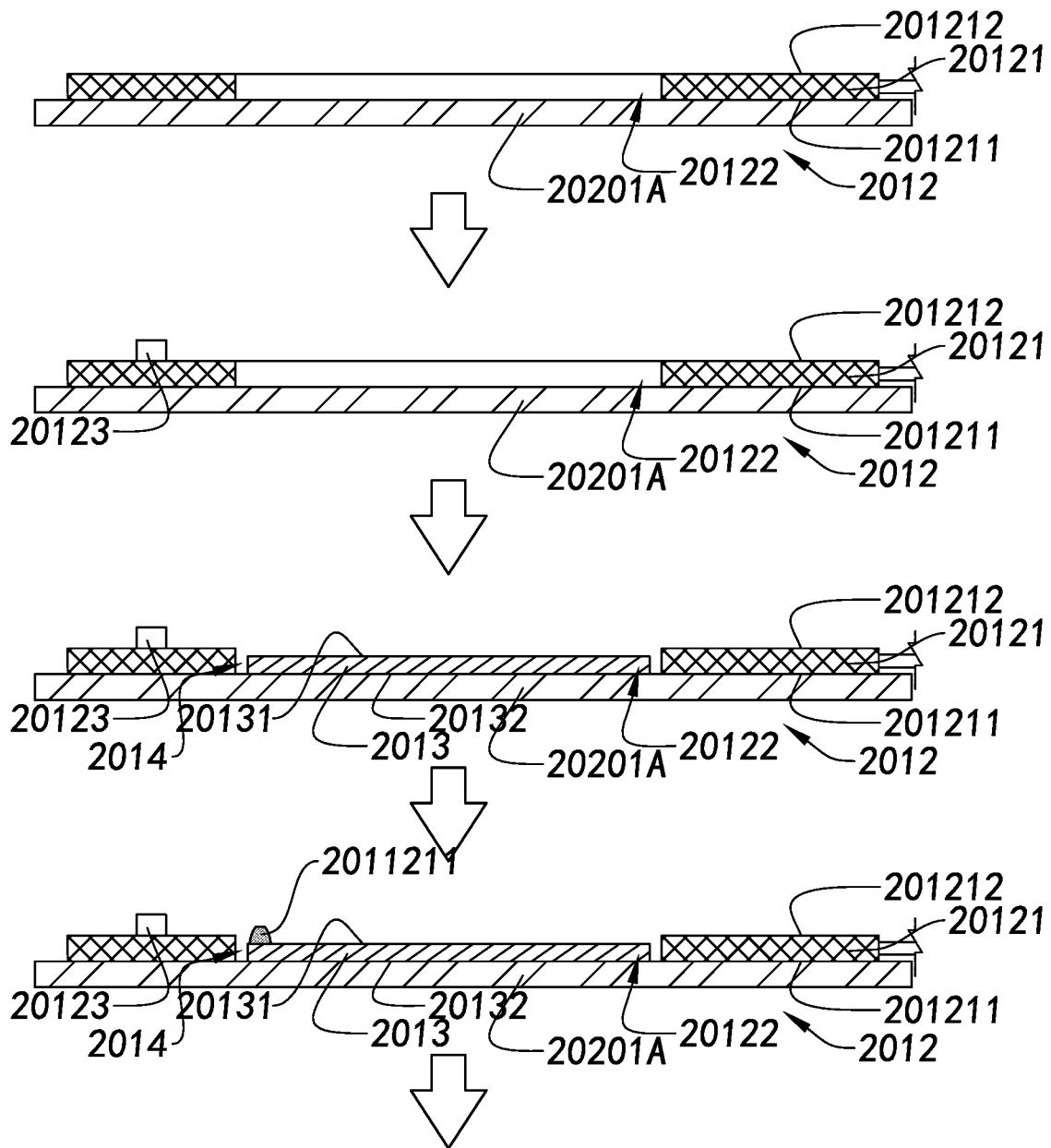
FIGS. 36A, 36B, and 36C illustrate manufacturing processes of a photosensitive component manufactured by a manufacturing device according to the above twelfth preferred embodiment of the present invention.
Figure 36B:
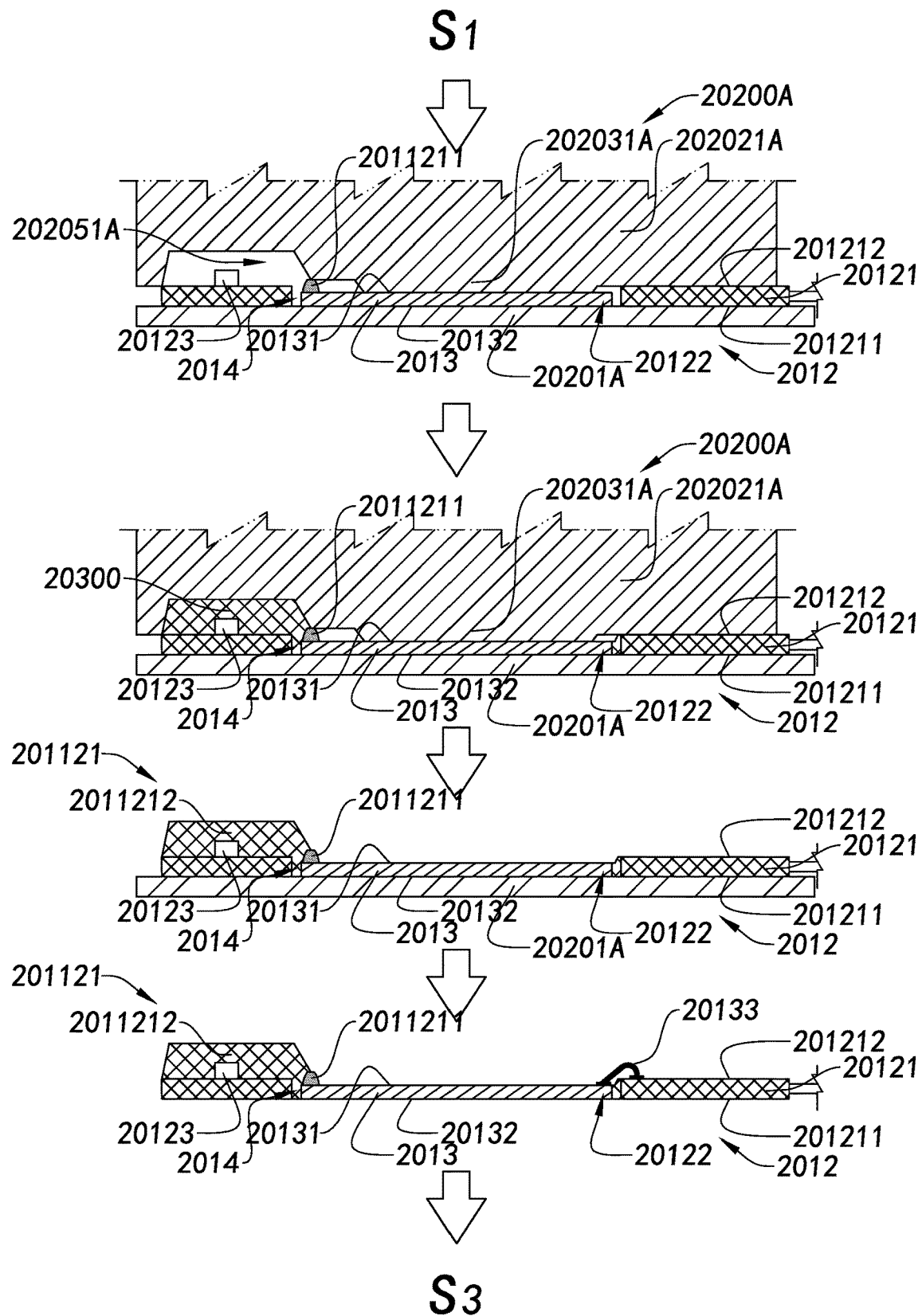
Figure 36C:
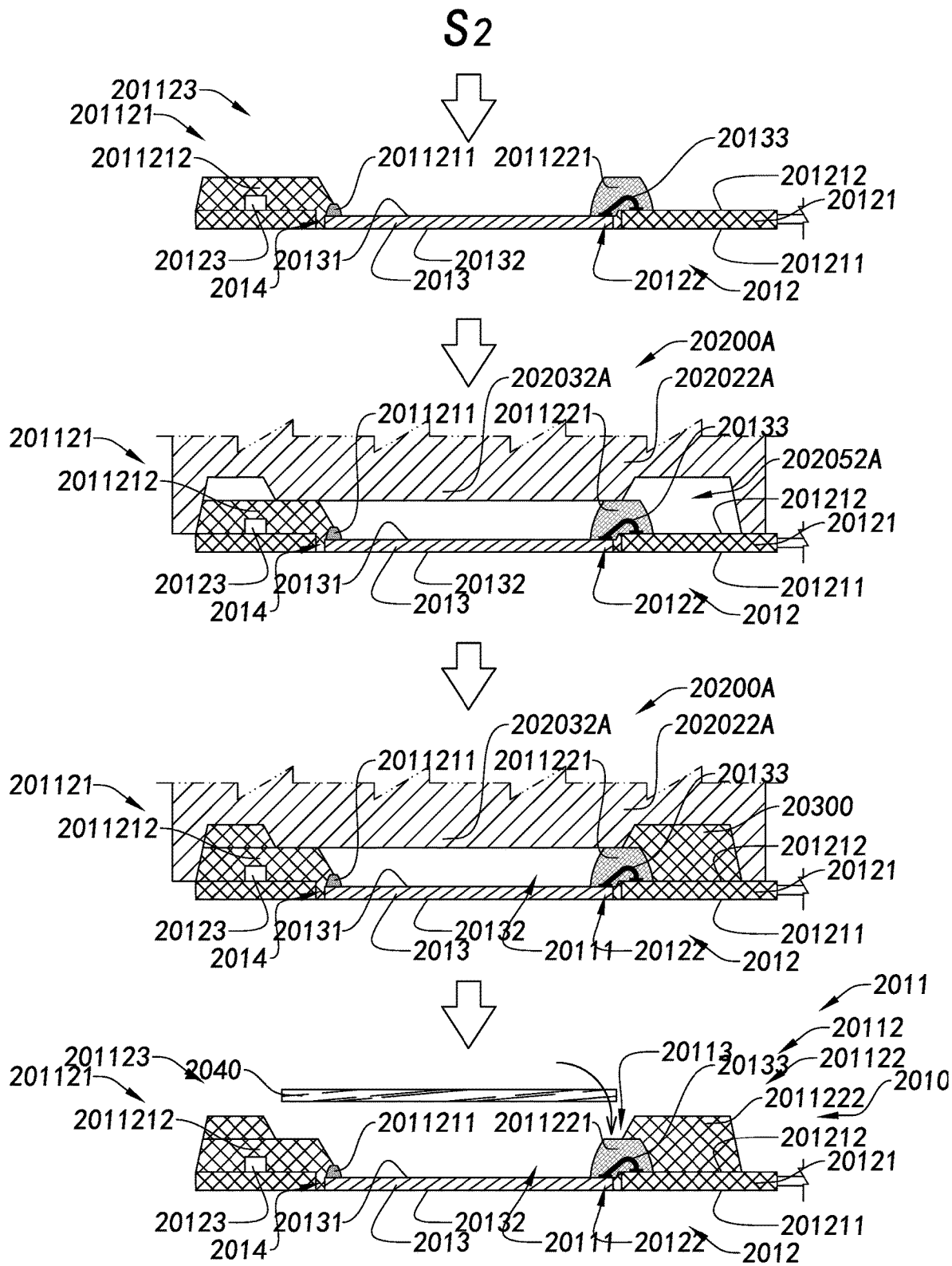

Referring to FIGS. 34, 36B, and 36C, the primary base 201121 comprises a substrate 2011211 and a primary packaging base 2011212, while the secondary base 201122 comprises a packaging and encapsulating base 2011221 and a secondary packaging base 2011222. The bottom liner 2011211 isolates the primary packaging base 2011212 and the photosensitive element 2013, so as to protect the photosensitive element 2013 and prevent the manufacturing device 20200 from damaging the photosensitive element 2013 when the manufacturing device 20200 is utilized to form the primary packaging base 2011212. The packaging and encapsulating base 2011221 isolates the secondary packaging base 2011222 and the photosensitive element 2013, so as to protect the photosensitive element 2013 and prevent the manufacturing device 20200 from damaging the photosensitive element 2013 when the manufacturing device 20200 is utilized to form the secondary packaging base 2011222.

Certainly, according to other embodiments of the present invention, the primary base 201121 may not include the substrate 201121 and merely be constructed by the primary packaging base 2011212. That is, it primarily shapes and forms the primary packaging base 20111212 on at least a part of the photosensitive element 2013 and the circuit board main body 20121. The packaging with encapsulating base 2011221 of the secondary base 201122 and the primary packaging base 2011212 form a ring structure, wherein the secondary packaging base 2011222 utilizes the ring structure as the basis for primary shaping to form the optical window 20111.

Preferably, the primary base 201121 is arranged on one or more sides of the electrical connection elements 20133; the packaging and encapsulating base 2011221 is arranged on a position without the electrical connection elements 20133; the packaging and encapsulating base 2011221 covers, encloses, encapsulates and/or wraps up the electrical connection elements 20133.

Figure 35A:
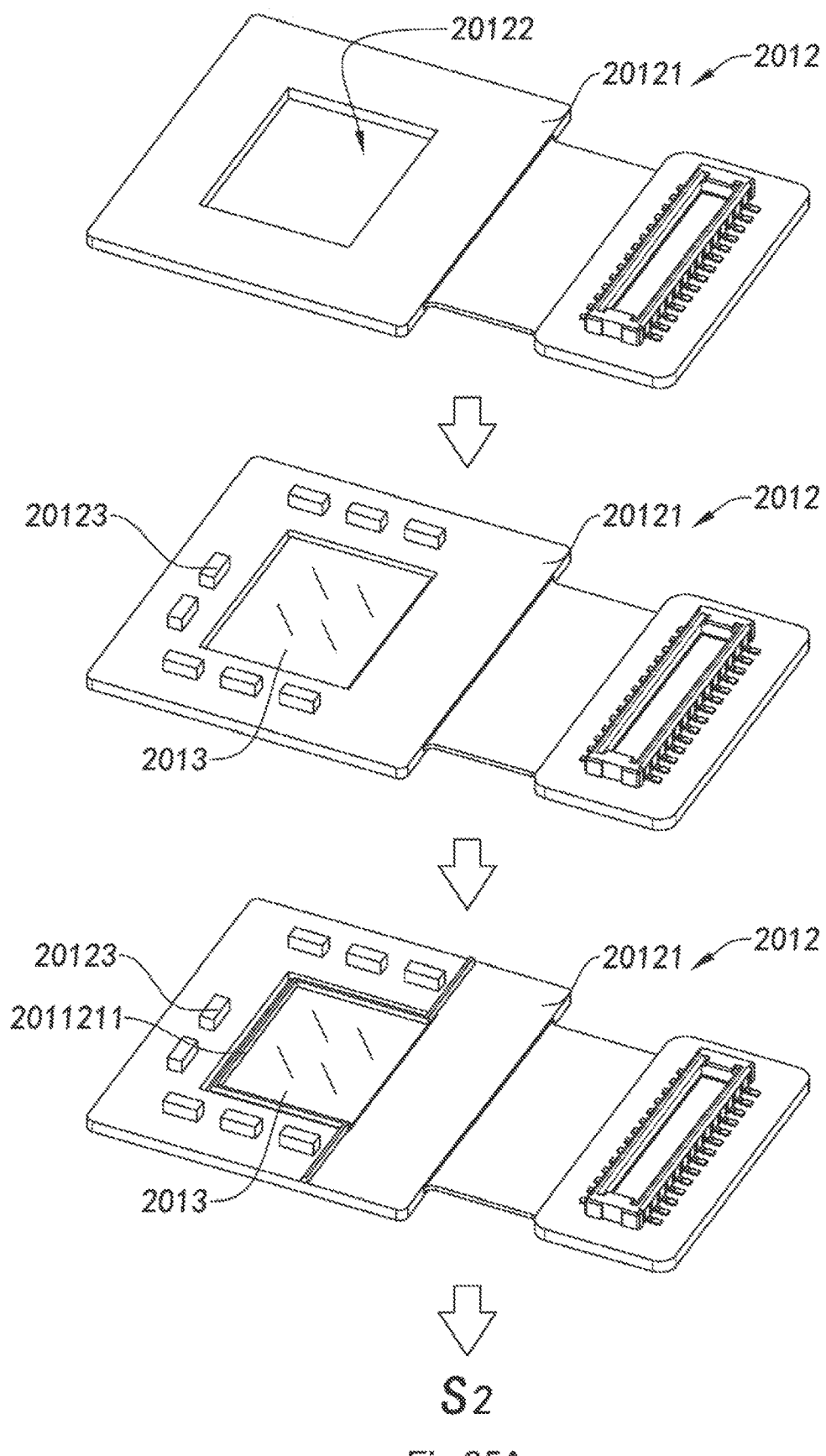
FIGS. 35A and 35B are forming process diagrams of a photosensitive component according to the above twelfth preferred embodiment of the present invention.
Figure 35B:
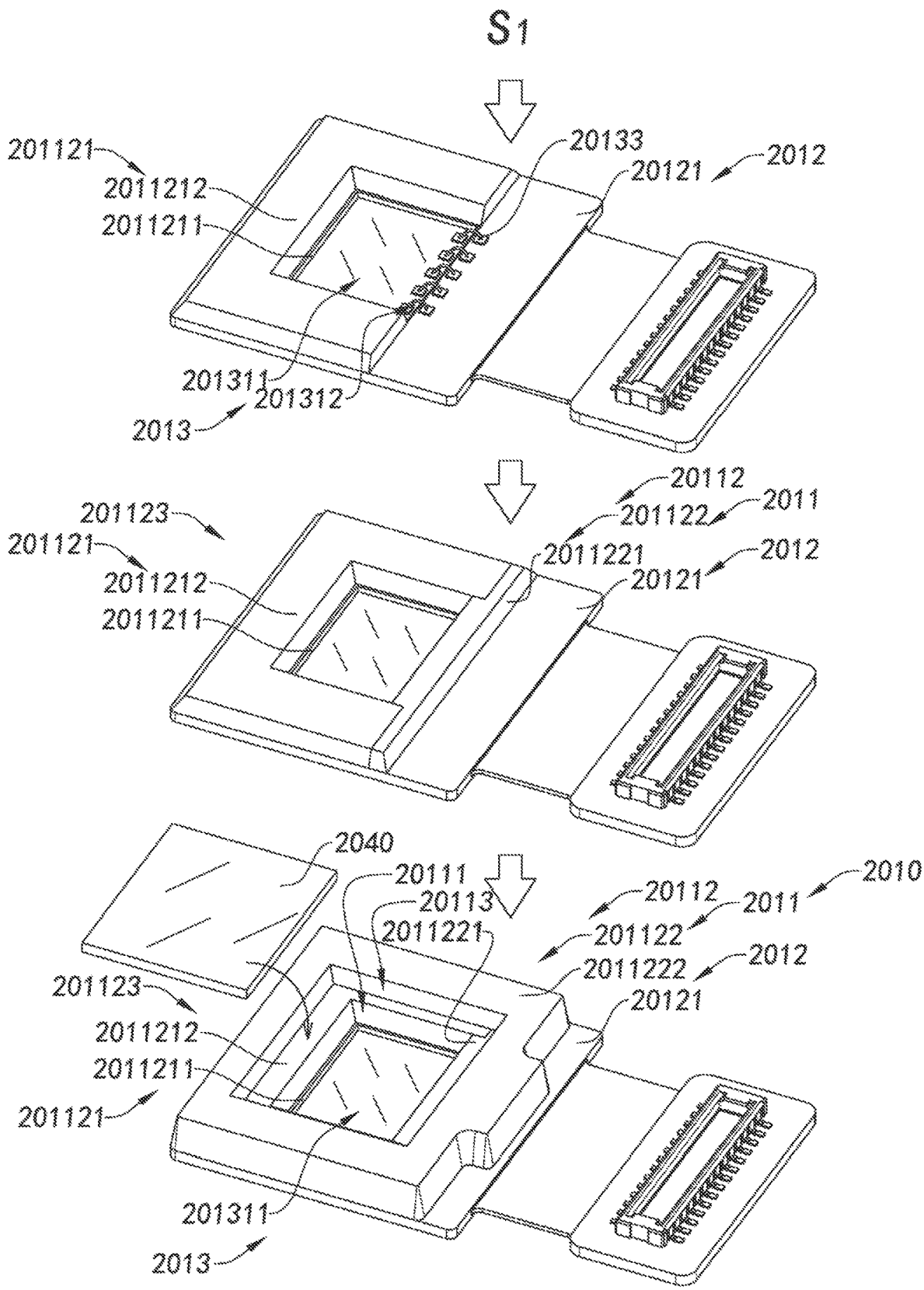

It is worth mentioning that, referring to FIGS. 35A and 35B, in this implementation, the primary base 201121 is used to pre-fix the photosensitive element 2013. Because the primary base 201121 can be integrally shaped and formed by means of molding for achieving a better pre-fixing effect, so as to reduce the adverse effect to the photosensitive element 2013 when forming the secondary base 201122. Besides, when the packaging and encapsulating base 2011221 packages and encapsulates the electrical connection elements 20133 and also connects the photosensitive element 2013 and the circuit board main body, so as to better affix the photosensitive element 2013 firmly.

Referring to FIGS. 35B and 36C, the packaging and encapsulating base 2011221 and the primary base 201121 form a ring structure 201123, wherein a mounting groove 20113 is defined between the secondary packaging base 2011222 and the ring structure 201123. In other words, the secondary base 201122 and the primary base and the packaging and encapsulating base 2011221 form the mounting groove 20113. In this implementation, the mounting groove 20113 is defined and formed by the combination of the primary base 201121 and the secondary base 201122, rather than integrally shaped and formed directly by molding, that substantially reduces the formation of turning corner and burr during the forming process. In the present embodiment of the present invention, the mounting groove 20113 is adapted for mounting the filter 2040.

Further, the primary base 201121 and the packaging and encapsulating base 2011221 extend into the gap 2014 between the photosensitive element 2013 and the circuit board main body 20121 for better affix the circuit board main body 20121 and the photosensitive element 2013 in position.

The following illustration is provided in the case that the electrical connection elements 20133 are arranged on a side of the photosensitive element 2013.

Referring to FIGS. 36A-36C, the manufacturing device 20200A comprises a peelable basal plate 20201A and a formation mould 20202A. The peelable basal plate 20201A is adapted for supporting the circuit board main body 20121 and the photosensitive element 2013, while the formation mould 20202A is used for molding and forming the base main body 20112A.

Further, the formation mould 20202A comprises a first formation mould 202021A and a second formation mould 202022A, wherein the first formation mould 202021A is for forming the primary base 201121, and the second formation mould 202022A is for forming the secondary base 201122.

Further, the first formation mould 202021A has a primary base forming guide groove 202051A shaped corresponding to the required shape of the primary base 201121. The second formation mould 202022A has a secondary base forming guide groove 202052A shaped corresponding to the required shape of the secondary base 201122.

The manufacturing device 20200A comprises two optical window molding blocks, namely a first optical window molding block 202031A and a second optical window molding block 202032A. The first optical window molding block 202031A is arranged on the first formation mould 202021A to coordinate with the first formation mould 202021A to form the primary base forming guide groove 202051A, while the second optical window molding block 202032A is arranged on the second formation mould 202022A to coordinate with the second formation mould 202022A to form the secondary base forming guide groove 202052A. Then the primary base 201121 and the secondary base 201122 are coordinated to form the optical window 20111. In other words, each of these two forming processes respectively forms a part of the optical window 20111.

For example, referring to FIGS. 36A-36C, the manufacturing process of the photosensitive component 2010, by utilizing an embodiment that the electrical connection elements 20133 are arranged on one side of the photosensitive element 2013 as an example for illustration, comprises the following steps. First, arrange the circuit board main body 20121 on the peelable basal plate 20201A and pre-fix the circuit board main body 20121 in position. Next, sink the photosensitive element 2013 in the disposing area 20122 of the circuit board main body 20121, which is supported by the peelable basal plate 20201A, and pre-fix the photosensitive element 2013 in position. Next, arrange and deploy the bottom liner 2011211 at a predetermined position on the photosensitive element 2013 through, for example, applying or coating adhesive to form the bottom liner 2011211. Further, clamp the first formation mould 202021A to press fit the front side 20131 of the photosensitive element 2013 and the top side 201212 of the circuit board main body 20121 and to have the first formation mould 202021A supported by the bottom liner 2011211, so as to form the primary base 201121 at the outer side of the bottom liner 2011211 while the inner side of the bottom liner 2011211 is avoided from being encapsulated, so that the first formation mould 202021A is prevented from damaging the photosensitive element 2013 by means of, for example, the bottom liner 2011211 to bear the downward pressing force of the first formation mould 202021A while the photosensitive element 2013 bears less or no downward pressing force of the first formation mould 202021A. Next, add the molding material 20300 into the primary base forming guide groove 202051A to integrally encapsulate a part of the top side 201212 of the circuit board main body 20121 and a part of the front side 20131 of the photosensitive element 2013 and to pre-fix the photosensitive element 2013 and the circuit board main body 20121 through the primary packaging base 2011212. Next, arrange and deploy the electrical connection elements 20133 at the predetermined positions of the electrical connection elements 20133 on the photosensitive element 2013 after the first formation mould 202021A is demolded and removed, so as to electrically connect the photosensitive element 2013 with the circuit board main body 20121. Next, form the packaging and encapsulating base 2011221 at the position corresponding to the electrical connection elements 20133 to cover, enclose, encapsulate and/or wrap up the electrical connection elements 20133 and to form a ring structure 201123 by the packaging and encapsulating base 2011221 and the primary base 201121. Next, clamp the second formation mould 202022A and have the second formation mould 202022A supported by the ring structure 201123. Next, add the molding material 20300 into the secondary base forming guide groove 202052A of the second formation mould 202022A, so as to form the secondary packaging base 2011222 based on the ring structure 201123 and obtain the photosensitive component 2010.

Figure 37:
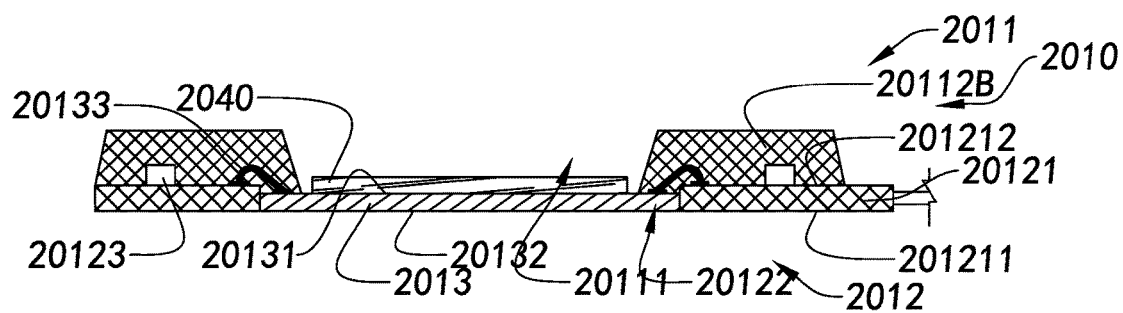
FIG. 37 illustrates a photosensitive component according to a thirteenth preferred embodiment of the present invention.

Referring to FIG. 37, a photosensitive component according to a thirteenth preferred embodiment of the present invention is illustrated, which is different from the above embodiment that the photosensitive component 2010 further comprises a filter 2040, wherein the filter 2040 covers the photosensitive element 2013 to protect the photosensitive element 2013.

Further, according to the present embodiment, the base main body 20112B may be a platform shaped structure. In other words, the base main body 20112B does not have the mounting groove 20113 for providing more mounting space for other components, such as the actuator 2030, the lens 2020, and etc.

For example, in the manufacturing process of the photosensitive component 2010, the filter 2040 can be positioned above the photosensitive element 2013 before integrally encapsulating the photosensitive element 2013 and the circuit board main body 20121. Then, the photosensitive element 2013 and the circuit board main body 20121 are integrally encapsulated through the manufacturing device 20200, so as to utilize the filter 2040 to protect the photosensitive element 2013, to prevent the manufacturing device from damaging the photosensitive element 2013, and to block the dusts in the environment from reaching the photosensitive element 2013. Moreover, it can also shorten the back focal length of the camera module 20100 assembled with the photosensitive component 2010 and lower the height of the camera module.

In one implementation, the filter 2040 can be located on the inner side of the base main body 20112B and not be integrally encapsulated. For example, the filter 2040 is positioned above the photosensitive element 2013 through adhering or coating to cover the photosensitive element 2013.

In other embodiments, the filter 2040 can be integrally encapsulated by the base main body 20112, such that the filter 2040 does not have to be mounted through any other means.

Figure 38:
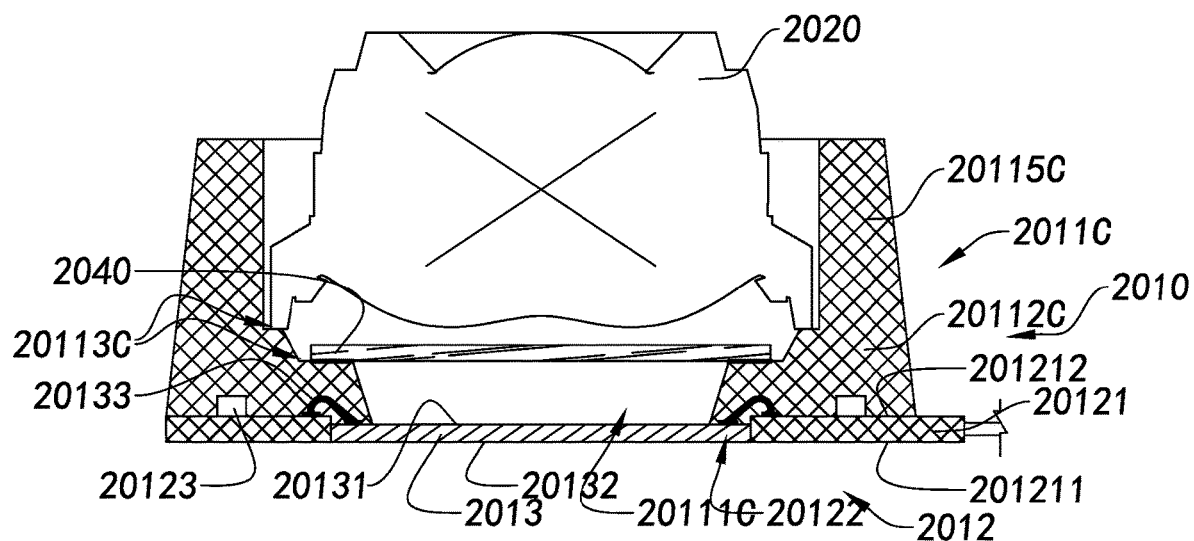
FIG. 38 illustrates a photosensitive component according to a fourteenth preferred embodiment of the present invention.

Referring to FIG. 38, the camera module according to a fourteenth preferred embodiment of the present invention is illustrated. The integral encapsulation base 2011C of the photosensitive component 2010 comprises a lens portion 20115C. At least a part of the lens portion 20115C integrally extends upwardly from the base main body 20112C, so as to be adapted for mounting a lens 2020.

Further, the lens portion 20115C forms another mounting groove 20113C for mounting the lens 2020. In other words, the integral encapsulation base 2011C has two mounting grooves 20113C. One of the mounting grooves 20113C is for mounting the filter 2040, while the other is for mounting the lens 2020, so as to make a prime lens camera module.

It is worth mentioning that the lens portion 20115C is integrally formed for relatively and accurately determining and defining the installation site of the lens 2020. It reduces the installation deviation of the lens 2020 through the spacing of the lens portion 20115C, so as to facilitate the assembling.

An adjustment space is reserved between the lens portion 20115C and the lens 2020, adapted for adjusting the lens 2020 during the assembling process of the lens 2020. Preferably, the inside of the lens portion 20115C is flat and smooth for mounting a threadless lens 2020.

Figure 39:
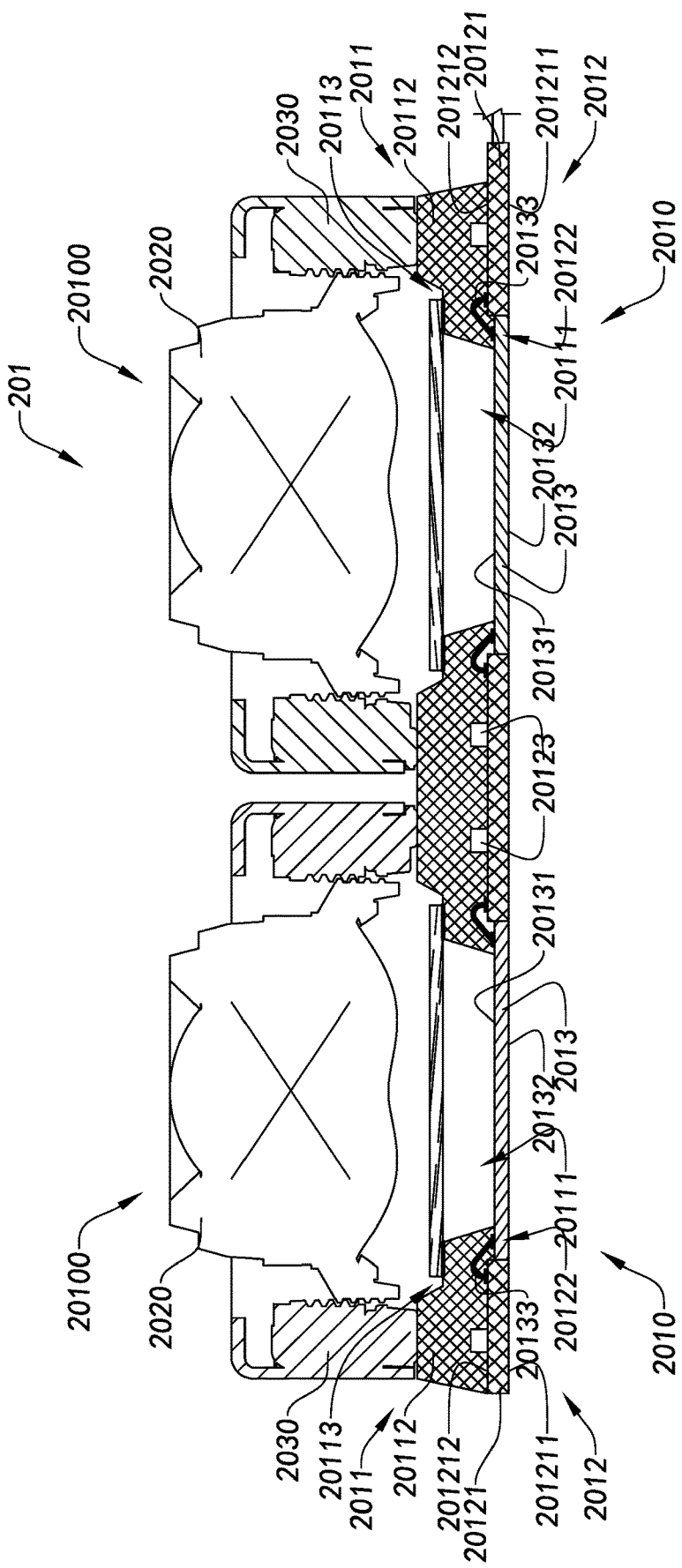
FIG. 39 is a perspective view of the array camera module according to a fifteenth preferred embodiment of the present invention.

Referring to FIG. 39, an array camera module 201 according to a fifteenth preferred embodiment of the present invention is illustrated. The array camera module 201 comprises at least two camera modules 20100 coordinated with each other to conduct image capturing.

It is worth mentioning that according to the present embodiment and the appended drawings, a dual-camera module constructed by two camera modules 20100 as an example for illustration. Nevertheless, according to other embodiments of the present this invention, it may also be constructed by more camera modules 20100, such as three or more. Therefore, the present invention shall not be limited here.

In one implementation, the camera modules 20100 are aligned with each other in series to form the array camera module 201. For instance, the circuit board main bodies 20121 are independent to each other and/or the base main bodies 20112 are independent to each other.

In another implementation, the camera modules 20100 are integrally connected with each other to form the array camera module 201. For instance, the circuit board main bodies 20121 are integrally connected with each other and the base main bodies 20112 are integrally connected with each other as well.

Those skilled in the art should understand that specific quantity or combination manner of the camera module 20100 shall not limit the scope the present invention.

Figure 40:
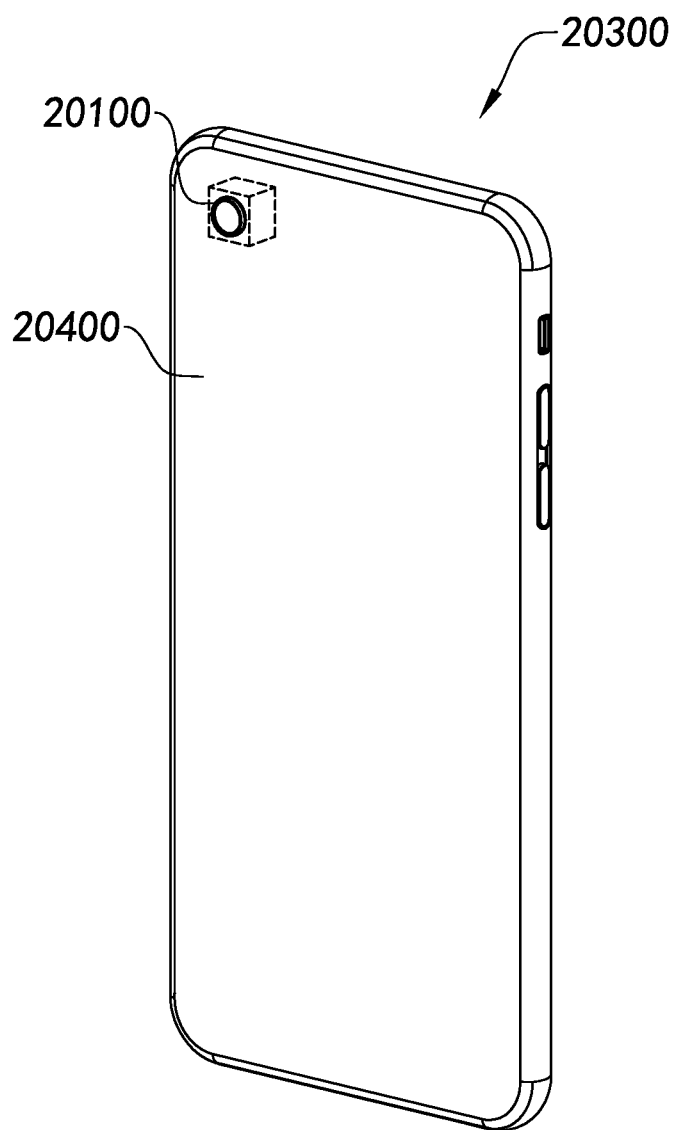
FIG. 40 is an application diagram of a camera module according to the above preferred embodiment of the present invention.

Referring to FIG. 40, the camera module 20100 can be utilized in an electronic device 20300, which is, for example but not limited to a smartphone, a wearable device, computing device, television, vehicle, camera, surveillance device, and etc. The electronic device 20300 may comprise an electronic device main body 20400, wherein the camera module 20100 is installed on the electronic device main body 20400 to coordinately function with the electronic device main body 20400 for image capturing and reproduction.

Figure 41:
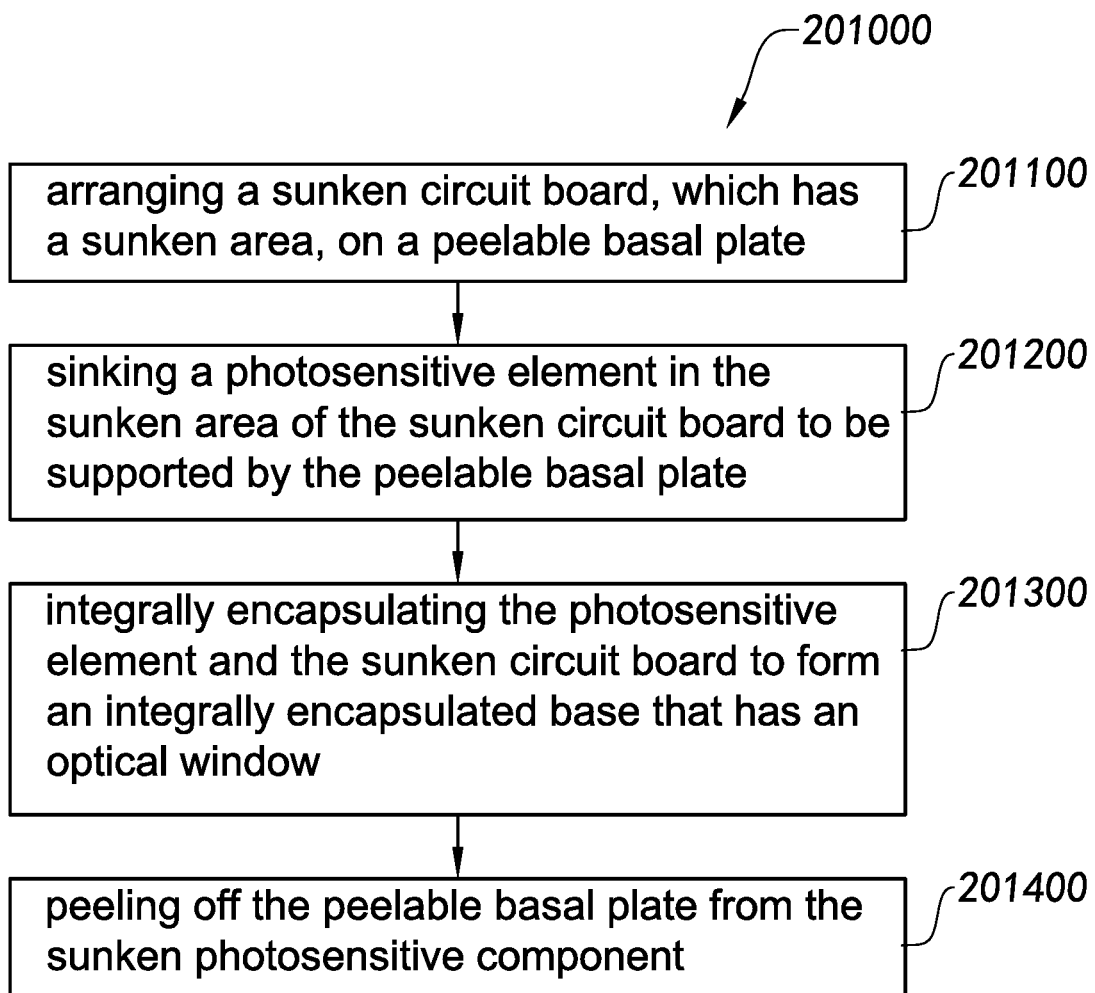
FIG. 41 is a block diagram of a manufacturing method of the photosensitive component according to the above preferred embodiment of the present invention.

Accordingly, referring to FIG. 41, the present invention provides a manufacturing method 201000 of a photosensitive component (sunken photosensitive component) 2010, which comprises the following steps:

201100: arranging a circuit board (sunken circuit board) 2012, which has a disposing area (sunken area) 20122, on a peelable basal plate 20201;

201200: sinking a photosensitive element 2013 in the disposing area (sunken area) 20122 of the circuit board (sunken circuit board) 2012 which is supported by the peelable basal plate 20201;

201300: integrally encapsulating the photosensitive element 2013 and the circuit board (sunken circuit board) 2012 to form an integral encapsulation base 2011 that has an optical window 20111; and

201400: peeling off the peelable basal plate 20201 from the photosensitive component (sunken photosensitive component) 2010.

Here, in the step 201100, the disposing area 20122 can be formed through holing or grooving on a circuit board. The peelable basal plate 20201 can be an adhesive basal plate.

The circuit board 2012 may comprise a circuit board main body 20121 and at least an electronic component 20123, wherein the disposing area 20122 and the electronic components 20123 are arranged on the circuit board main body 20121. The electronic components 20123 can be deployed and arranged on the circuit board main body 20121 before the circuit board main body 20121 is arranged on the peelable basal plate 20201 or after the circuit board main body 20121 is arranged on the peelable basal plate 20201. For example, but not limited to, the electronic components 20123 are arranged and deployed on the circuit board main body 20121 through SMT (Surface Mount Technology).

In one embodiment, in the step 201200, the back side 20132 of the photosensitive element 2013 and the bottom side 201211 of the circuit board main body 20121 are on the same plane.

In another embodiment, in the step 201200, the peelable basal plate 20201 provides at least a supporting prop, wherein the photosensitive element 2013 is supported by the supporting prop, such that the front side 20131 of the photosensitive element 2013 and the top side 201212 of the circuit board main body 20121 are on the same plane.

The step 201200 further comprises a step of: electrically connecting the photosensitive element 2013 and the circuit board main body 20121 through one or more electrical connection elements 20133.

In one implementation, the step 201300 further comprises a step of: covering, enclosing, encapsulating and/or wrapping up the one or more electronic components 20123 and the one or more electrical connection elements 20133 through the integral encapsulation base 2011.

The step 201300 can also comprise: forming a gap 2014 between the photosensitive element 2013 and the circuit board main body 20121 and extending the integral encapsulation base 2011 into the gap 2014.

In addition, the step 201300 can also comprise: forming a gap 2014 between the photosensitive element 2013 and the circuit board main body 20121 and filling up a filling medium 2015 into the gap 2014 to pre-fix the photosensitive element 2013 and the circuit board main body 20121. For example, but not limited to, the filling medium 2015 may be an adhesive.

Alternatively, the step 201300 can comprise: forming a gap 2014 between the photosensitive element 2013 and the circuit board main body 20121 and extending the integration base into the gap 2014 and to cover, enclose, encapsulate and/or wrap up the back side of the photosensitive element 2013.

The step 201300 may also include the following step: providing an interval medium 20114 on the non-photosensitive area 201312 of the photosensitive element 2013 and utilizing the interval medium 20114 as a boundary to form a base main body 20112. Preferably, the interval medium 20114 is a ring-like protruding structure. For example, the interval medium 20114 can be formed through applying an adhesive on the photosensitive element 2013.

The step 201300 can further comprise the following steps:

201301: providing a bottom liner 2011211 on the photosensitive element 2013 in the area without any electrical connection element 20133;

201302: forming a primary packaging base 2011212 with the bottom liner 2011211 as a border to pre-fix the photosensitive element 2013 and the circuit board main body 20121;

201303: forming a packaging and encapsulating base 2011221 at a position where the electrical connection element 20133 of the photosensitive element 2013 is arranged; covering, enclosing, encapsulating and/or wrapping up the one or more electrical connection elements 20133 through the packaging and encapsulating base 2011221; and forming a ring structure 201123 along with the primary packaging base 2011212; and

201304: integrally forming a secondary packaging base based on the ring structure 201123 and forming the optical window.

In the step 201304, forming a mounting groove 20113 by the secondary packaging base 2011222 and the ring structure 201123.

Further, in one implementation, before the step 201300, it may further include a step of: covering a filter 2040 on the photosensitive element 2013.

The step 201300 may also comprise a step of: integrally encapsulating the photosensitive element 2013, the circuit board 2012, and the filter 2040.

In one implementation, the bottom liner 2011211 and the packaging and encapsulating base 2011221 can be formed through applying an adhesive. Certainly, the bottom liner 2011211 and the packaging and encapsulating base 2011221 may also be made of other resilient material.

In the step 201400, the way to peel the peelable basal plate 20201 from the photosensitive component 2010 includes, for example but not limited to, peeling, exposure, hot melting, etching, dissolving, grinding, and etc.

Preferably, the way of integral encapsulation is transfer molding.

Figure 42A:
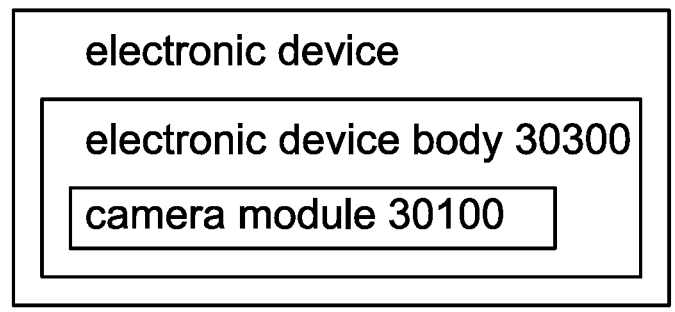
FIG. 42A is a block diagram of an electronic device according to another preferred embodiment of the present invention.
Figure 42B:
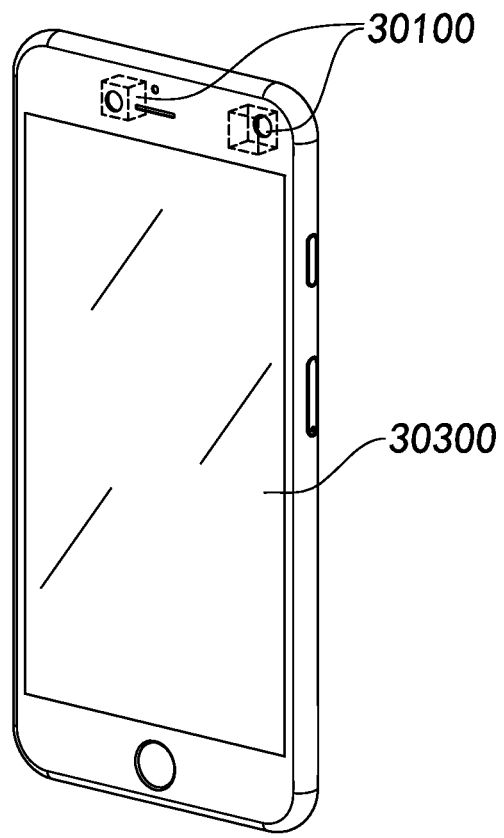
FIG. 42B is a perspective view of the electronic device according to the above preferred embodiment of the present invention.
Figure 43:
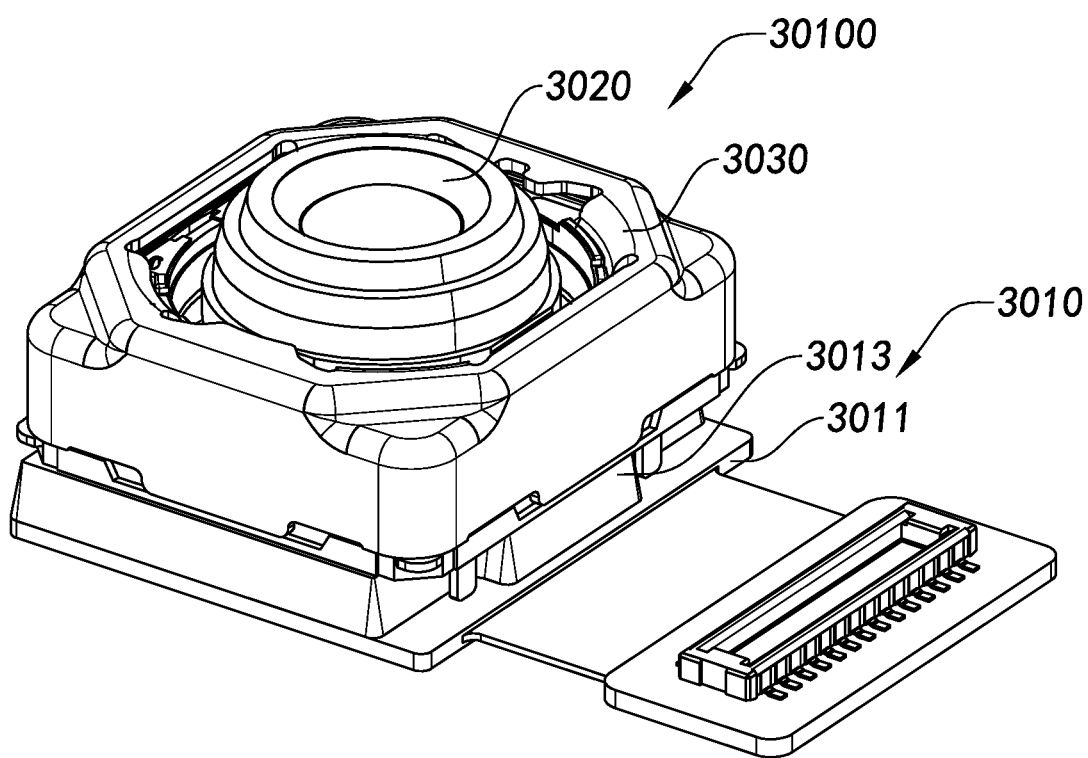
FIG. 43 is a perspective view of a camera module according to another preferred embodiment of the present invention.

Referring to FIGS. 42A-42B of the present invention, the present invention provides an electronic device, which comprises an electronic device body 30300 and at least a camera module 30100, wherein the camera module 30100 is arranged on the electronic device body 30300 for capturing images. For instance, the camera module 30100 can be arranged on a back portion of the electronic device body 30300 so as to form a back type camera module, or the camera module 30100 can be arranged on a front portion of the electronic device body 30300 so as to form a front type camera module.

It is worth mentioning that the electronic device body 30300 can be, for example but not limited to, a smartphone, tablet, camera, security device, television, computing device, wearable device, and etc. The electronic device body 30300 being embodied as a smartphone as illustrated in FIG. 42B is just an example for illustrating and disclosing features and advantages of the present invention, which shall not be considered limits of the content and scope of the present invention.

Referring to FIGS. 43-57B, the following will further illustrate and disclose the camera module 30100 of the present invention. In addition, FIGS. 49A-55 and the following descriptions will further illustrate a formation mould 30200 for implementing the molding technology for the manufacturing processes of the camera module 30100.

Specifically, the camera module 30100 comprises a molded circuit board member 3010 and at least an optics lens 3020. The molded circuit board member 3010 further comprises a circuit board 3011, at least a photosensitive element 3012, and a retaining portion 3013 integrally formed on the circuit board 3011 and the photosensitive element 3012. The optical lens 3020 is retained in a photosensitive path of the photosensitive element 3012, such that light reflected from an object enters the inside of the camera module 30100 via the optical lens 3020 and be received by the photosensitive element 3012 and be photoelectrically converted into image.

It is worth to mention that, in FIGS. 43-57B and in following disclosure, for example, the camera module 30100 merely comprises one photosensitive element 3012 and one optical lens 3020 to illustrate the feature and advantages of the camera module 30100 of the present invention, which should not be considered as limitation of the content and scope of the present invention. In other embodiments of the camera module 30100, the number of the photosensitive element 3012 and the optical lens 3020 can be more than one, for example, two, three, four or more.

The retaining portion 3013 is integrally formed on the photosensitive element 3012 so that the flatness of the photosensitive element 3012 can be maintained by the retaining portion 3013 instead of depending on and limiting by the circuit board 3011. In this manner, not only the flatness of the photosensitive element 3012 is ensured, but the camera module 30100 can select the thinner circuit board 3011, such as a thinner PCB board or rigid-flex circuit board can be selected as the circuit board 3011, so as to reduce the size of the camera module 30100, especially the height of the camera module 30100, adapted for fitting and equipping the thinner and lighter electronic device as demanded. In addition, the camera module 30100 is more especially adapted to be used in front of the electronic device as a front camera module.

In one embodiment of the camera module 30100 of the present invention, the electrically connected photosensitive element 3012 and circuit board 3011 can be indirectly connecting with each other, wherein the photosensitive elements 3012 and the circuit board 3011 are retained in relatively positions through a retaining portion 3013 integrally formed on the circuit board 3011 and the photosensitive element 3012. In this way, during the using of the camera module 30100, even if the circuit board 3011 is deformed under heat, the flatness of the photosensitive element 3012 is not affected. In this manner, the imaging quality of the camera module 30100 is effectively improved and the reliability of the camera module 30100 is ensured.

Figure 44:
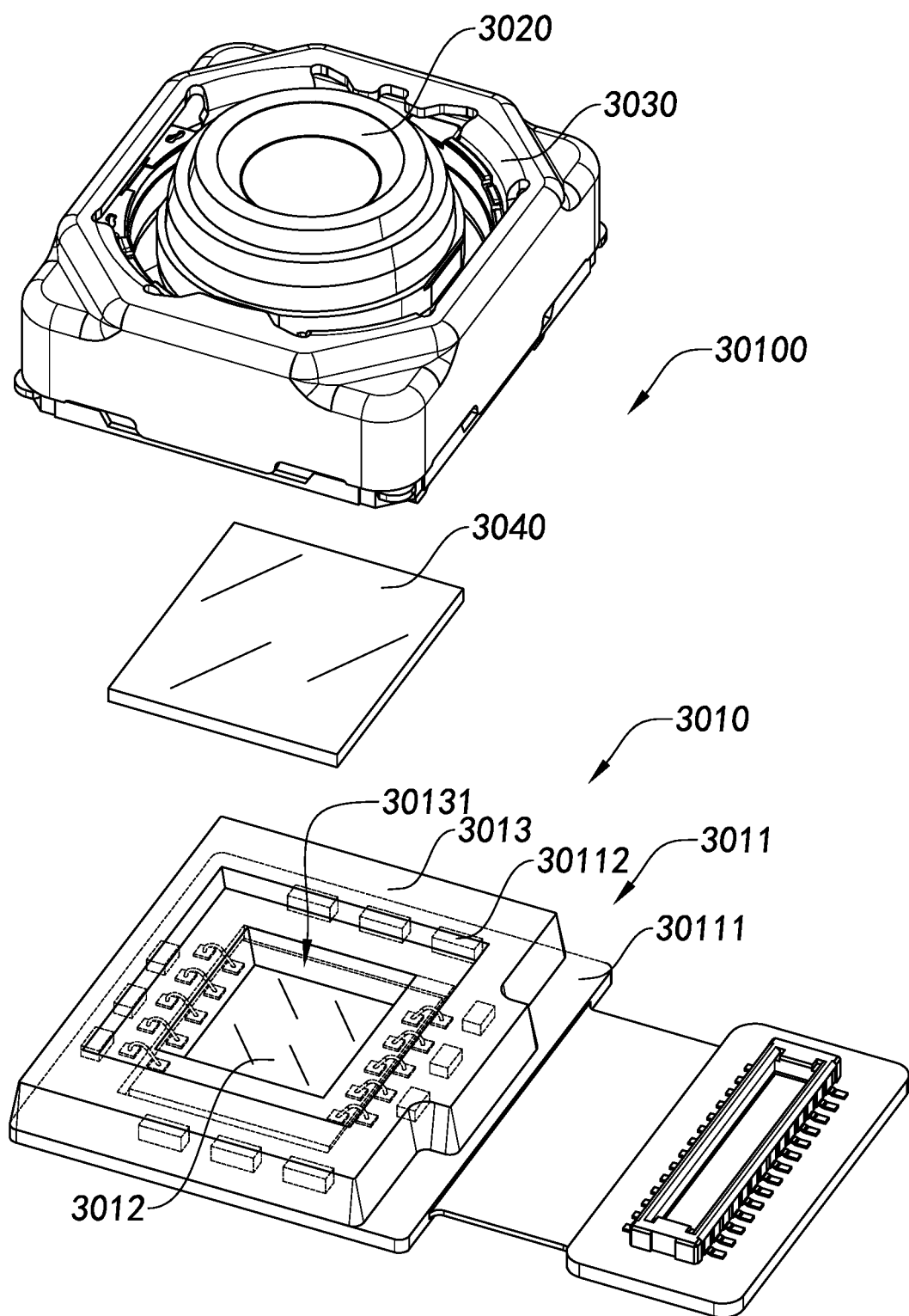
FIG. 44 is an exploded view of the camera module according to the above preferred embodiment of the present invention.
Figure 57A:
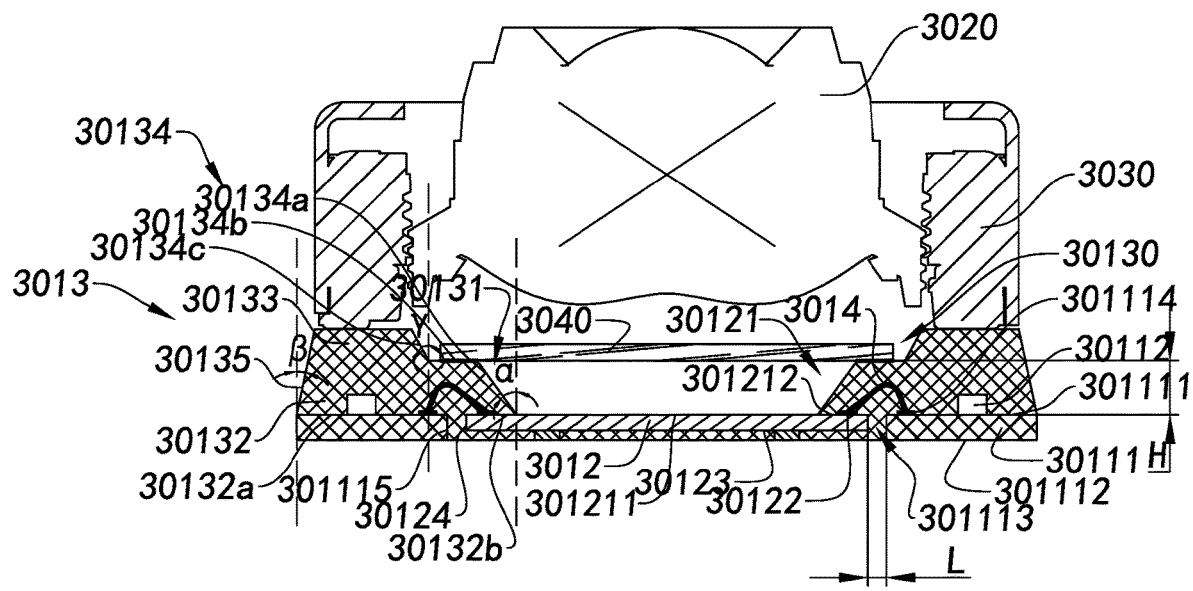
FIG. 57A is a perspective view illustrating a tenth manufacturing step of the manufacturing steps of the camera module according to the above preferred embodiment of the present invention, which demonstrates an implementation of the camera module.
Figure 57B:
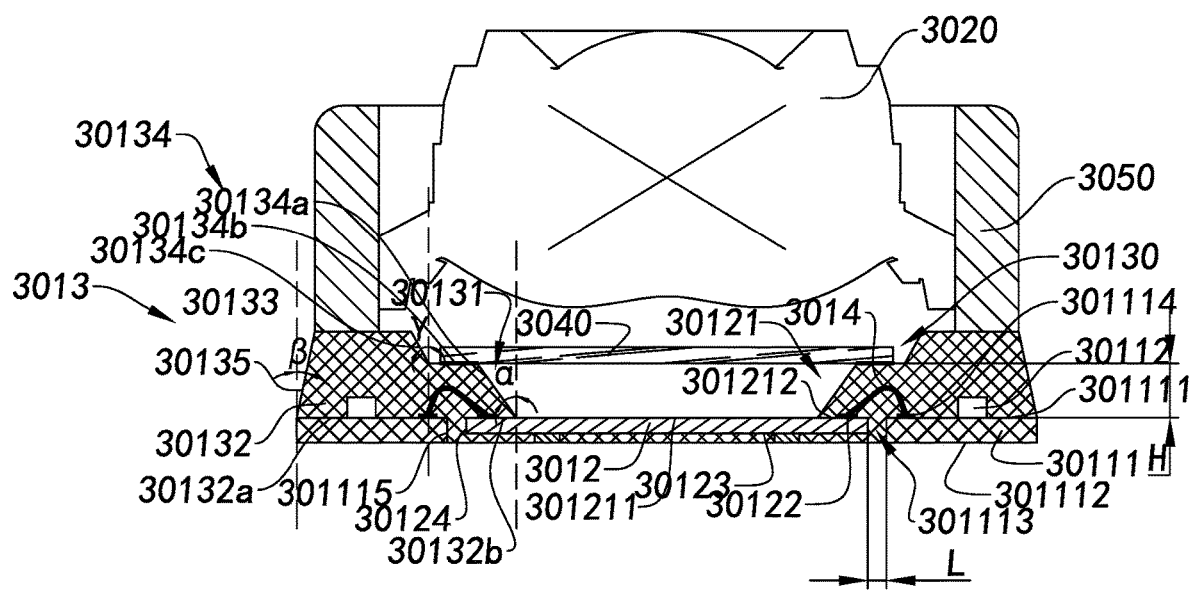
FIG. 57B is a perspective view illustrating a tenth manufacturing step of the manufacturing steps of the camera module according to the above preferred embodiment of the present invention, which demonstrates another implementation of the camera module.

Referring to FIGS. 44, 57A and 57B, the retaining portion 3013 has at least one optical window 30131 defined therein, so that the photosensitive element 3012 and the optical lens 3020 are respectively supported on the outer side of the retaining portion 3013 corresponding to the optical window 30131, so as to communicate the photosensitive element 3012 with the optical lens 3020 through the optical window 30131. That is the optical window 30131 provides a light path for the optical lens 3020 and the photosensitive element 3012 to allow the light entering the inside of the camera module 30100 from the optical lens 3020, after passing through the optical window 30131, being received by the photosensitive element 3012 and photoelectrically converted into images by the photosensitive element 3012. In other words, light reflected from an object enters the camera module 30100 via the optical lens 3020 and passes through the optical window 30131 of the retaining portion 3013 and is received by the photosensitive element 3012 and photoelectrically converted into image. Preferably, the optical window 30131 of the retaining portion 3013 is formed in the middle of the retaining portion 3013, i.e. the optical window 30131 is a through hole in the middle.

The retaining portion 3013 further has a coupling side 30132, an attaching side 30133, an inner surface 30134, and at least an outer surface 30135. When the retaining portion 3013 has only one outer surfaces 30135, the coupling side 30132 and the attaching side 30133 are opposing with each other, and the inner surface 30134 and the outer surface 30135 are opposing with each other as well. Besides, the optical window 30131 is defined by the inner surface 30134. The inner surface 30134 and the outer surface 30135 of the retaining portion 3013 are respectively extended between the coupling side 30132 and the attaching side 30133. In other words, the optical window 30131 of the retaining portion 3013 communicates the coupling side 30132 and the attaching side 30133.

It is worth mentioning that the outer surface 30135 can be a plane surface or a curved surface, which are determined based on the needs.

In other embodiments, the retaining portion 3013 may also have a plurality of outer surfaces 30135 arranged in a step shaped exterior form.

The photosensitive element 3012 is retained at the coupling side 30132 of the retaining portion 3013. For example, the coupling side 30132 of the retaining portion 3013 is integrally coupled with the photosensitive element 3012 so as to retain the photosensitive element 3012 in position by the retaining portion 3013. The optical lens 3020 is retained at the attaching side 30133, such that the photosensitive element 3012 and the optical lens 3020 are optically opposing with each other on the two sides of the retaining portion 3013 respectively.

Preferably, at least a part of the inner surface 30134 of the retaining portion 3013 is extended in an inclining and sloping manner between the coupling side 30132 and the attaching side 30133. More preferably, the outer surface 30135 of the retaining portion 3013 is also extended in an inclining and sloping manner between the coupling side 30132 and the attaching side 30133. It is worth mentioning that the attaching side 30133 of the retaining portion 3013 has a plane parallel to the photosensitive element 3012.

The coupling side 30132 of the retaining portion 3013 is integrally coupled with the circuit board 3011 and the photosensitive element 3012, so as to form and make the molded circuit board member 3010. One skilled in the art should understand that because at least a part of the inner surface 30134 is extended between the coupling side 30132 and the attaching side 30133 in an inclining and sloping manner, the size of the opening of the optical window 30131 on the coupling side 30132 is smaller than the size of the opening of the optical window 30131 on the attaching side 30133.

The camera module 30100 of the present invention can be embodied as an automatic focus camera module. Referring to FIG. 57A, the camera module 30100 further comprises at least an actuator 3030, which can be embodied as, for example, a voice coil motor, a piezoelectricity motor, and etc. The optical lens 3020 is drivably arranged on the actuator 3030. The actuator 3030 is assembled on the attaching side 30133 of the retaining portion 3013, so that the optical lens 3020 is retained on the attaching side 30133 of the retaining portion 3013 and position in the photosensitive path of the photosensitive element 3012 through the actuator 3030. In other words, the retaining portion 3013 is adapted for supporting the driver 3030.

The camera module 30100 of the present invention may also be embodied as a prime lens camera module. For example, the optical lens 3020 may also be directly mounted on the attaching side 30133 of the retaining portion 3013, so as to retain the optical lens 3020 in the photosensitive path of the photosensitive element 3012. Referring to FIG. 16B, the optical lens 3020 may also be mounted on a lens holder 3050 mounted on the attaching side 30133 of the retaining portion 3013, such that the optical lens 3020 is retained on the attaching side 30133 of the retaining portion 3013 and positioned in the photosensitive path of the photosensitive element 3012 through the lens holder 3050. Therefore, person skilled in the art should understand that the camera module 30100 being embodied as an automatic focus camera module as illustrated in FIGS. 43-57A is just an example to illustrate a possible implementation of the present invention, which shall not limit the content and scope of the camera module 30100 of the present invention.

In addition, further referring to FIGS. 57A and 57B, the camera module 30100 can comprise at least a filter 3040 attached on the retaining portion 3013, so that the filter 3040 is retained between the optical lens 3020 and the photosensitive element 3012 through the retaining portion 3013 for filtering the light entering into the camera module 30100 through the optical lens 3020. The filter 3040 can be, for example but not limited to, an infrared-cut filter.

Further, referring to FIGS. 45A-45D, the coupling side 30132 of the retaining portion 3013 has an outer coupling surface 30132*a* and an inner coupling surface 30132*b*. The outer coupling surface 30132*a* and the inner coupling surface 30132*b* of the coupling side 30132 are integrally formed when the retaining portion 3013 is formed. The circuit board 3011 is integrally bonded with at least a part of the outer coupling surface 30132*a* of the retaining portion 3013 and the photosensitive element 3012 is integrally bonded with at least a part of the inner coupling surface 30132*b* of the retaining portion 3013, such that the molded circuit board member 3010 is formed.

It is worth mentioning that the plane formed by the outer coupling surface 30132a of the coupling side 30132 of the retaining portion 3013 and the plane formed by the inner coupling surface 30132b can be on the same horizontal plane or having a height difference, wherein the camera module 30100 of the present invention shall not be limited here.

Furthermore, referring to FIGS. 45A-45D, the inner surface 30134 of the retaining portion 3013 has a first inner surface 30134a, a second inner surface 30134b, and a third inner surface 30134c, wherein the first inner surface 30134a is formed on the coupling side 30132, the third inner surface 30134c is formed on the attaching side 30133, and the second inner surface 30134b is formed between the first inner surface 30134a and the third inner surface 30134c. The first inner surface 30134a extends from the coupling side 30132 toward the attaching side 30133 in an inclining and sloping manner. The plane formed by the second inner surface 30134b is parallel to the photosensitive element 3012. The plane formed by the third inner surface 30134c is either perpendicular to or having an included angle with the plane formed by the second inner surface 30134b. That is, the third inner surface 30134c extends from the attaching side 30133 toward the coupling side 30132 in an inclining and sloping manner. Preferably, the third inner surface 30134c extends from the attaching side 30133 toward the coupling side 30132 in an inclining and sloping manner. The filter 3040 is attached on the second inner surface 30134b of the retaining portion 3013 for retaining the filter 3040 and the photosensitive element in horizontal manner.

It is understandable that there is a height difference between the second inner surface 30134b of the retaining portion 3013 and the attaching surface 301331 of the attaching side 30133 of the retaining portion 3013 and the plane formed by the second inner surface 30134b is lower than the plane formed by the attaching surface 301331 of the attaching side 30133 of the retaining portion 3013, such that an attaching groove 30130 is formed in the retaining portion 3013. Then the filter 3040 mounted and attached on the second inner surface 30134b is accommodated and retained in the attaching groove 30130, such that the height of the camera module 30100 can be further decreased.

According to the present invention, a first included angle α is formed and defined between the first inner surface 30134a of the retaining portion 3013 and the photosensitive axis of the photosensitive element 3012, wherein the first included angle α is a sharp angle. The third inner surface 30134c of the retaining portion 3013 and the photosensitive axis of the photosensitive element 3012 form and define a third included angle γ therebetween, which is a sharp angle. Accordingly, the friction generated between the formation mould 30200 and the inner surface 30134 of the retaining portion 3013 can be reduced when the formation mould 30200 is utilized to mold and produce the molded circuit board member 3010 of the camera module 30100, and that the horizontal of the second inner surface 30134a is ensured, so as to increase the product yield rate of the camera module 30100 and enhance the image quality of the camera module.

The value range of the first included angle α is 1°~85°. In other words, the minimum tolerable value of the first included angle α is 1° and the maximum is 85°. Preferably, the value range of the first included angle α is 35°~75°. According to some specific embodiments of the camera module 30100 of the present invention, the range of the first included angle α is selected from the group consisting of 5°~10°, 10°~15°, 15°~20°, 20°~25°, 25°~30°, 30°~35°, 35°~40°, 40°~45°, 45°~50°, 50°~55°, 55°~60°, 60°~65°, 65°~70°, 70°~75°, 75°~80°, and 80°~85°. Certainly, the value range of the first included angle α can also be 3°~5° or 85°~90°.

The value range of the third included angle γ is 1°~60°. In other words, the minimum tolerable value of the third included angle γ is 1° and the maximum tolerable value of the third included angle γ is 60°. According to some specific embodiments of the camera module 30100 of the present invention, it may be 3°~5°, 5°~10°, 10°~15°, 15°~20°, 20°~25°, 25°~30°, and etc. Certainly, the value range of the third included angle γ can also be 30°~35°, 35°~40°, 40°~45°, and etc.

Besides, the outer surface 30135 of the retaining portion 3013 and the photosensitive axis of the photosensitive element 3012 can also form and define a second included angle β, which is a sharp angle, therebetween. In this manner, the friction generated between the formation mould 30200 and the outer surface 30135 of the retaining portion 3013 can be reduced so as to facilitate the drafting and demolding when utilizing the formation mould 30200 to mold and produce the molded circuit board member 3010 of the camera module 30100.

The value range of the second included angle β is 1°~65°. In other words, the minimum tolerable value of the second included angle β is 1° and the maximum is 65°. According to some specific embodiments of the present invention, the range of the second included angle β can be selected from the group consisting of 3°~5°, 5°~10°, 10°~15°, 15°~20°, 20°~25°, 25°~30°, 30°~35°, 35°~40°, 40°~45°, and etc. Certainly, the value range of the second included angle β can also be 45°~50°, 50°~55° or 55°~60°.

The circuit board 3011 comprises a basal plate 30111 and one or more electronic components 30112. The electronic components 30112 can be embedded in the basal plate 30111 or be attached on the surface of the basal plate 30111. For instance, the electronic components 30112 can be mounted on the surface of the basal plate 30111 through surface mount technology (SMT). Preferably, in the camera module 30100 of the present invention, the electronic components 30112 are attached on the surface of the basal plate 30111. Therefore, when the retaining portion 3013 is integrally formed on the basal plate 30111 of the circuit board 3011, the retaining portion 3013 can package, cover, enclose, and embed at least one of the electronic components 30112, so as to prevent pollutants, such as dusts and etc., attached on the electronic components 30112 from polluting the photosensitive element 3012 subsequently, which, therefore, improves the image quality of the camera module 30100.

Preferably, the retaining portion 3013 packages, covers, encloses, and embeds each of the electronic components 30112. In this manner, first, the retaining portion 3013 can isolate each of the electronic components 30112 with the adjacent electronic component 30112, so as to avoid the adjacent electronic components 30112 from interfering each other. Second, the retaining portion 3013 can also prevent the electronic components 30112 from contacting the air and being oxidized. Third, it does not have to reserve safe distance between the retaining portion 3013 and the electronic components 30112 anymore, such that the structure of the camera module 30100 becomes more compact, which can reduce the size of the camera module 30100, especially the size in height of the camera module 30100 and make the camera module 30100 be particularly suitable for being utilized in the electronic devices that are expected to be more light in weight, thin in thickness and compact in size. In addition, the manner that the electronic components 30112 are embedded in the retaining portion 3013 can prevent the retaining portion 3013 from detaching from the basal plate 30111 of the circuit board 3011, so as to ensure the reliability and rigidity of the camera module 30100.

It is worth mentioning that the type of the electronic components 30112 is not limited in the camera module 30100 of the present invention. For instance, the electronic component 30112 can be resistor, capacitor, actuator, processor, electric relay, storage, switch, and etc.

The basal plate 30111 has a basal plate upper surface 301111 and a basal plate lower surface 301112, wherein the basal plate upper surface 301111 and the basal plate lower surface 301112 are corresponding to each other to define and determine the thickness of the basal plate 30111. The electronic components 30112 are mounted on the basal plate upper surface 301111 of the basal plate 30111. The retaining portion 3013 is integrally formed on the basal plate upper surface 301111 of the basal plate 30111, so as to package, cover, enclose, and embed each of the electronic components 30112. Certainly, in other embodiments of the present invention, the electronic components 30112 can also be internally arranged on the lower surface of the basal plate 30111. Therefore, person skilled in the art should understand that the type and disposing position of the electronic components 30112 shall not limit the scope of the present invention.

Besides, the basal plate 30111 further has at least an accommodating space 301113, arranged on the middle portion thereof, wherein the accommodating space 301113 is extended from the basal plate upper surface 301111 toward the basal plate lower surface 301112. According to this embodiment of the camera module 30100 of the present invention, the photosensitive element 3012 is accommodated and received in the accommodating space 301113 of the basal plate 30111, so as to reduce the height difference between the chip upper surface 30121 of the photosensitive element 3012 and the basal plate upper surface 301111 of the basal plate 30111 or even allow the chip upper surface 30121 of the photosensitive element 3012 to be level with or lower than the basal plate upper surface 301111 of the basal plate 30111, such that the camera module 30100 can have a longer zooming space for the back focal length of the lens.

Figure 58:
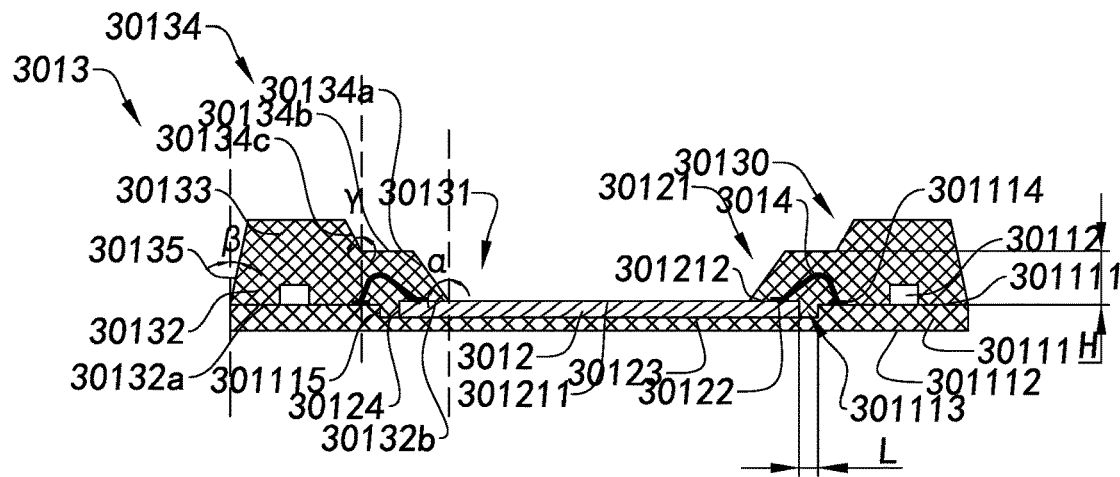
FIG. 58 illustrates an alternative mode of the molded circuit board member of the camera module according to the above preferred embodiment of the present invention.

Referring to FIGS. 57A and 57B, the accommodating space 301113 of the basal plate 30111 can also be embodied as a through hole. In other words, the accommodating space 301113 communicates the basal plate upper surface 301111 and the basal plate lower surface 301112 of the basal plate 30111. Moreover, according to an alternative mode of the camera module 30100, as illustrated in FIG. 58, the accommodating space 301113 of the basal plate 30111 can also be embodied as an accommodating groove. In other words, the accommodating space 301113 has only one opening formed on the basal plate upper surface 301111 of the basal plate 30111.

The photosensitive element 3012 has a photosensitive area 301211 and a non-photosensitive area 301212 arranged on the chip upper surface 30121 thereof, wherein the photosensitive area 301211 is positioned in a central portion of the chip upper surface 30121, while the non-photosensitive area 301212 is positioned surrounding the photosensitive area 301211. The retaining portion 3013 and the non-photosensitive area 301212 of the photosensitive element 3012 are integrally bonded and coupled, so as to have the photosensitive area 301211 of the photosensitive element 3012 optically corresponding to the optical lens 3020 through the optical window 30131 of the retaining portion 3013. Hence, after the light that entered into the camera module 30100 through the optical lens 3020 passes through the filter 3040 and the optical window 30131 of the retaining portion 3013, the light is received by the photosensitive area 301211 of the photosensitive element 3012 to be photoelectrically converted to image.

The basal plate 30111 of the circuit board 3011 and the photosensitive element 3012 are electrically connected. Specifically speaking, the basal plate 30111 comprises a set of basal plate connectors 301114. The basal plate connectors 301114 are respectively and spacingly arranged on or formed on the basal plate upper surface 301111. Correspondingly, a set of spacingly arranged chip connectors 30122 is arranged on or formed on the non-photosensitive area of the photosensitive element 3012. The molded circuit board member 3010 further comprises a set of lead elements 3014 extended between the basal plate connectors 301114 of the basal plate 30111 and the chip connectors 30122 of the photosensitive element 3012, so as to electrically connect the photosensitive element 3012 with the circuit board 3011.

It is worth mentioning that the lead element 3014 can be, but not limited to, gold wire, silver wire, copper wire, aluminum wire, and etc.

It is also worth mentioning that the basal plate connector 301114 of the basal plate 30111 and the chip connector 30122 of the photosensitive element 3012 can be, for example but not limited to, cubic, spherical, disc-shaped, and etc.

Figure 45A:
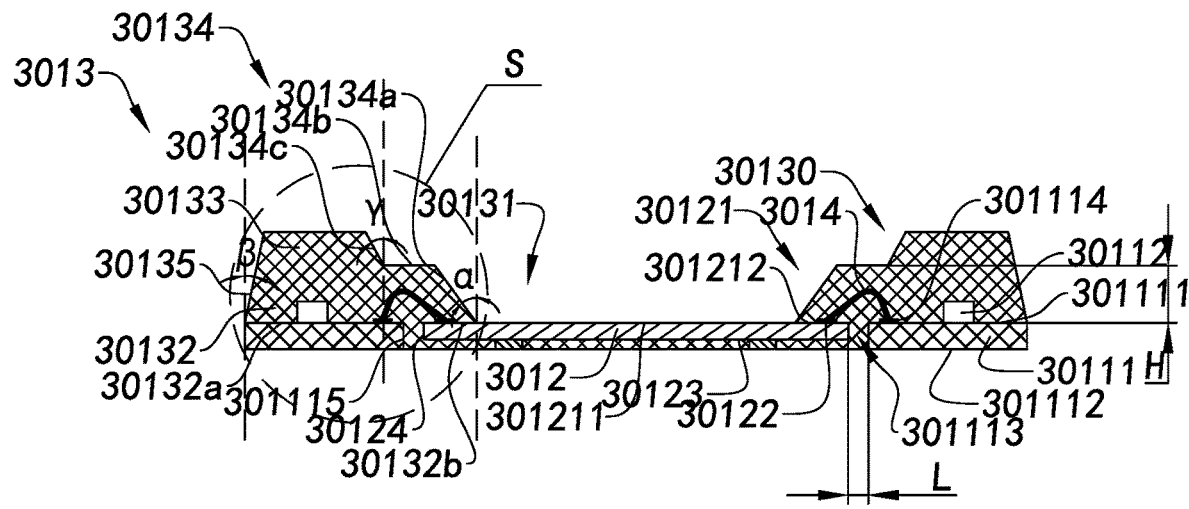
FIG. 45A is a sectional view of a molded circuit board member of the camera module according to the above preferred embodiment of the present invention, illustrating a wiring direction of a lead element for electrically connecting a circuit board and a photosensitive element of the molded circuit board member from the circuit board to the photosensitive element.
Figure 45B:
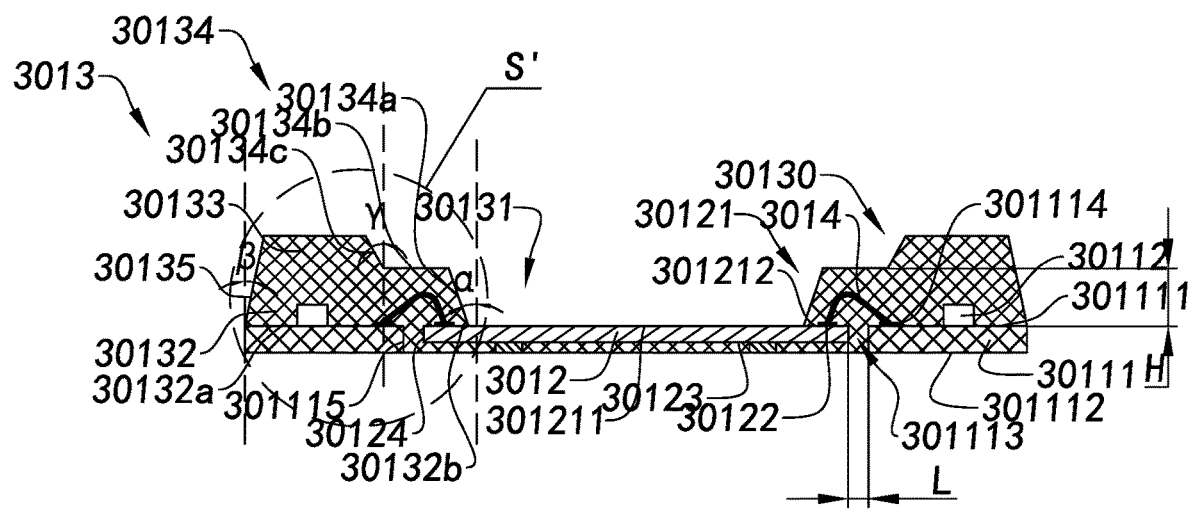
FIG. 45B is a sectional view of the molded circuit board member of the camera module according to the above preferred embodiment of the present invention, illustrating the wiring direction of the lead elements for electrically connecting the circuit board and the photosensitive element of the molded circuit board member from the photosensitive element to the circuit board.
Figure 45C:
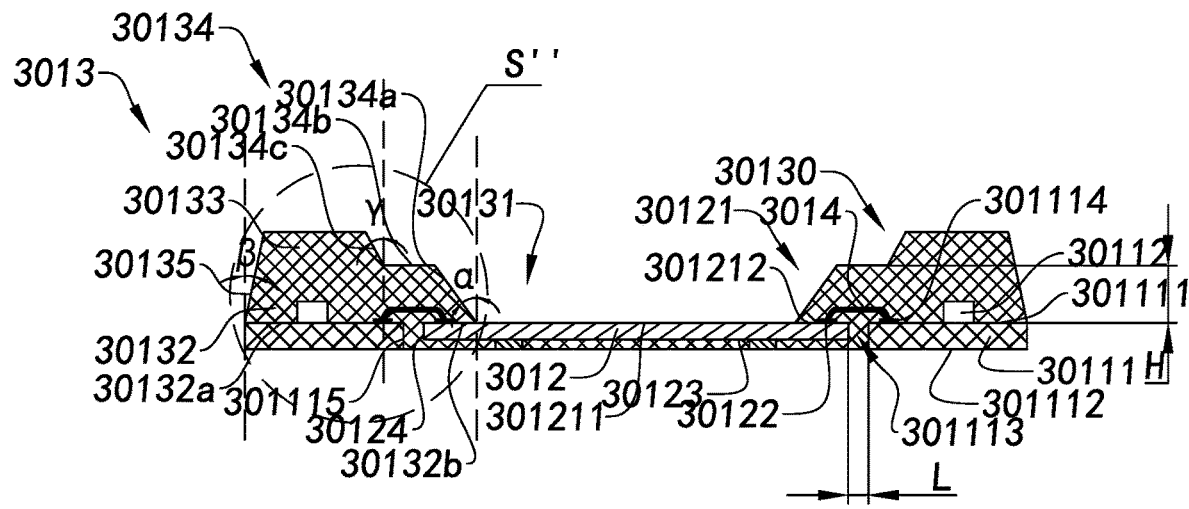
FIG. 45C is a sectional view of the molded circuit board member of the camera module according to the above preferred embodiment of the present invention, illustrating that the lead elements for electrically connecting the circuit board and the photosensitive element of the molded circuit board member formed between the photosensitive element and the circuit board through HiraUchi technology.
Figure 45D:
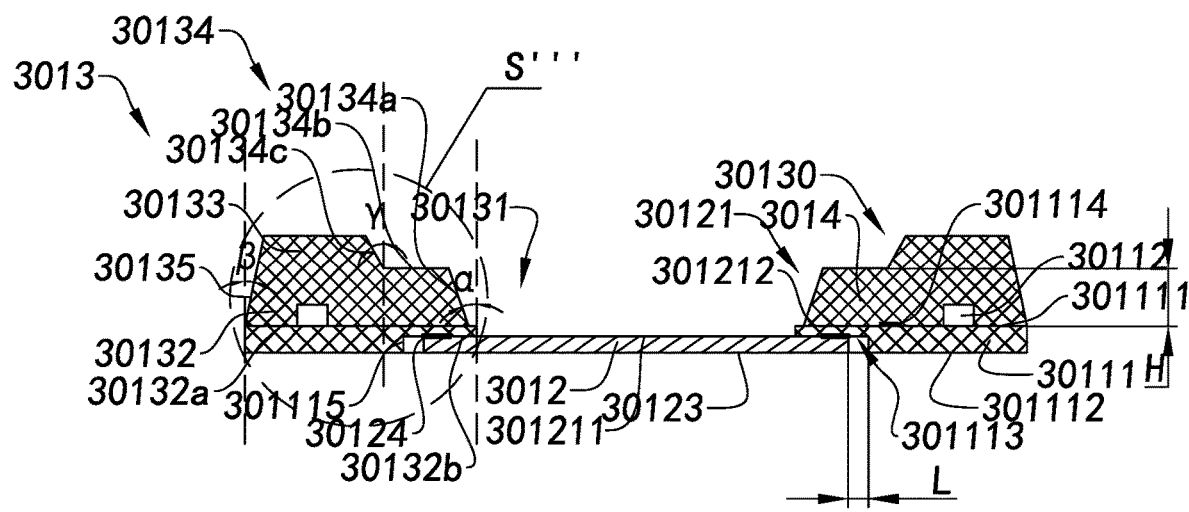
FIG. 45D is a sectional view of the molded circuit board member of the camera module according to the above preferred embodiment of the present invention, illustrating the photosensitive element being electrically connected with the circuit board through the flip chip (FC) technology.
Figure 46A:
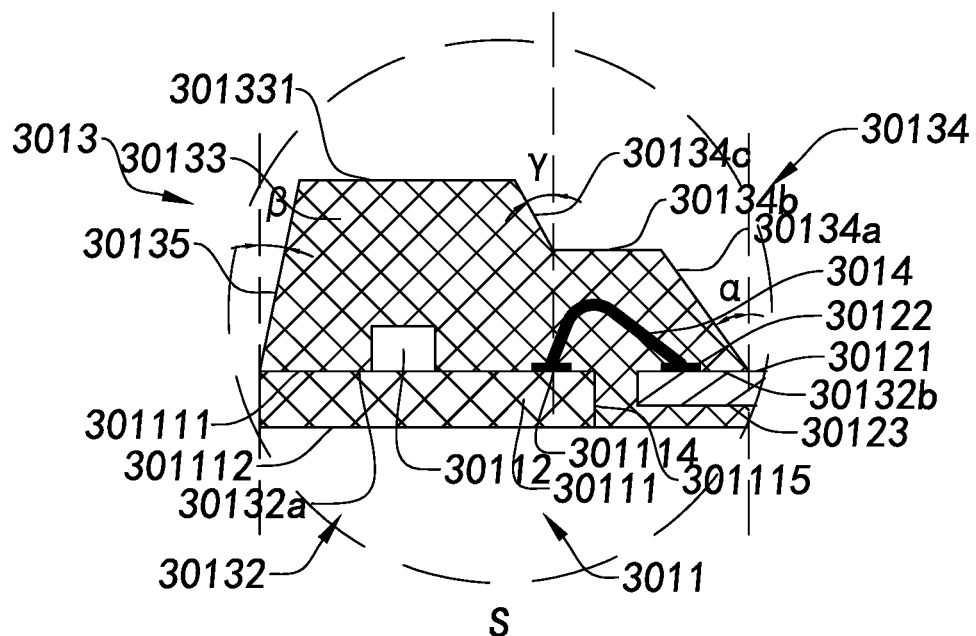
FIG. 46A is an enlarged view of the S position of FIG. 45A.
Figure 46B:
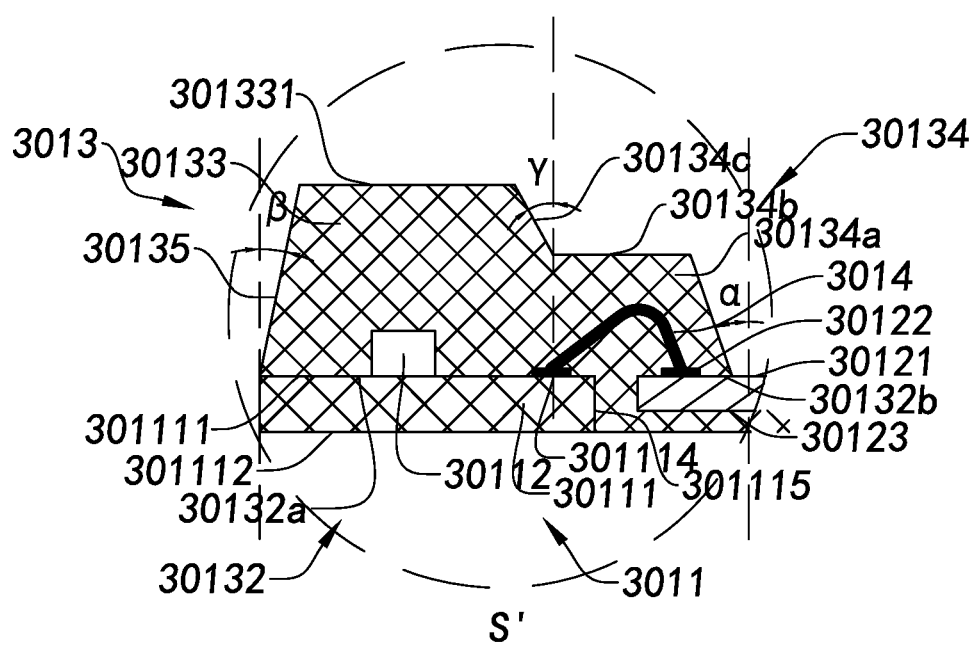
FIG. 46B is an enlarged view of the S' position of FIG. 45B.
Figure 46C:
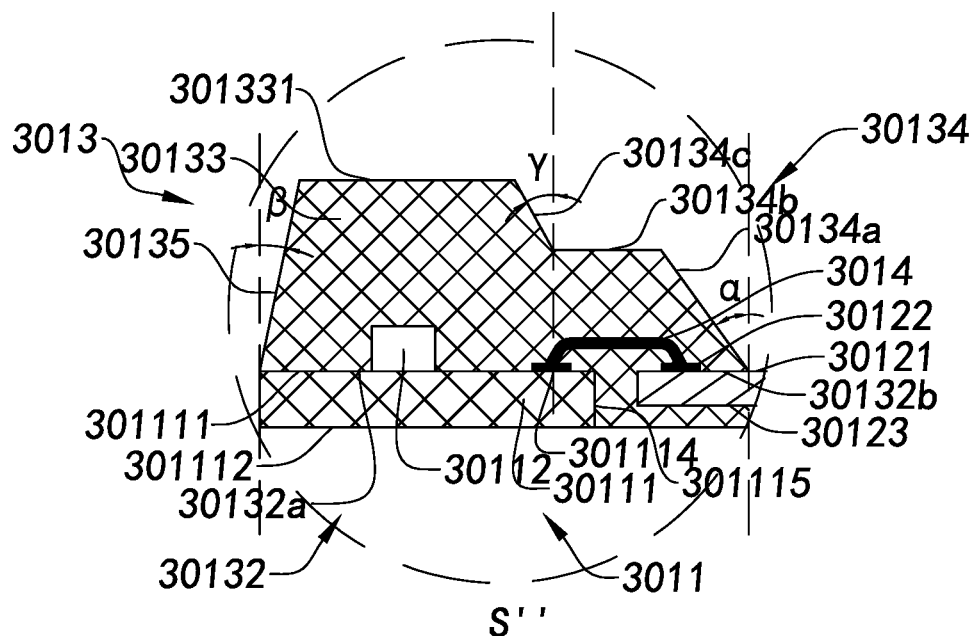
FIG. 46C is an enlarged view of the S" position of FIG. 45C.
Figure 46D:
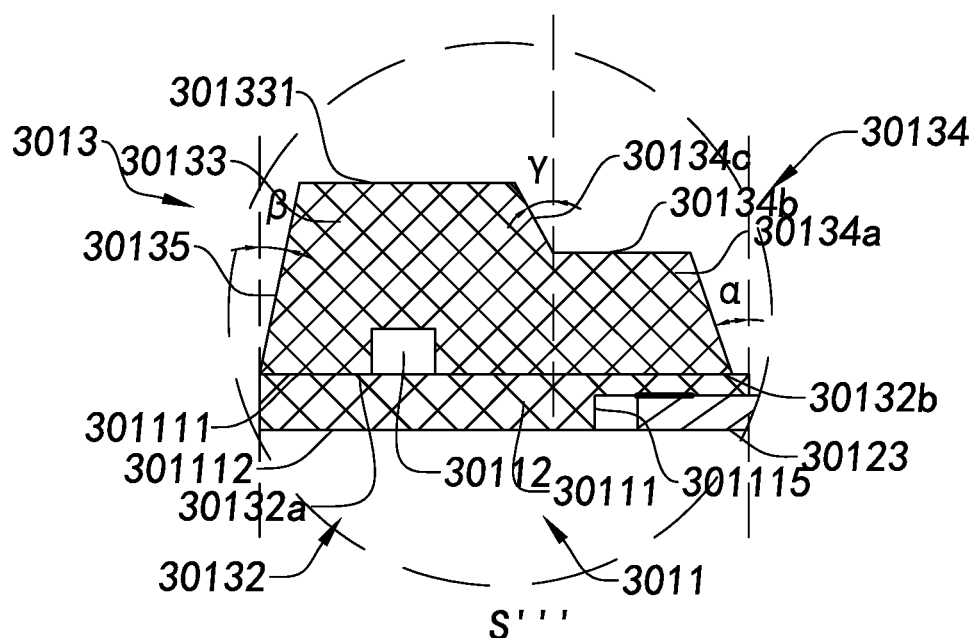
FIG. 46D is an enlarged view of the S'" position of FIG. 45D.

The wiring direction of the lead element 3014 shall not be limited in the camera module 30100 of the present invention. For instance, according to the camera module 30100 as illustrated in FIG. 45A, the wiring direction of the lead elements 3014 is from the basal plate 30111 of the circuit board 3011 to the photosensitive element 3012. Nevertheless, according to the camera module 30100 as illustrated in FIG. 45B, the wiring direction of the lead elements 3014 is from the photosensitive element 3012 to the basal plate 30111 of the circuit board 3011. Referring to FIG. 45C, the lead elements 3014 can be formed and provided between the basal plate 30111 of the circuit board 3011 and the photosensitive element 3012 through HiraUchi technology. Referring to FIG. 45D, instead of having the lead element 3014, the photosensitive element 3012 is attached on the basal plate 30111 of the circuit board 3011 through the flip chip (FC) technology. By the time the photosensitive element 3012 is attached on the circuit board 3011, the photosensitive element 3012 and the circuit board 3011 are electrically connected.

One skilled in the art should be able to understand that the wiring direction of the lead elements 3014 may affect the angle of tilt of the inner surface 30134 of the retaining portion 3013. For example, when the wiring direction of the lead elements 3014 is from the basal plate 30111 of the circuit board 3011 to the photosensitive element, the value of the first included angle α formed and defined between the first inner surface 30134a of the retaining portion 3013 and the photosensitive axis of the photosensitive element 3012 is larger. On the other hand, when the wiring direction of the lead elements 3014 is from the photosensitive element 3012 to the basal plate 30111 of the circuit board 3011, the value of the first included angle α formed and defined between the first inner surface 30134a of the retaining portion 3013 and the photosensitive axis of the photosensitive element 3012 is smaller. According to the embodiment that the lead elements 3014 are formed on the basal plate 30111 of the circuit board 3011 and the photosensitive element 3012 through HiraUchi technology, the value of the first included angle α formed and defined between the first inner surface 30134a of the retaining portion 3013 and the photosensitive axis of the photosensitive element 3012 is larger. According to the embodiment that the photosensitive element 3012 is directly attached on the basal plate 30111 of the circuit board 3011 through flip chip technology, the value of the first included angle α formed and defined between the first inner surface 30134a of the retaining portion 3013 and the photosensitive axis of the photosensitive element 3012 is larger. It will further be illustrated and disclosed in the following description of the present invention.

Referring to FIGS. 49A-56, the formation mould 30200 comprises an upper mold 30201 and a lower mold 30202, wherein at least either of the upper mold 30201 or the lower mold 30202 can be operated to open or to close the upper mold 30201 and the lower mold 30202, so as to conduct the mold clamping and the drafting processes of the formation mould 30200. When the upper mold 30201 and the lower mold 30202 are clamped or closed, at least a molding space 30203 is formed and defined between the upper mold 30201 and the lower mold 30202 for molding and producing the molded circuit board member 3010.

When molding the molded circuit board member 3010, the circuit board 3011 and the photosensitive element 3012 that are electrically connected with each other are placed in the molding space 30203. Then the fluid molding material 30400 is added into the molding space 30203, so as to have the molding material 30400 covers a part of the basal plate upper surface 301111 of the circuit board 3011 and at least a part of the non-photosensitive area 301212 of the photosensitive element 3012. Therefore, after the molding material 30400 is solidified in the molding space 30203, it forms and becomes the retaining portion 3013 that is integrally bonded with the circuit board 3011 and the photosensitive element 3012.

It is worth mentioning that the molding material 30400 can be liquid, solid particles or mixture of liquid and solid particles. The molding material 30400 can be thermoplastic material or thermosetting material. The molding material 30400 can be solidified in the molding space 30203 through heating or cooling, so as to form the retaining portion 3013 that is integrally formed on the photosensitive element 3012 and the circuit board 3011.

More specifically, the upper mold 30201 comprises at least an optical window molding member 302011 and a surrounding member 302012, wherein the surrounding member 302012 is integrally formed around the optical window molding member 302011 and has a ring-like forming guide groove 3020121, such that when the upper mold 30201 and the lower mold 30202 are operated to be closed and clamped, the forming guide groove 3020121 of the upper mold 30201 forms part of the molding space 30203.

In addition, the optical window molding member 302011 has a groove 3020111 provided in the central portion thereof. The direction of the opening of the groove 3020111 and the direction of the opening of the forming guide groove 3020121 are the same. During the molding process, the photosensitive area 301211 of the photosensitive element 3012 is arranged corresponding to the groove 3020111 of the optical window molding member 302011, so as to avoid the pressing surface of the optical window molding member 302011 from scraping and damaging the photosensitive area 301211 of the photosensitive element 3012, such that the photosensitive element 3012 can be protected during the molding process.

FIGS. 47-56 illustrate a process of manufacturing the camera module 30100.

Figure 47:
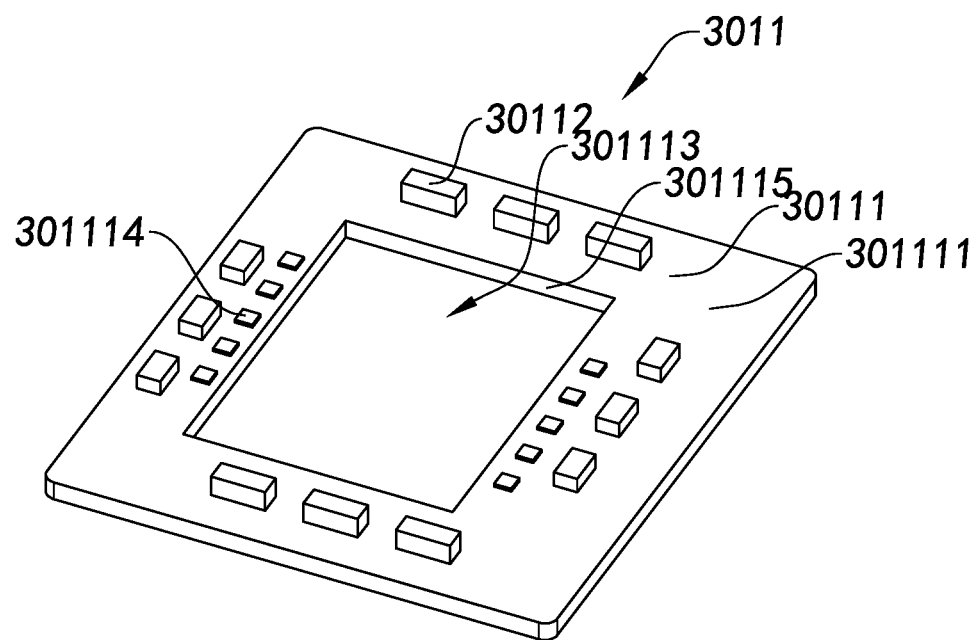
FIG. 47 is a perspective view illustrating a first step of the manufacturing steps of the camera module according to the above preferred embodiment of the present invention.

Referring to FIG. 47, the electronic components 30112 can be spacingly and intervally attached on the basal plate upper surface 301111 of the basal plate 30111. Preferably, each of the electronic components 30112 can be mounted on the surface of the basal plate upper surface 301111 of the basal plate 30111 through SMT.

Figure 48:
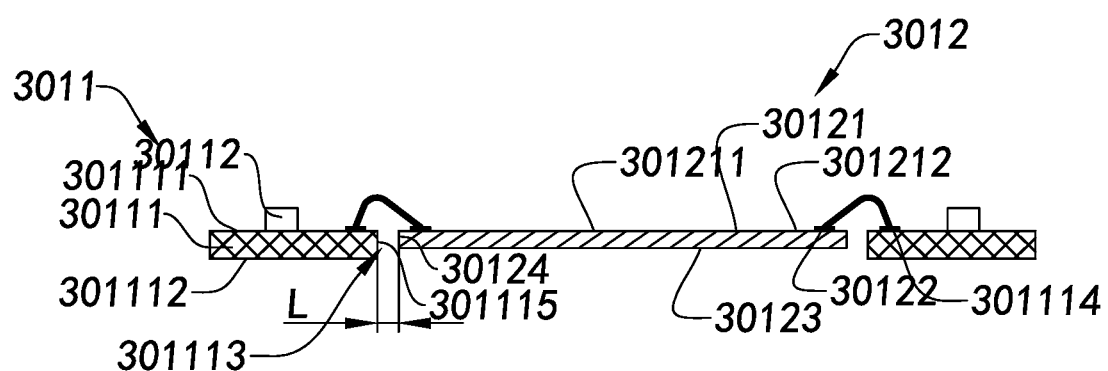
FIG. 48 is a perspective view illustrating a second step of the manufacturing steps of the camera module according to the above preferred embodiment of the present invention.

Referring to FIG. 48, the photosensitive element 3012 is retained in the accommodating space 301113 of the basal plate 30111 and the lead elements 3014 are arranged and deployed between the basal plate connectors 301114 of the basal plate 30111 and the chip connectors 30122 of the photosensitive element 3012 through wire bonding process, so as to electrically connect the photosensitive element 3012 with the circuit board 3011 through the lead elements 3014.

It is worth mentioning that the wiring manner of the lead element 3014 can also be determined according to the needs. For example, the wiring direction of the lead element 3014 can be from the photosensitive element 3012 to the basal plate 30111 of the circuit board 3011 or from the basal plate 30111 of the circuit board 3011 to the photosensitive element 3012. The lead elements 3014 may also be utilized in other means to electrically connect the photosensitive element 3012 and the basal plate 30111 of the circuit board 3011.

One skilled in the art should be able to understand that the height and gradient of the lead elements 3014 on a side of the photosensitive element 3012 can affect the gradient of the first inner surface 30134a of the retaining portion 3013, so that the lower height and smaller gradient of the lead elements 3014 on a side of the photosensitive element 3012 allows the value of the first included angle α formed and defined between the photosensitive axis of the photosensitive element 3012 and the first inner surface 30134a of the retaining portion 3013 to be larger. The maximum value of the first included angle α can be 85°, while the preferred value is 60°~75°.

When the photosensitive element 3012 is accommodated and received in the accommodating space 301113 of the basal plate 30111, the height difference between the chip upper surface 30121 of the photosensitive element 3012 and the basal plate upper surface 301111 of the basal plate 30111 is reduced. Preferably, according to this embodiment of the camera module 30100 of the present invention, the chip upper surface 30121 of the photosensitive element 3012 and the basal plate upper surface 301111 of the basal plate 30111 are on the same horizontal plane, so as to provide a longer zooming space for the back focal length of the lens of the camera module 30100.

Figure 59:
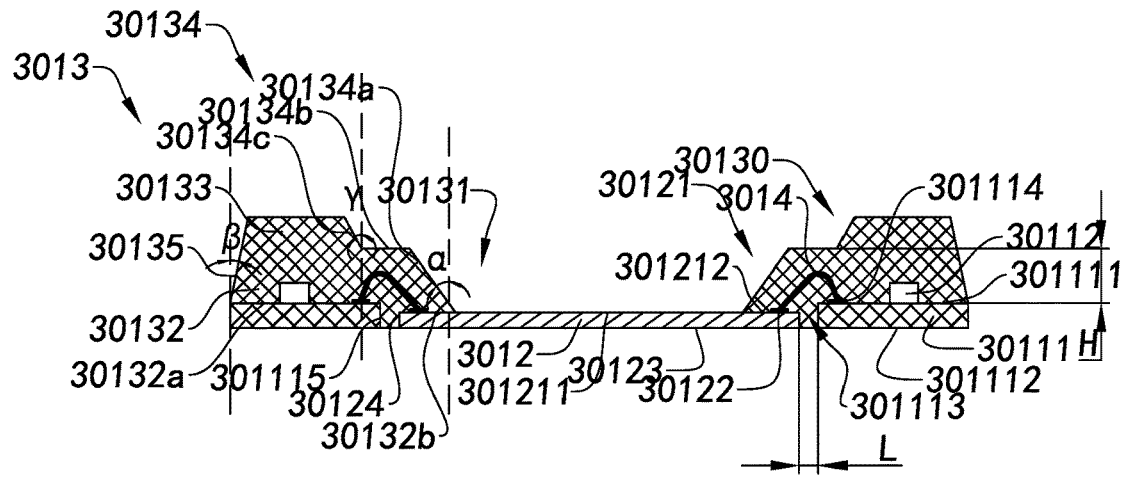
FIG. 59 illustrates an alternative mode of the molded circuit board member of the camera module according to the above preferred embodiment of the present invention.
Figure 60:
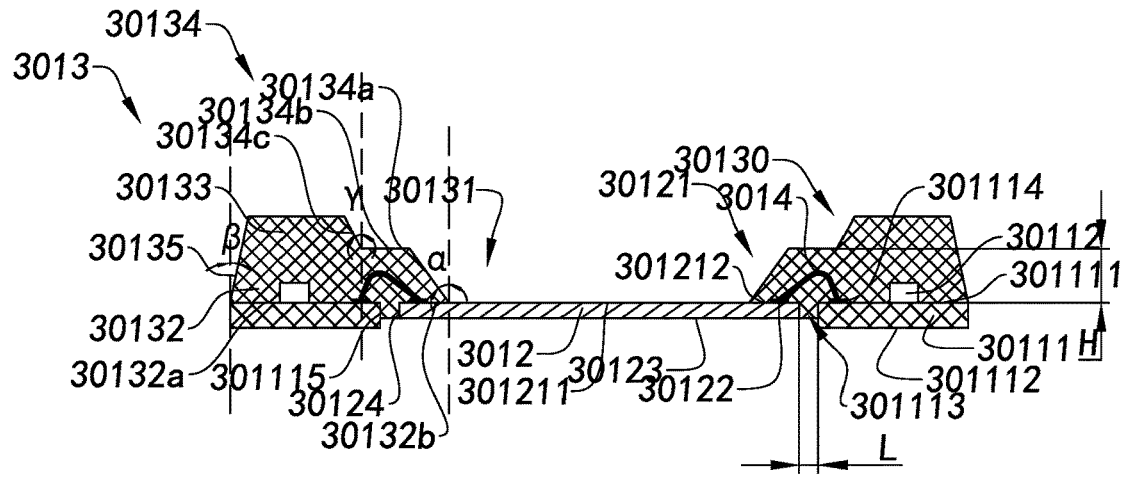
FIG. 60 illustrates an alternative mode of the molded circuit board member of the camera module according to the above preferred embodiment of the present invention.
Figure 61:
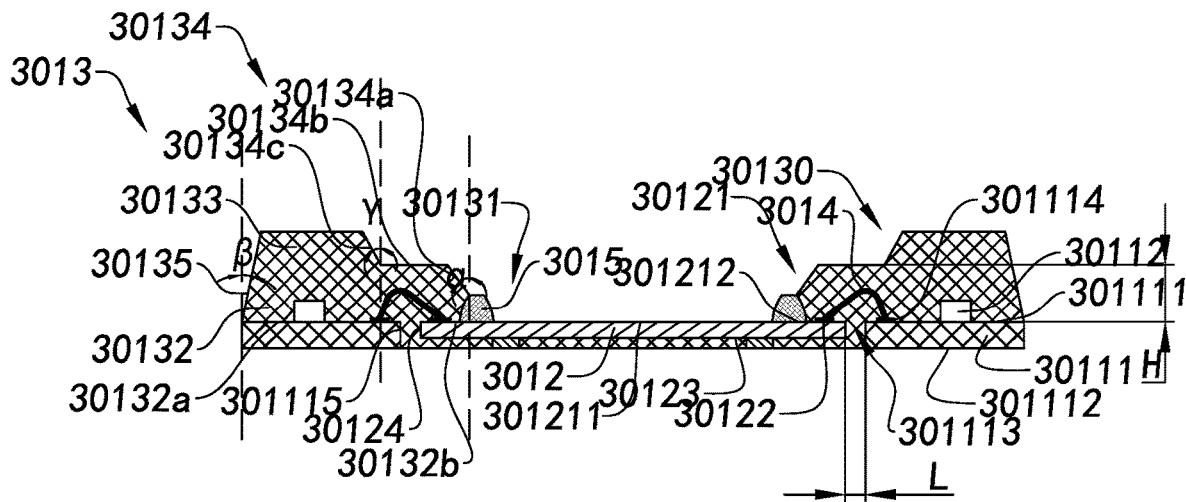
FIG. 61 illustrates an alternative mode of the molded circuit board member of the camera module according to the above preferred embodiment of the present invention.
Figure 62:
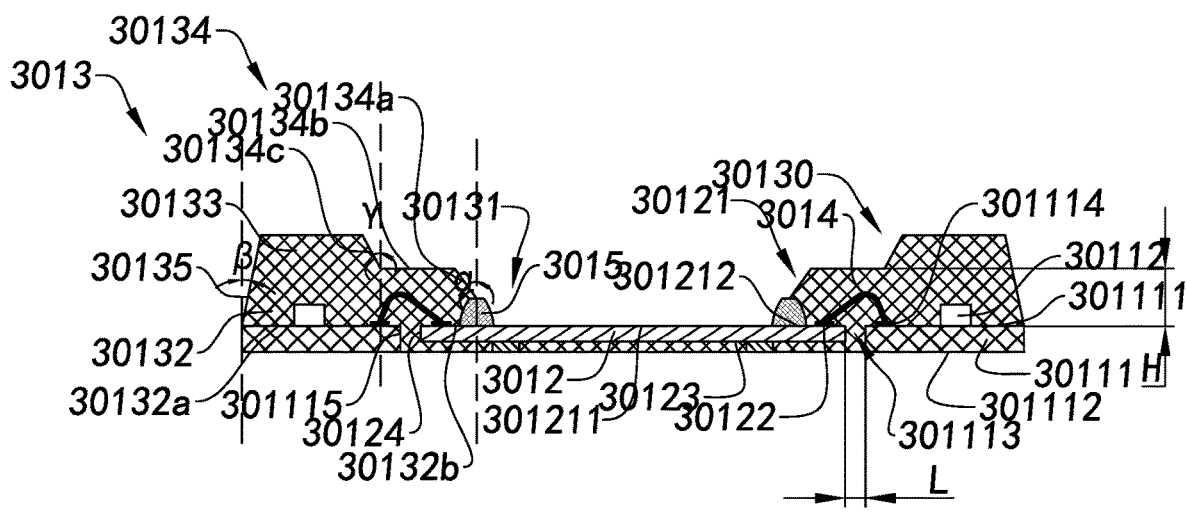
FIG. 62 illustrates an alternative mode of the molded circuit board member of the camera module according to the above preferred embodiment of the present invention.
Figure 63:
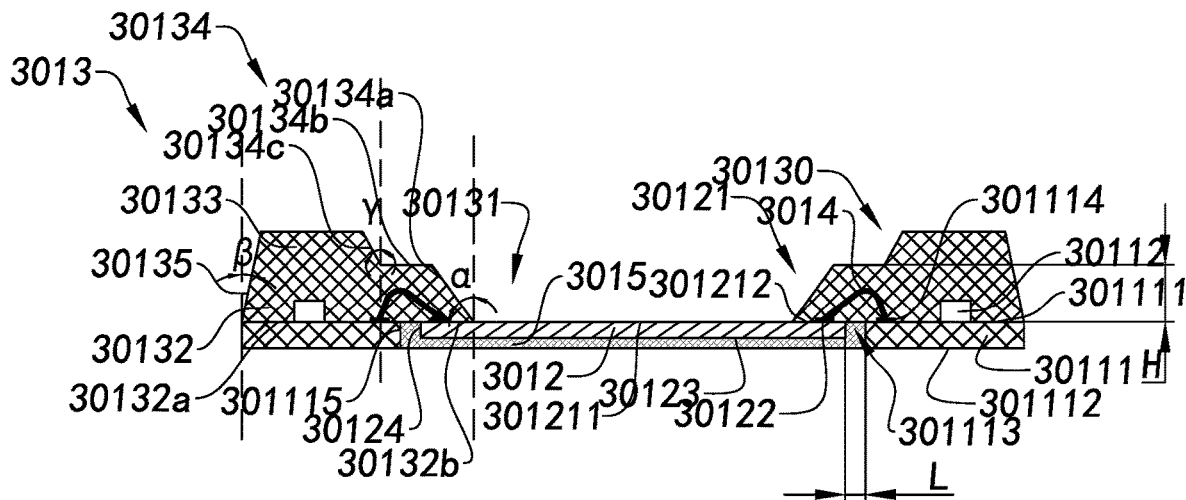
FIG. 63 illustrates an alternative mode of the molded circuit board member of the camera module according to the above preferred embodiment of the present invention.
Figure 64:
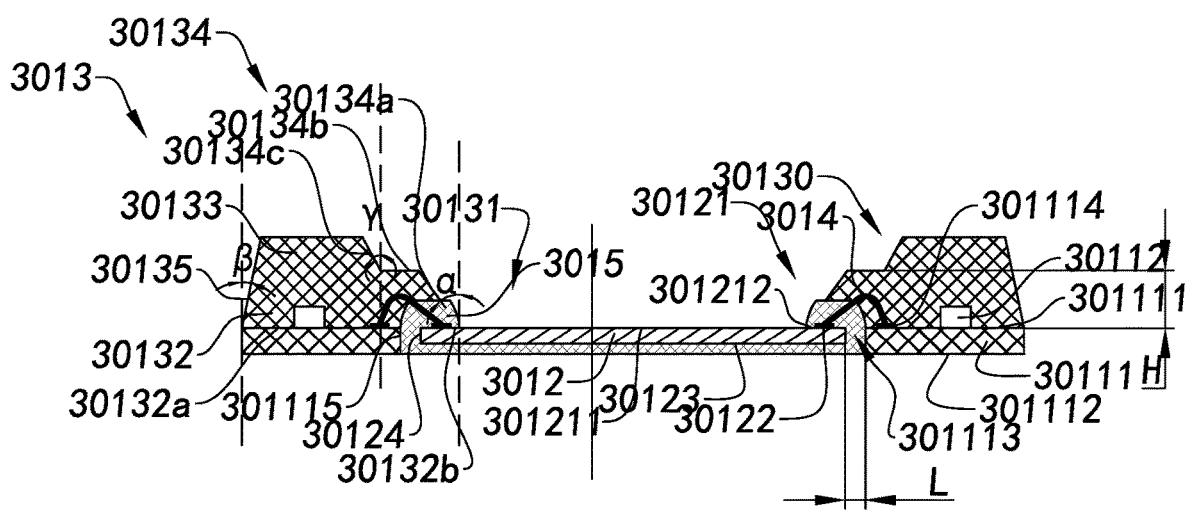
FIG. 64 illustrates an alternative mode of the molded circuit board member of the camera module according to the above preferred embodiment of the present invention.

It is worth mentioning that, according to an alternative mode of the camera module 30100 as illustrated in FIG. 59, the chip upper surface 30121 of the photosensitive element 3012 can also be lower than the basal plate upper surface 301111 of the basal plate 30111, so as to provide a longer zooming space for the back focal length of the lens of the camera module 30100. It is understandable that a chip lower surface 30123 of the photosensitive element 3012 and the basal plate lower surface 301112 of the basal plate 30111 can be on the same horizontal plane, such that the chip upper surface 30121 of the photosensitive element 3012 is lower than the basal plate upper surface 301111 of the basal plate 30111.

Further, when the photosensitive element 3012 is accommodated and received in the accommodating space 301113 of the basal plate 30111, the chip outer side 30124 of the photosensitive element 3012 does not contact the basal plate inner wall 301115 of the basal plate 30111. That is, a first safe distance L is defined between the chip outer side 30124 of the photosensitive element 3012 and the basal plate inner wall 301115 of the basal plate 30111, so as to avoid defectives in flatness and smoothness of the photosensitive element 3012 rendered by the influence of the circuit board 3011 from occurring.

One skilled in the art would understand that the size in length and width of the accommodating space 301113 of the basal plate 30111 is greater than the size in length and width of the photosensitive element 3012, such that when the photosensitive element 3012 is accommodated and received in the accommodating space 301113 of the basal plate 30111, the first safe distance L is formed between the chip outer side 30124 of the photosensitive element 3012 and the basal plate inner wall 301115 of the basal plate 30111. In this manner, when the camera module 30100 has worked for a long time, even if the basal plate 30111 of the circuit board 3011 is deformed due to the heat, it can still prevent the flatness, levelness, and smoothness of the photosensitive element 3012 from being affected, such that the image quality of the camera module 30100 can be guaranteed. In other words, the first safe distance L is formed and defined between the basal plate inner wall 301115 of the basal plate 30111 and the chip outer side 30124, so as to reserve a space for the deformation of the basal plate 30111.

For the camera module 30100 of the present invention, the range of the first safe distance L is 0 mm~5 mm (excluding 0 mm). Preferably, the range of the first safe distance L is 0 mm~0.5 mm. Preferably, the range of the first safe distance L is 0 mm~0.3 mm. More preferably, the range of the first safe distance L is selected from the group consisting of 0 mm~0.03 mm, 0.03 mm~0.06 mm, 0.06 mm~0.1 mm, 0.1 mm~0.15 mm, 0.15 mm~0.2 mm, 0.2 mm~0.25 mm, and 0.25 mm~0.3 mm. Certainly, the range of the first safe distance L may also be others, such as >0.5 mm, 0.5 mm~0.6 mm, 0.6 mm~0.7 mm, 0.7 mm~0.8 mm, 0.8 mm~0.9 mm, 0.9 mm~1 mm, 1 mm~1.5 mm, 1.5 mm~2 mm, 2 mm~2.5 mm, 2.5 mm~3 mm, 3 mm~3.5 mm, 3.5 mm~4 mm, 4 mm~4.5 mm, 4.5 mm~5 mm, and etc.

Figure 49A:
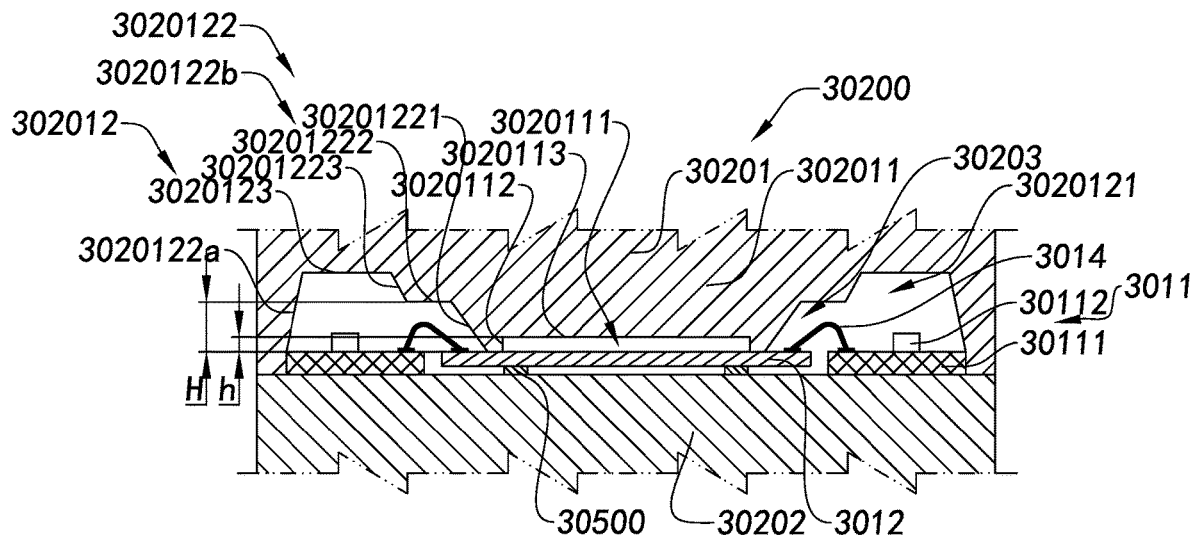
FIGS. 49A-49D are respectively perspective views of a third manufacturing step of the manufacturing steps of the camera module according to the above preferred embodiment of the present invention, which demonstrates a formation mould being utilized to mold and produce the molded circuit board member.

Referring to FIG. 49A, the electrically connected photosensitive element 3012 and circuit board 3011 are placed on the inner wall of the lower mold 30202 of the formation mould 30200. Then the upper mold 30201 and the lower mold 30202 of the formation mould 30200 are clamped, so as to form and define the molding space 30203 therebetween and keep the photosensitive element 3012 and the circuit board 3011 that are electrically connected with each other in the molding space 30203.

It is understandable that at least a supporting member 30500 can be disposed and provided between the inner wall of the lower mold 30202 and the chip lower surface 30123 of the photosensitive element 3012, so as to ensure that the chip upper surface 30121 of the photosensitive element 3012 and the basal plate upper surface 301111 of the basal plate 30111 are on the same plane. According to one embodiment of the camera module 30100 of the present invention, the supporting member 30500 can be an independent component, such that the supporting member 30500 can form and become a part of the molded circuit board member 3010, as illustrated in FIG. 49A, after the molded circuit board member 3010 was formed.

Figure 49B:
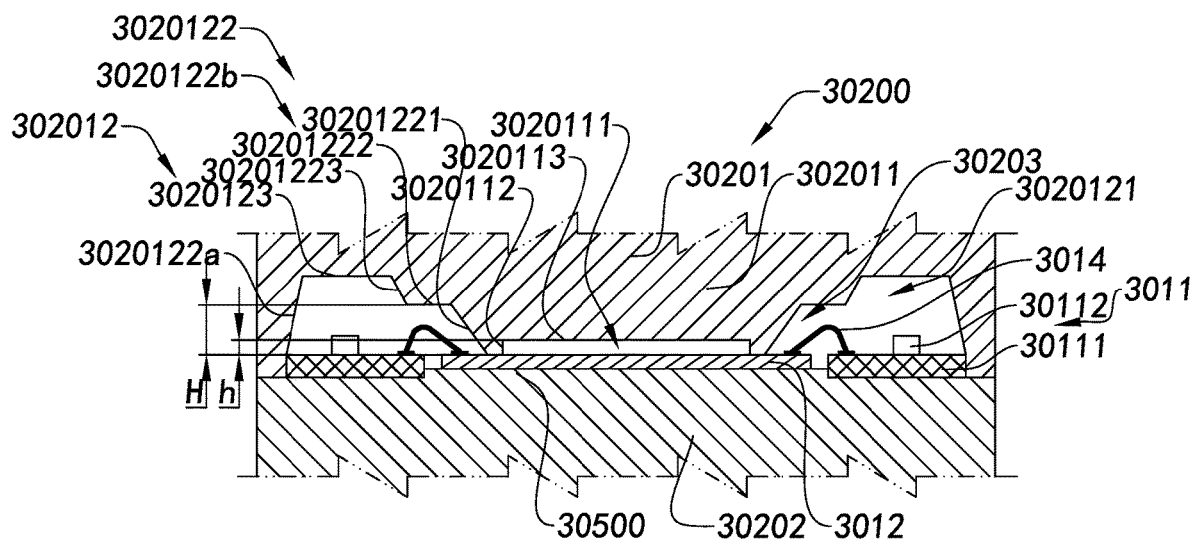

In another embodiment, further referring to FIG. 49B, the supporting member 30500 can also be integrally formed on the inner wall of the lower mold 30202, so as to make and produce the molded circuit board member 3010, as illustrated in FIG. 19, after the molding process.

Next, referring to FIGS. 49A and 49B, it is worth mentioning that the pressing surface of the surrounding member 302012 of the upper mold 30201 exerts pressure onto the outer side portion of the basal plate 30111 of the circuit board 3011 and the non-photosensitive area 301212 of the photosensitive element 3012, so as to make a part of the non-photosensitive area 301212 of the photosensitive element 3012 and each of the electronic components 30112 of the circuit board 3011 being arranged corresponding to the forming guide groove 3020121 of the surrounding member 302012. Correspondingly, the pressing surface of the optical window molding member 302011 of the upper mold 30201 exerts pressure onto the non-photosensitive area 301212 of the photosensitive element 3012, rendering the photosensitive area 301211 of the photosensitive element 3012 to be corresponding to the groove 3020111 of the optical window molding member 302011, so as to avoid the pressing surface of the optical window molding member 302011 from scraping and damaging the photosensitive area 301211 of the photosensitive element 3012.

It is also worth mentioning that the pressing surface of the optical window molding member 302011 and a part of the pressing surface of the surrounding member 302012 of the upper mold 30201 are an integral structure.

Figure 49C:
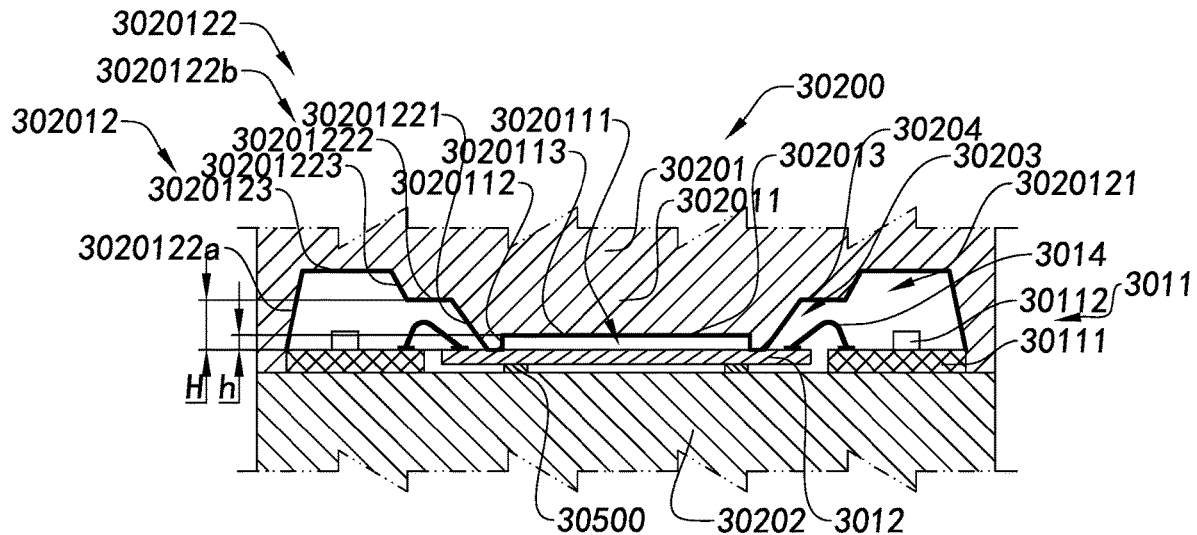

Referring to FIG. 49C, the formation mould 30200 may further comprise a deformable cover film 30204, overlappedly arranged on the mold inner wall 302013 of the upper mold 30201. Preferably, when the cover film 30204 bears pressure, the thickness of the cover film 30204 can slightly change. It is understandable that the pressing surface of the optical window molding member 302011 and the pressing surface of the surrounding member 302012 of the upper mold 30201 are part of the mold inner wall 302013 of the upper mold 30201, so that the cover film 30204 is also overlappedly arranged on the pressing surface of the surrounding member 302012 and the pressing surface of the optical window molding member 302011.

When the pressing surface of the surrounding member 302012 of the upper mold 30201 and the pressing surface of the optical window molding member 302011 exert pressure onto the basal plate 30111 of the circuit board 3011 and the non-photosensitive area 301212 of the photosensitive element 3012, the cover film 30204 is provided between the basal plate upper surface 301111 of the basal plate 30111 and the pressing surface of the surrounding member 302012 to avoid gap forming between the basal plate upper surface 301111 of the basal plate 30111 and the pressing surface of the surrounding member 302012. Also, the cover film 30204 is positioned between the pressing surface of the optical window molding member 302011 and the chip upper surface 30121 of the photosensitive element 3012 to avoid gap forming between the pressing surface of the optical window molding member 302011 and the chip upper surface 30121 of the photosensitive element 3012.

It is understandable that the cover film 30204 is for isolating the mold inner wall 302013 of the upper mold 30201 from the basal plate upper surface 301111 of the basal plate 30111 and for isolating the mold inner wall 302013 of the upper mold 30201 from the chip upper surface 30121 of the photosensitive element 3012, so as to avoid the mold inner wall 302013 of the upper mold 30201 from scraping and damaging the chip upper surface 30121 of the photosensitive element 3012 or the basal plate upper surface 301111 of the basal plate 30111. Moreover, the cover film 30204 can also absorb the impact force generated from the clamping of the formation mould 30200, so as to prevent the impact force from acting on the circuit board 3011 and the photosensitive element 3012, such that the circuit board 3011 and the photosensitive element 3012 can be protected.

In addition, further referring to FIGS. 49A, 49B, and 49C, the photosensitive area 301211 of the photosensitive element 3012 is arranged corresponding to the groove 3020111 of the optical window molding member 302011 of the upper mold 30201. The optical window molding member 302011 has an optical window forming side wall 3020112 and an optical window forming roof 3020113. The optical window forming roof 3020113 is indently formed. The optical window forming side wall 3020112 surrounds around the optical window forming roof 3020113 so as to form the groove 3020111 of the optical window molding member 302011. It is understandable that the distance between the pressing surface of the optical window molding member 302011 of the upper mold 30201 and the optical window forming roof 3020113 of the optical window molding member 302011 equals to the distance between the photosensitive area 301211 of the photosensitive element 3012 and the optical window forming roof 3020113 of the optical window molding member 302011.

According to the camera module 30100 of the present invention, a second safe distance h is formed and defined between the photosensitive area 301211 of the photosensitive element 3012 and the optical window forming roof 3020113 of the optical window molding member 302011, wherein the range of the second safe distance h is 0 mm~1 mm (including 0 mm). Preferably, the range of the second safe distance h is selected from the group consisting of 0 mm~0.01 mm, 0.01 mm~0.05 mm, and 0.05 mm~0.1 mm. Certainly, the range of the second safe distance h may also be 0.1 mm~1 mm, such as 0.1 mm~0.2 mm, 0.2 mm~0.3 mm, 0.3 mm~0.4 mm, 0.4 mm~0.5 mm, 0.5 mm~0.6 mm, 0.6 mm~0.7 mm, 0.7 mm~0.8 mm, 0.8 mm~0.9 mm, 0.9 mm~1 mm, and etc.

Referring to FIGS. 49A, 49B, and 49C, there is a third safe distance H between the mold inner wall 302013 of the upper mold 30201 and the non-photosensitive area 301212 of the photosensitive element 3012.

Specifically, the surrounding member 302012 of the upper mold 30201 has two guide groove forming side walls 3020122 and a guide groove forming roof 3020123, wherein one of the guide groove forming side wall 3020122 is an external guide groove forming side wall 3020122a, while the other is an internal guide groove forming side wall 3020122b. The external guide groove forming side wall 3020122a and the internal guide groove forming side wall 3020122b are respectively extended from the guide groove forming roof 3020123, so as to form the forming guide groove 3020121 of the surrounding member 302012.

The internal guide groove forming side wall 3020122b further has a first inner wall 30201221, a second inner wall 30201222 and a third inner wall 30201223, wherein the first inner wall 30201221, the second inner wall 30201222 and the third inner wall 30201223 are connected and successively extended from the opening of the forming guide groove 3020121 to the guide groove forming roof 3020123. It is worth mentioning that the inclining gradients of the first inner wall 30201221 of the upper mold 30201 and the first inner surface 30134a of the retaining portion 3013 are consistent, the second inner wall 30201222 and the second inner surface 30134b are levelled on the same plane, and the inclining gradients of the third inner wall 30201223 and the third inner surface 30134c are consistent. In addition, the inclining gradients of the external guide groove forming side wall 3020122a and the outer surface 30135 of the retaining portion 3013 are consistent.

According to the camera module 30100 of the present invention, a vertical distance between the second inner wall 30201222 of the upper mold 30201 and the non-photosensitive area 301212 of the photosensitive element 3012 with respect to the non-photosensitive area is defined as a third safe distance H, which determines the distance between the second inner surface 30134b of the retaining portion 3013 and the non-photosensitive area 301212 of the photosensitive element 3012. It is understandable that the measurement of the third safe distance H should not be too large or too small, so that the retaining portion 3013 not only can be utilized to ensure the flatness and smoothness of the photosensitive element 3012, but also will not generate too much stress to the photosensitive element 3012. For the camera module 30100 of the present invention, the range of the third safe distance H is 0 mm~3 mm (excluding 0 mm). Preferably, the range of the third safe distance H is selected from the group consisting of 0 mm~0.05 mm, 0.05 mm~0.1 mm, 0.1 mm~0.15 mm, 0.15 mm~0.2 mm, 0.2 mm~0.25 mm, and 0.25 mm~0.3 mm. Certainly, the range of the third safe distance H may be 0.3 mm~3 mm, 0.3 mm~0.5 mm, 0.5 mm~1 mm, 1 mm~1.5 mm, 1.5 mm~2 mm, 2 mm~2.5 mm, 2.5 mm~3 mm, and etc.

Figure 49D:
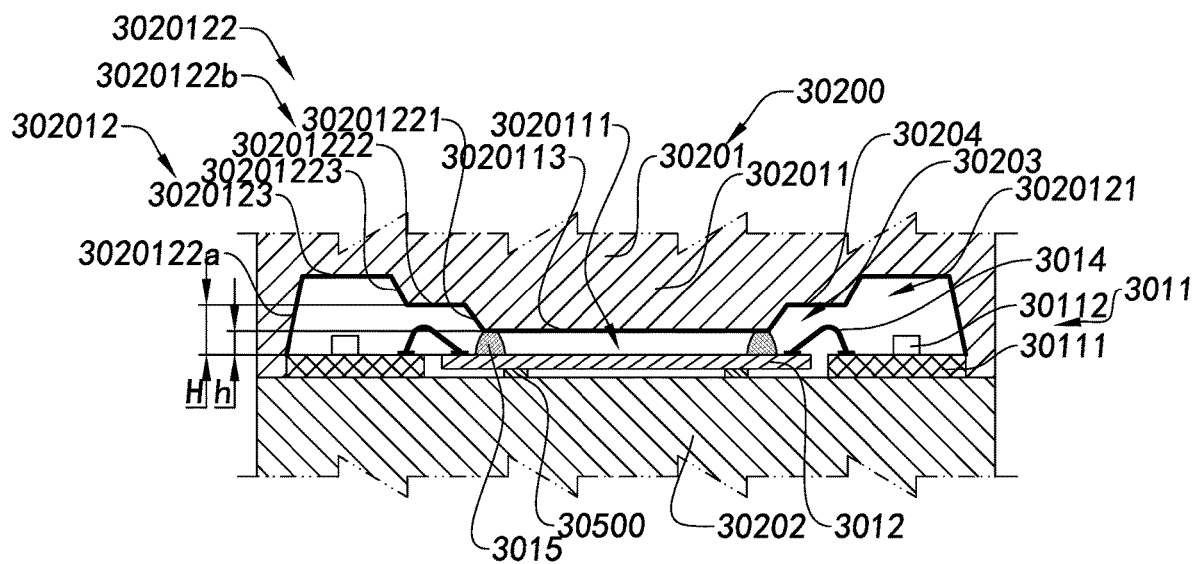

Referring to FIG. 49D, according to another embodiment of the camera module 30100, the optical window molding member 302011 of the upper mold 30201 may also not have the groove 3020111, that in other words, the pressing surface of the optical window molding member 302011 of the upper mold 30201 is a flat plane, wherein a second safe distance h is provided between the photosensitive area 301211 of the photosensitive element 3012 and the pressing surface of the optical window molding member 302011 of the upper mold 30201 when utilizing the formation mould 30200 to mold and produce the molded circuit board member 3010.

Specifically, a framework shaped protecting element 3015 is arranged or formed on the outer side of the photosensitive area 301211 of the chip upper surface 30121 of the photosensitive element 3012, such that the protecting element 3015 is protruded from the chip upper surface 30121 of the photosensitive element 3012.

In one embodiment of the camera module 30100, the protecting element 3015 can be prefabricated. Then, after the protecting element 3015 is formed, it would be attached on the chip upper surface 30121 of the photosensitive element 3012, ensuring the photosensitive area 301211 of the photosensitive element 3012 to be positioned corresponding to the through hole of the protecting element 3015.

In another embodiment of the camera module 30100, the protecting element 3015 can be integrally formed on the outer side of the photosensitive area 301211 of the photosensitive element 3012. For instance, it can have the framework shaped protecting element 3015 be formed on the chip upper surface 30121 of the photosensitive element 3012 and the photosensitive area 301211 of the photosensitive element 3012 be arranged corresponding to the through hole of the protecting element 3015 by means of applying or coating adhesive and solidifying the adhesive on the outer side of the photosensitive area 301211 of the photosensitive element 3012. It is understandable that the protecting element 3015 is formed in the non-photosensitive area 301212 of the photosensitive element 3012, so as to keep the protecting element 3015 from blocking or shading the photosensitive area 301211 of the photosensitive element 3012. Certainly, according to some embodiments of the present invention, the cover film 30204 may be thicker, so as to perform a better cushion function to protect the photosensitive element 3012 during the manufacturing process.

Preferably, the protecting element 3015 can be flexible and elastic, such that the protecting element 3015 is capable of absorbing the impact force generated when the formation mould 30200 is clamped, therefore avoiding the impact force from acting onto the photosensitive element 3012. Besides, the protecting element 3015 can also, through deformation, prevent gap forming between the top surface of the protecting element 3015 and the pressing surface of the optical window molding member 302011 of the upper mold 30201.

In addition, the protecting element 3015 can also be rigid that it relies on the cover films 30204 provided on the top surface of the protecting element 3015 and the pressing surface of the optical window molding member 302011 of the upper mold 30201 to absorb the impact force generated when the formation mould 30200 is clamped. Besides, the cover films 30204 can be utilized to prevent gap from forming between the top surface of the protecting element 3015 and the mold inner wall 302013 of the upper mold 30201.

After the formation mould 30200 is clamped, the protecting element 3015 is utilized for supporting the upper mold 30201, so as to provide and keep the second safe distance h between the photosensitive area 301211 of the photosensitive element 3012 and the pressing surface of the optical window molding member 302011 of the upper mold 30201 by the protecting element 3015, such that the photosensitive area 301211 of the photosensitive element 3012 can be protected from being scraped by the pressing surface of the optical window molding member 302011 of the upper mold 30201 during the process of utilizing the formation mould 30200 to mold and produce the molded circuit board member 3010.

It is worth mentioning that after the retaining portion 3013 is formed, it can cover, enclose, encapsulate and/or wrap up at least a part of the protecting element 3015. According to the embodiment of the molded circuit board member 3010 as illustrated in FIG. 20 as an example, the retaining portion 3013 covers, encloses, encapsulates and/or wraps up the outer side of the protecting element 3015. Nonetheless, according to the embodiment of the molded circuit board member 3010 as illustrated in FIG. 21 as an example, the retaining portion 3013 can cover, enclose, encapsulate and/or wrap up at least part of the top surface of the protecting element 3015.

Figure 50:
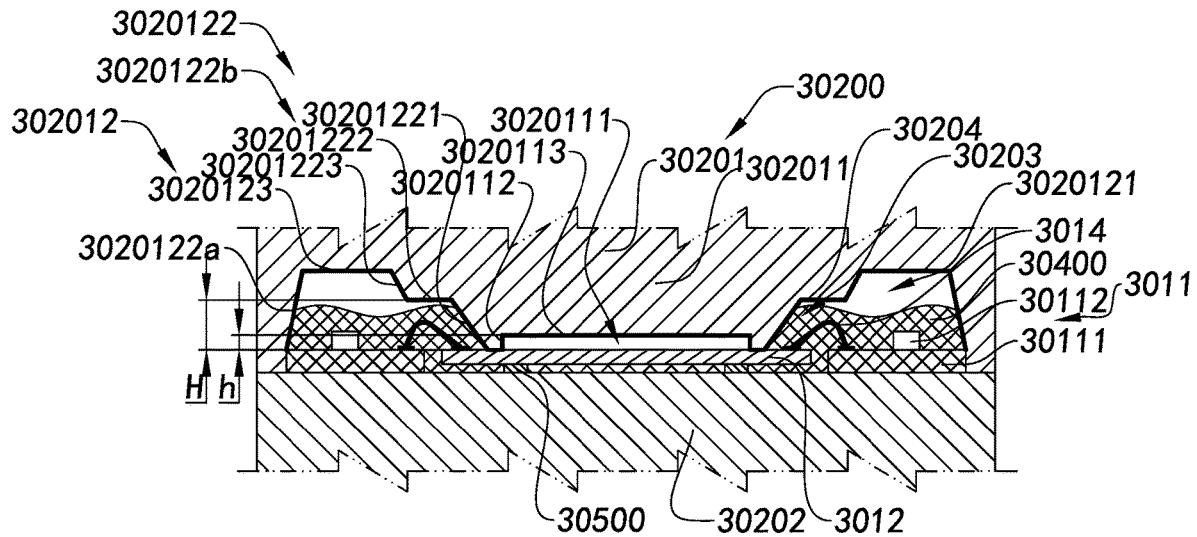
FIG. 50 is a perspective view illustrating a fourth step of the manufacturing steps of the camera module according to the above preferred embodiment of the present invention.
Figure 51:
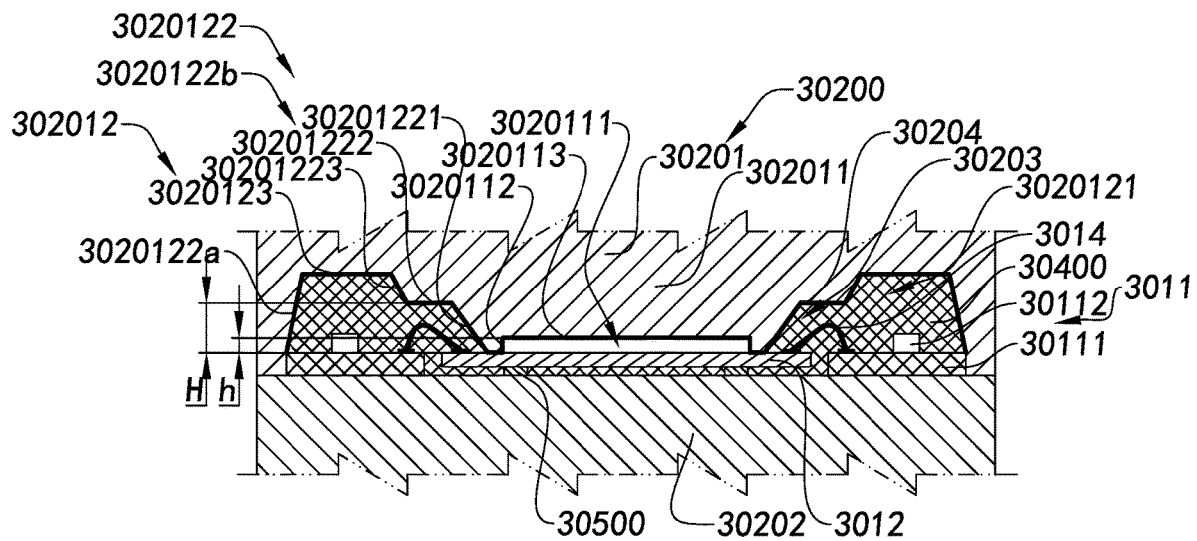
FIG. 51 is a perspective view illustrating a fifth step of the manufacturing steps of the camera module according to the above preferred embodiment of the present invention.
Figure 52:
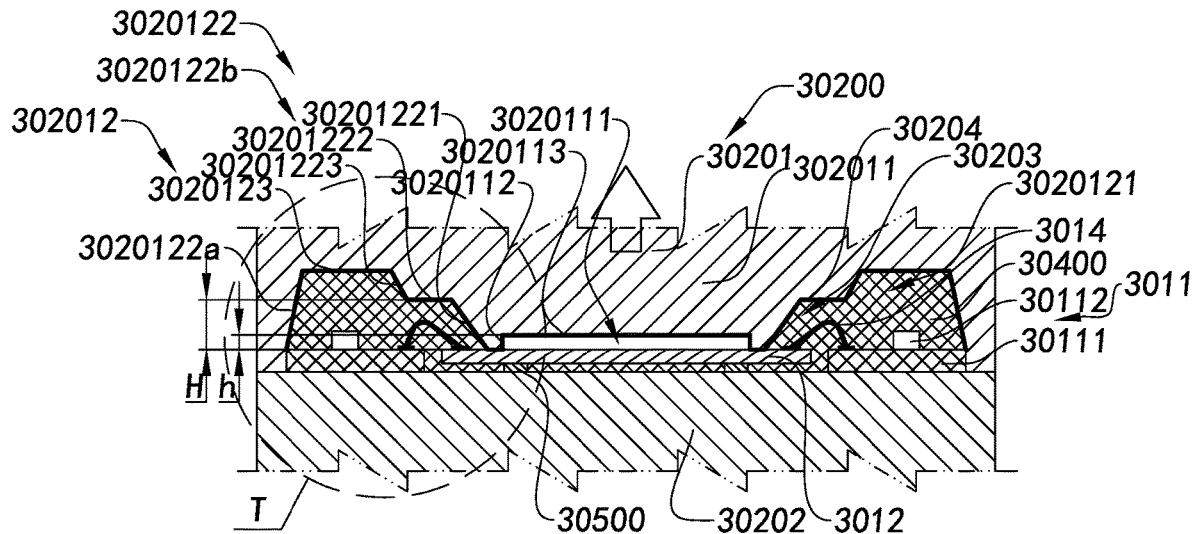
FIG. 52 is a perspective view illustrating a sixth step of the manufacturing steps of the camera module according to the above preferred embodiment of the present invention.
Figure 53:
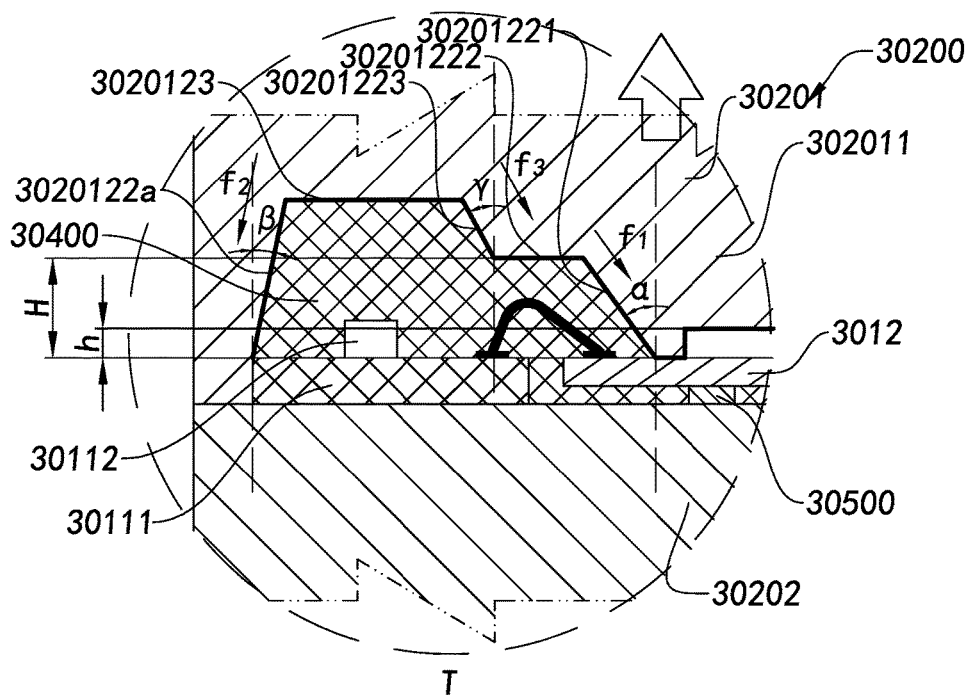
FIG. 53 is an enlarged view of the T position of FIG. 52.
Figure 54:
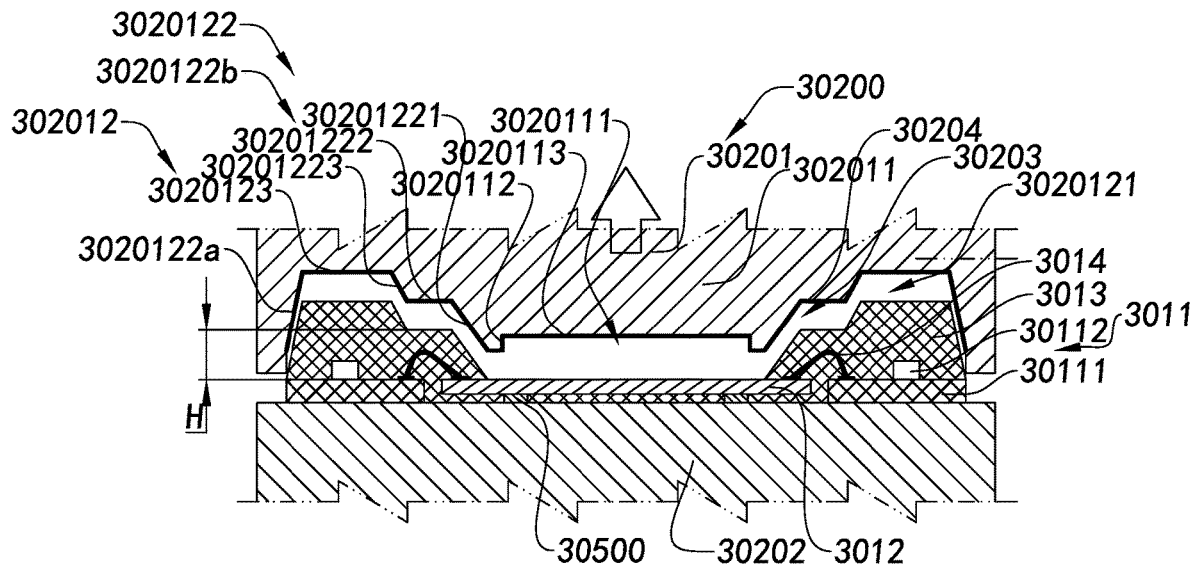
FIG. 54 is a perspective view illustrating a seventh step of the manufacturing steps of the camera module according to the above preferred embodiment of the present invention.
Figure 55:
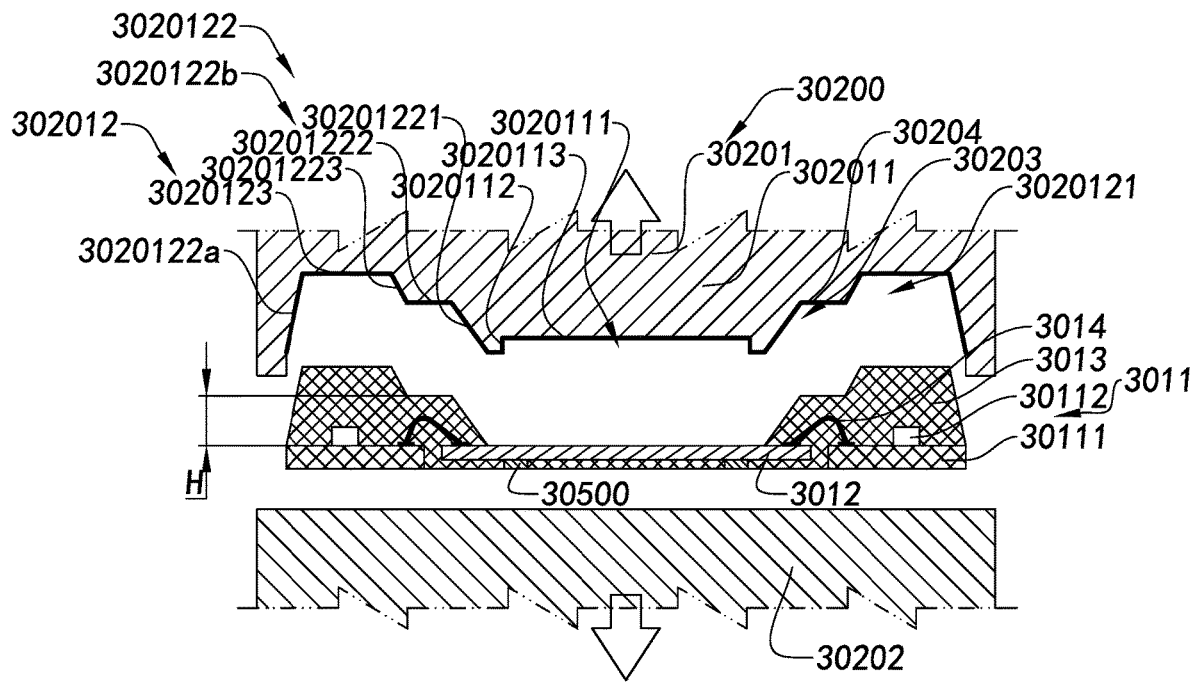
FIG. 55 is a perspective view illustrating an eighth step of the manufacturing steps of the camera module according to the above preferred embodiment of the present invention.

Referring to FIGS. 50-51, the fluid molding material 30400 is added into the molding space 30203 of the formation mould 30200. Then, the molding material 30400 fills up the space formed and defined between the chip lower surface 30123 of the photosensitive element 3012 and the lower mold 30202, the space formed and defined between the basal plate inner wall 301115 of the basal plate 30111 and the chip outer side 30124 of the photosensitive element 3012, and the forming guide groove 3020121 of the upper mold 30201. When the molding material 30400 is solidified in the molding space 30203, the retaining portion 3013 is integrally molded and formed with the circuit board 3011 and the photosensitive element 3012, wherein the optical window molding member 302011 makes the optical window 30131 being formed in the retaining portion 3013.

It is understandable that, according to this embodiment of the camera module 30100 of the present invention, the material filled in the space formed between the basal plate inner wall 301115 of the basal plate 30111 and the chip outer side 30124 of the photosensitive element 3012 is the molding material 30400. Accordingly, a part of the retaining portion 3013 is formed between the basal plate inner wall 301115 of the basal plate 30111 and the chip outer side 30124 of the photosensitive element 3012. According to some embodiments of the camera module 30100 of the present invention, the space formed between the basal plate inner wall 301115 of the basal plate 30111 and the chip outer side 30124 of the photosensitive element 3012 may also be free from filling up with any material. According to another embodiments of the camera module 30100 of the present invention, the space formed between the basal plate inner wall 301115 of the basal plate 30111 and the chip outer side 30124 of the photosensitive element 3012 may also be filled up with flexible material, such as adhesive and etc., so as to achieve the molded circuit board member 3010 as illustrated in FIG. 22 after the molding process is completed. In addition, a part of the protecting element 3015 may also be filled in the space formed between the basal plate inner wall 301115 of the basal plate 30111 and the chip outer side 30124 of the photosensitive element 3012, so as to achieve the molded circuit board member 3010 as illustrated in FIG. 23 after the molding process is completed.

FIGS. 52-55 illustrate a drafting and demoulding process of the formation mould 30200. When the molding material 30400 is solidified in the molding space 30203 of the formation mould 30200, the drafting and demoulding process can then be conducted to the upper mold 30201 and the lower mold 30202 of the formation mould 30200, which is to open and separate the upper mold 30201 and the lower mold 30202.

In the camera module 30100 of the present invention, the first inner surface 30134a of the retaining portion 3013 is extended from the coupling side 30132 to the attaching side 30133 of the retaining portion 3013 in an inclining and sloping manner, so as to form the first included angle $\alpha$, which is a sharp angle, between the first inner surface 30134a and the photosensitive axis of the photosensitive element 3012. A friction force f1 is generated between the first inner surface 30134a of the retaining portion 3013 and the mold inner wall 302013 of the upper mold 30201 at the moment when the formation mould 30200 is drafted and demoulded. Nonetheless, as the upper mold 30201 of the formation mould 30200 has shifted with respect to the lower mold 30202, there will barely be friction force generated between the first inner surface 30134a of the retaining portion 3013 and the mold inner wall 302013 of the upper mold 30201. In this manner, it may not only prevent the mold inner wall 302013 of the upper mold 30201 from rubbing and scraping the inner surface 30134 of the retaining portion 3013, but also avoid the mold inner wall 302013 of the upper mold 30201 from rubbing the inner surface 30134 of the retaining portion 3013 and generating pulling force to the retaining portion 3013, such that the reliability of the bonding and coupling among the retaining portion 3013, the circuit board 3011, and the photosensitive element 3012 can be guaranteed.

In other words, the first inner surface 30134a of the retaining portion 3013 extends in an inclining and sloping manner, which not only protects the smooth finishing of the first inner surface 30134a of the retaining portion 3013, but also facilitates the demolding of the formation mould 30200.

In the camera module 30100 of the present invention, the third inner surface 30134c of the retaining portion 3013 is extended from the attaching side 30133 to the coupling side 30132 of the retaining portion 3013 in an inclining and sloping manner, so as to form the third included angle $\gamma$, which is a sharp angle, between the third inner surface 30134c and the photosensitive axis of the photosensitive element 3012. A friction force f3 is generated between the third inner surface 30134c of the retaining portion 3013 and the mold inner wall 302013 of the upper mold 30201 at the moment when the formation mould 30200 is drafted and demoulded. Nonetheless, as the upper mold 30201 of the formation mould 30200 has shifted with respect to the lower mold 30202, there will barely be friction force generated between the third inner surface 30134c and the mold inner wall 302013 of the upper mold 30201. In this manner, it may not only prevent the mold inner wall 302013 of the upper mold 30201 from rubbing and scraping the inner surface 30134 of the retaining portion 3013, but also avoid the mold inner wall 302013 of the upper mold 30201 from rubbing the inner surface 30134 of the retaining portion 3013 and generating pulling force to the retaining portion 3013, such that the reliability of the bonding and coupling among the retaining portion 3013, the circuit board 3011, and the photosensitive element 3012 can be guaranteed. In addition, it may also ensure the horizontal of the second inner surface 30134b.

Preferably, according to the camera module 30100 of the present invention, the outer surface 30135 of the retaining portion 3013 extends from the coupling side 30132 to the attaching side 30133 of the retaining portion 3013 in an inclining and sloping manner, such that a second included angle $\beta$, which is a sharp angle, is formed and defined between the outer surface 30135 of the retaining portion 3013 and the photosensitive axis of the photosensitive element 3012. Similarly, the outer surface 30135 of the retaining portion 3013 extends in an inclining and sloping manner. At the instant when the formation mould 30200 is drafted and demoulded, a friction force f2 is generated between the outer surface 30135 of the retaining portion 3013 and the external guide groove forming side wall 3020122a of the upper mold 30201. However, if the upper mold 30201 of the formation mould 30200 has slightly has shifted with respect to the lower mold 30202, the friction force will not be generated between the outer surface 30135 of the retaining portion 3013 and the external guide groove forming side wall 3020122a of the upper mold 30201, such that it not only helps drafting and demolding, but also ensures the smooth finishing of the outer surface 30135 of the retaining portion 3013, increasing the product yield rate of the camera module 30100.

Figure 56:
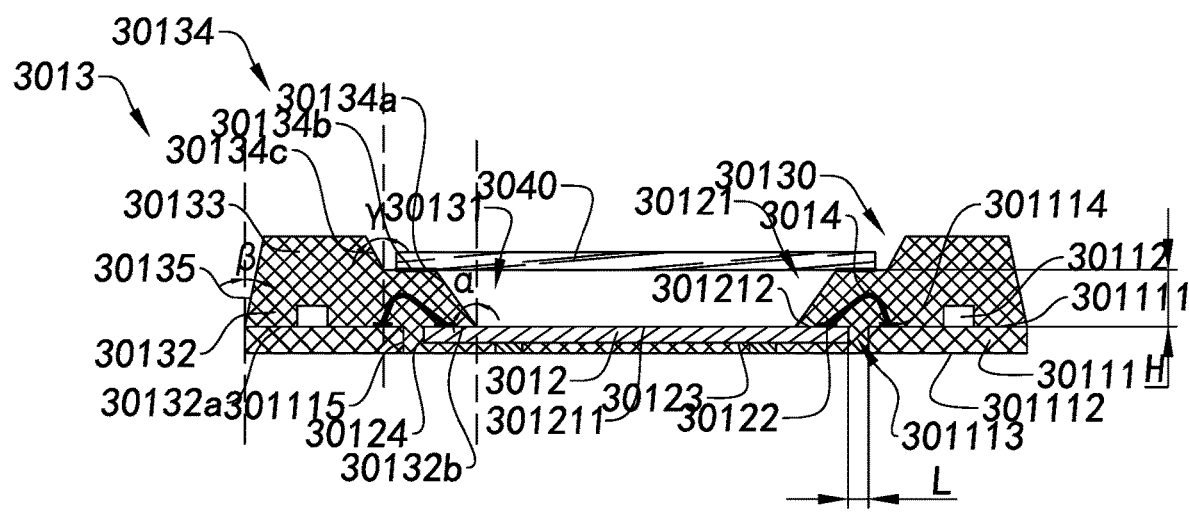
FIG. 56 is a perspective view illustrating a ninth step of the manufacturing steps of the camera module according to the above preferred embodiment of the present invention.

Referring to FIGS. 56 and 57A, first, the filter 3040 is attached on the second inner surface 30134b of the retaining portion 3013, so as to retain the filter 3040 parallel to the photosensitive area 301211 of the photosensitive element 3012. Then the actuator 3030 with the optical lens 3020 assembled thereon is attached on the attaching side 30133 of the retaining portion 3013 and electrically connected with the circuit board 3011, so as to retain the optical lens 3020 in the photosensitive path of the photosensitive element 3012 and make the camera module 30100.

Figure 65:
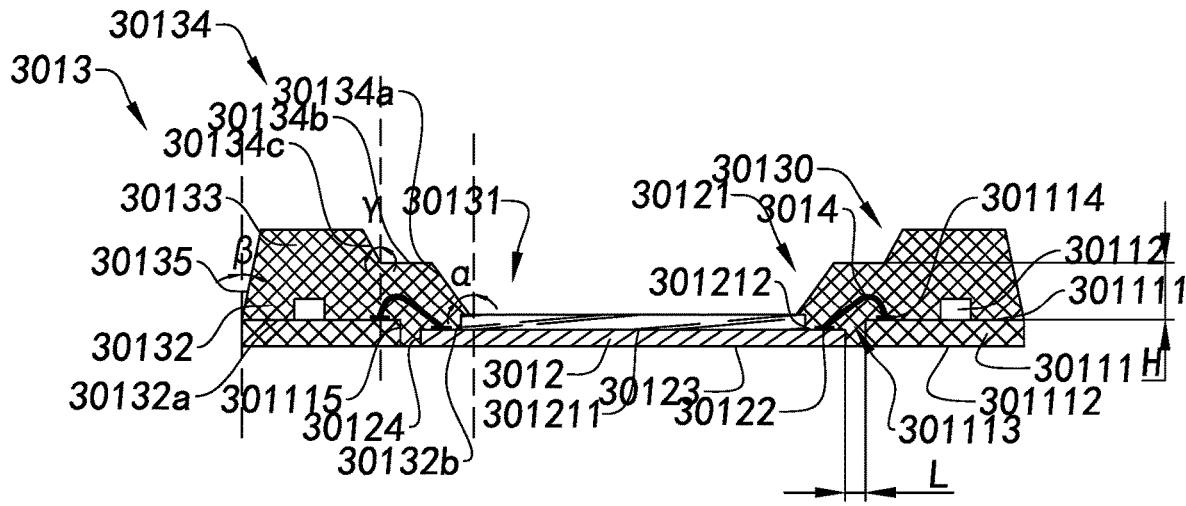
FIG. 65 illustrates an alternative mode of the molded circuit board member of the camera module according to the above preferred embodiment of the present invention.

FIG. 65 illustrates an alternative mode of the molded circuit board member 3010, wherein the filter 3040 may also be overlappedly arranged on the photosensitive element 3012 before the retaining portion 3013 is formed, such that the retaining portion 3013, the filter 3040, the photosensitive element 3012, and the circuit board 3011 can be integrally formed in the molding process.

Figure 66:
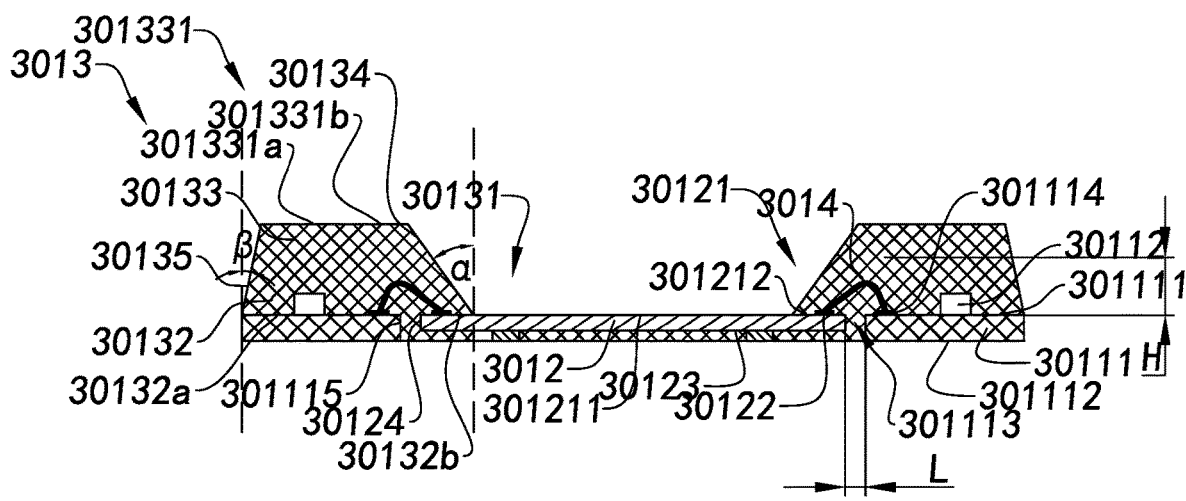
FIG. 66 illustrates an alternative mode of the molded circuit board member of the camera module according to the above preferred embodiment of the present invention.

FIG. 66 illustrates an alternative mode of the molded circuit board member 3010, wherein the inner surface 30134 of the retaining portion 3013 is a complete surface and the filter 3040 and the actuator 3030 are respectively be mounted on the attaching side 30133 of the retaining portion 3013. Specifically, the attaching surface 301331 of the attaching side 30133 of the retaining portion 3013 has an outer attaching surface 301331a and an inner attaching surface 301331b. The outer attaching surface 301331a and the inner attaching surface 301331b are integrally formed. Preferably, the outer attaching surface 301331a and the inner attaching surface 301331b are on the same plane. The outer attaching surface 301331a of the attaching side 30133 is extended from the outer surface 30135 to direction of the inner surface 30134, while the inner attaching surface 301331b of the attaching side 30133 is extended from the inner surface 30134 to the direction of the outer surface 30135. The actuator 3030 is mounted on at least a part of the outer attaching surface 301331a of the attaching side 30133, so as to maintain the optical lens 3020 assembled on the actuator 3030 in the photosensitive path of the photosensitive element 3012. The filter 3040 is mounted and attached on at least a part of the inner attaching surface 301331b of the attaching side 30133, so as to maintain the filter 3040 between the photosensitive element 3012 and the optical lens 3020.

One skilled in the art should be able to understand that the inclining gradient of the inner surface 30134 of the retaining portion 3013 is restricted by the wiring direction of the lead elements 3014. When the wiring direction of the lead elements 3014 is from the photosensitive element to the circuit board 3011, the first included angle $\alpha$ between the inner surface 30134 of the retaining portion 3013 and the photosensitive axis of the photosensitive element 3012 is smaller. On the other hand, when the wiring direction of the lead elements 3014 is from the circuit board 3011 to the photosensitive element 3012, the first included angle $\alpha$ between the inner surface 30134 of the retaining portion 3013 and the photosensitive axis of the photosensitive element 3012 is larger.

Person skilled in the art should also be able to understand that, on one hand, if the first included angle $\alpha$ is too large, the lead elements 3014 can possibly be damaged when utilizing the formation mould 30200 to mold and produce the molded circuit board member 3010. Moreover, after the retaining portion 3013 is formed, the lead elements 3014 will be exposed on the inner surface 30134 of the retaining portion 3013. As a result, the light entered the inside of the camera module 30100 from the optical lens 3020 can be reflected by the lead element 3014 to produce stray light in the camera module 30100 during imaging, rendering adverse effect to the imaging of the camera module 30100. On the other hand, if the first included angle $\alpha$ is too small, it is difficult to demold and draft the formation mould 30200. Furthermore, it can damage the retaining portion 3013, rendering the particles, such as fragments and etc., produced from the retaining portion 3013 to pollute the photosensitive area 301212 of the photosensitive element 3012 when drafting and demolding the formation mould 30200.

Besides, the values of the second included angle $\beta$ and the third included angle $\gamma$ should both not be too large or too small, otherwise it can render failure of attaching the filter 3040 and the actuator 3030 on the retaining portion 3013 or difficulty of drafting and demolding the formation mould 30200.

In other words, the maximum values and the minimum values of the first included angle $\alpha$, the second included angle $\beta$, and the third included angle $\gamma$ are as follows. The value range of the first included angle $\alpha$ is 1°~85°. The value range of the second included angle $\beta$ is 1°~65°. The value range of the third included angle $\gamma$ is 1°~60°. Optionally, the value range of the first included angle $\alpha$ is 35°~75°.

Figure 67:
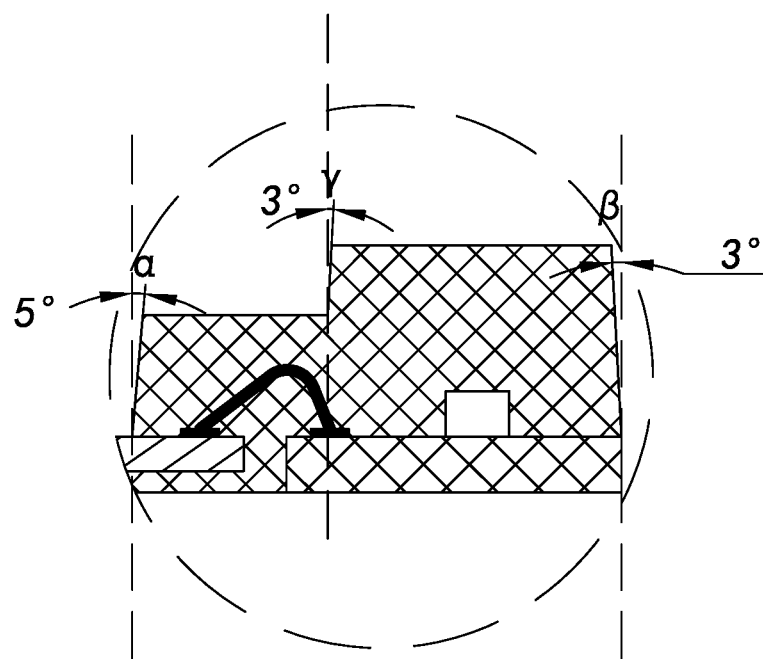
FIG. 67 is a partial sectional view of the molded circuit board member of the camera module according to the above preferred embodiment of the present invention, illustrating relationships among a first included angle $\alpha$, a second included angle $\beta$, and a third included angle $\gamma$.

According to the molded circuit board member 3010 as illustrated in FIG. 67, the first included angle $\alpha$ is 5°, the second included angle $\beta$ is 3°, and the third included angle $\gamma$ is 3°.

Figure 68:
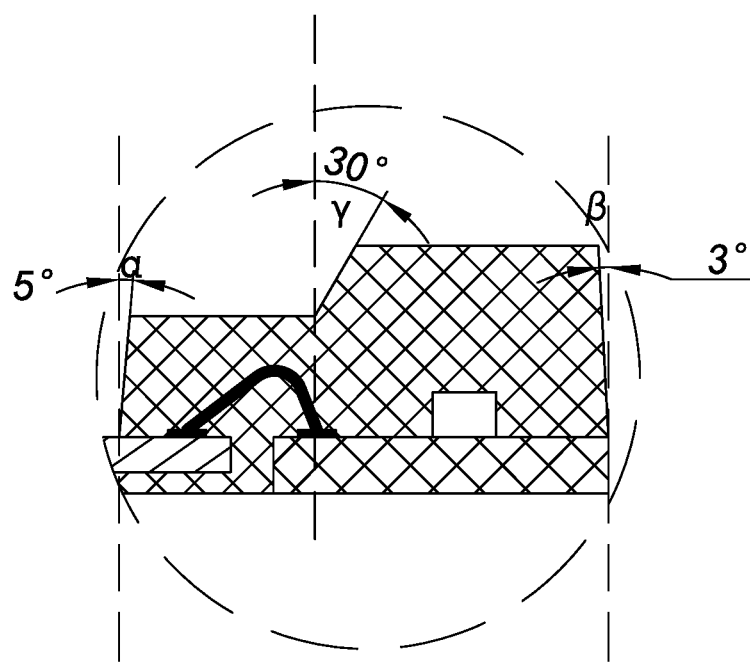
FIG. 68 is a partial sectional view of the molded circuit board member of the camera module according to the above preferred embodiment of the present invention, illustrating the relationships among the first included angle $\alpha$, the second included angle $\beta$, and the third included angle $\gamma$.

According to the molded circuit board member 3010 as illustrated in FIG. 68, the first included angle α is 5°, the second included angle β is 3°, and the third included angle γ is 30°.

Figure 69:
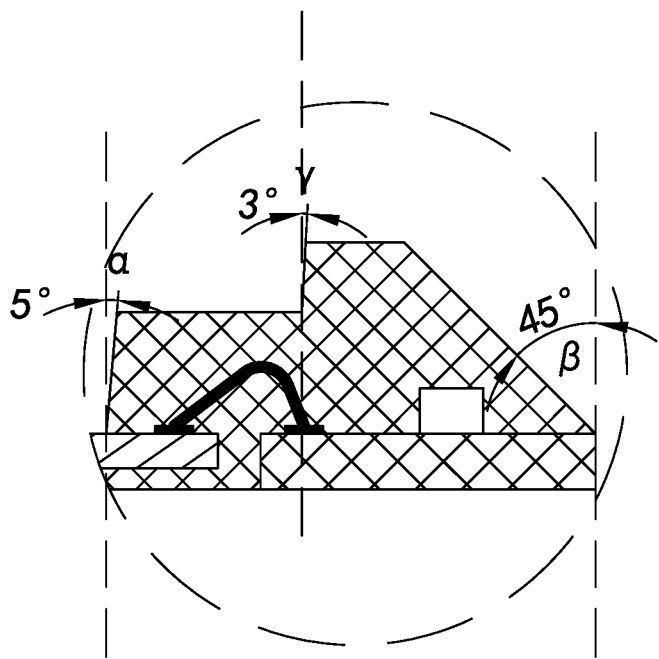
FIG. 69 is a partial sectional view of the molded circuit board member of the camera module according to the above preferred embodiment of the present invention, illustrating the relationships among the first included angle $\alpha$, the second included angle $\beta$, and the third included angle $\gamma$.

According to the molded circuit board member 3010 as illustrated in FIG. 69, the first included angle α is 5°, the second included angle β is 45°, and the third included angle γ is 3°.

Figure 70:
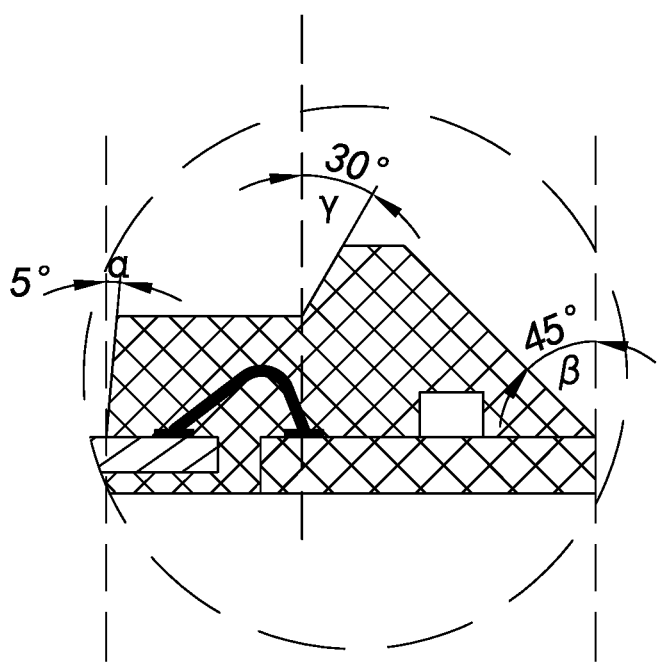
FIG. 70 is a partial sectional view of the molded circuit board member of the camera module according to the above preferred embodiment of the present invention, illustrating the relationships among the first included angle $\alpha$, the second included angle $\beta$, and the third included angle $\gamma$.

According to the molded circuit board member 3010 as illustrated in FIG. 70, the first included angle α is 5°, the second included angle β is 45°, and the third included angle γ is 30°.

Figure 71:
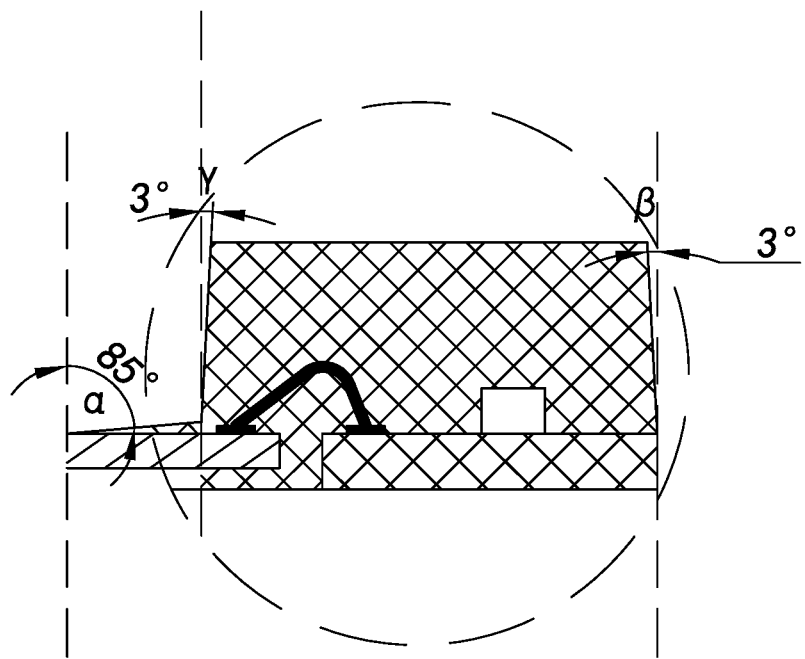
FIG. 71 is a partial sectional view of the molded circuit board member of the camera module according to the above preferred embodiment of the present invention, illustrating the relationships among the first included angle $\alpha$, the second included angle $\beta$, and the third included angle $\gamma$.

According to the molded circuit board member 3010 as illustrated in FIG. 71, the first included angle α is 85°, the second included angle β is 3°, and the third included angle γ is 3°.

Figure 72:
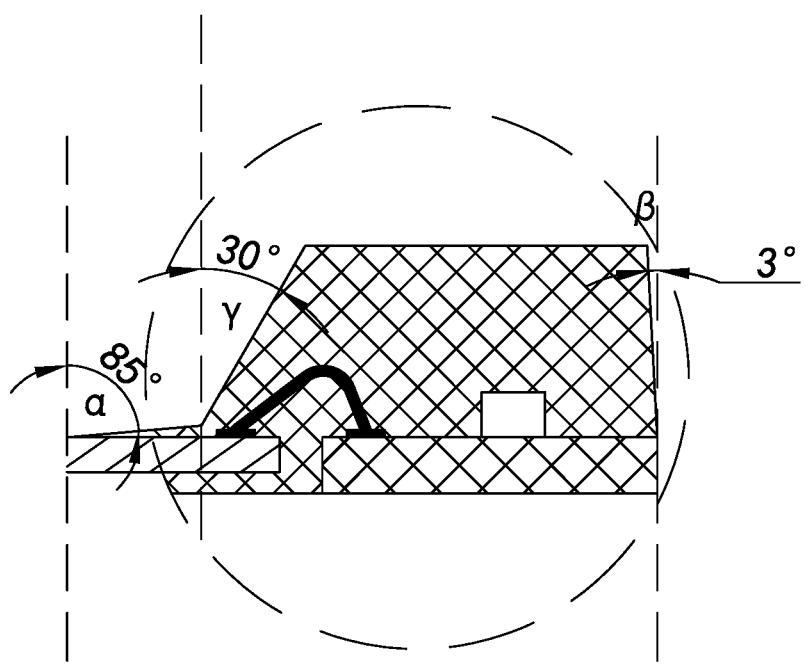
FIG. 72 is a partial sectional view of the molded circuit board member of the camera module according to the above preferred embodiment of the present invention, illustrating the relationships among the first included angle $\alpha$, the second included angle $\beta$, and the third included angle $\gamma$.

According to the molded circuit board member 3010 as illustrated in FIG. 72, the first included angle α is 85°, the second included angle β is 3°, and the third included angle γ is 30°.

Figure 73:
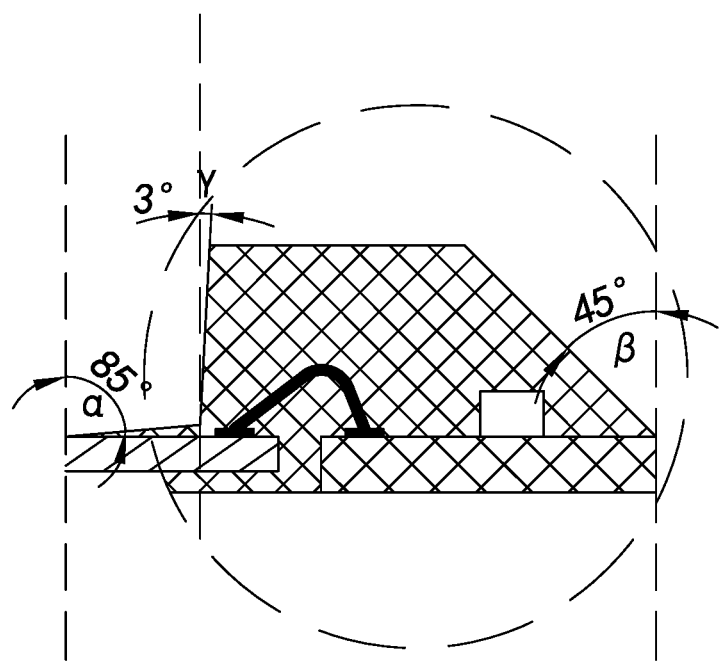
FIG. 73 is a partial sectional view of the molded circuit board member of the camera module according to the above preferred embodiment of the present invention, illustrating the relationships among the first included angle $\alpha$, the second included angle $\beta$, and the third included angle $\gamma$.

According to the molded circuit board member 3010 as illustrated in FIG. 73, the first included angle α is 85°, the second included angle β is 45°, and the third included angle γ is 3°.

Figure 74:
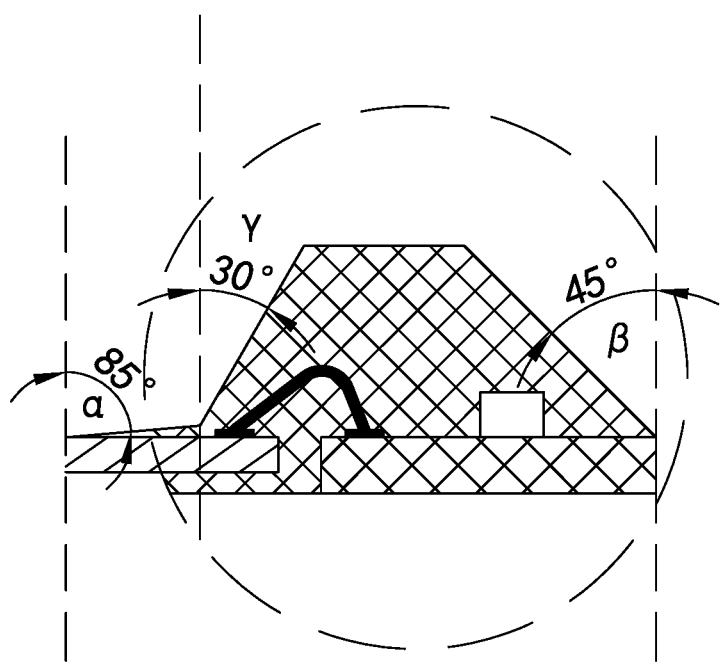
FIG. 74 is a partial sectional view of the molded circuit board member of the camera module according to the above preferred embodiment of the present invention, illustrating the relationships among the first included angle $\alpha$, the second included angle $\beta$, and the third included angle $\gamma$.

According to the molded circuit board member 3010 as illustrated in FIG. 74, the first included angle α is 85°, the second included angle β is 45°, and the third included angle γ is 30°.

Figure 75:
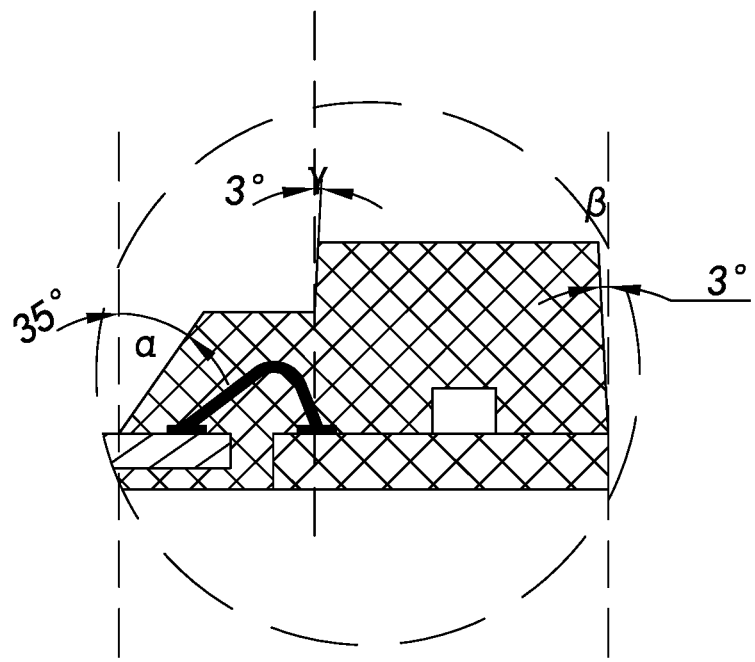
FIG. 75 is a partial sectional view of the molded circuit board member of the camera module according to the above preferred embodiment of the present invention, illustrating the relationships among the first included angle $\alpha$, the second included angle $\beta$, and the third included angle $\gamma$.

According to the molded circuit board member 3010 as illustrated in FIG. 75, the first included angle α is 35°, the second included angle β is 3°, and the third included angle γ is 3°.

Figure 76:
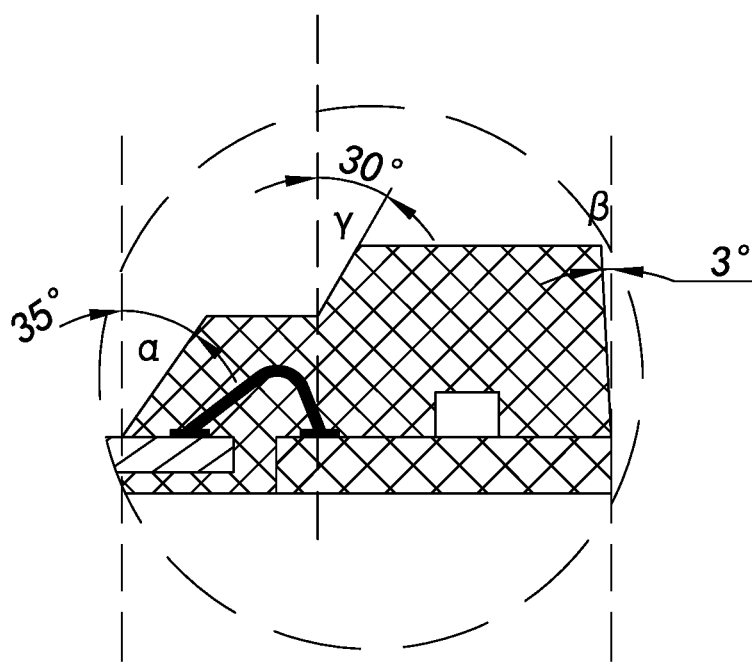
FIG. 76 is a partial sectional view of the molded circuit board member of the camera module according to the above preferred embodiment of the present invention, illustrating the relationships among the first included angle $\alpha$, the second included angle $\beta$, and the third included angle $\gamma$.

According to the molded circuit board member 3010 as illustrated in FIG. 76, the first included angle α is 35°, the second included angle β is 3°, and the third included angle γ is 30°.

Figure 77:
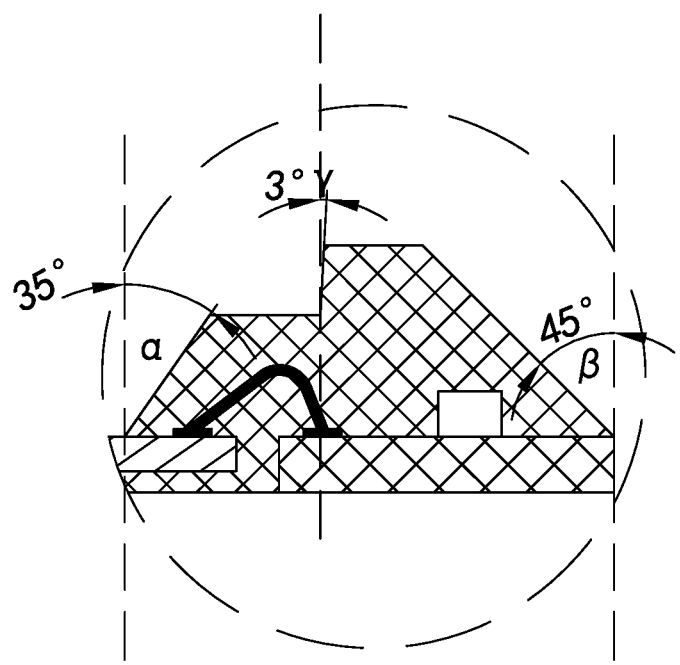
FIG. 77 is a partial sectional view of the molded circuit board member of the camera module according to the above preferred embodiment of the present invention, illustrating the relationships among the first included angle $\alpha$, the second included angle $\beta$, and the third included angle $\gamma$.

According to the molded circuit board member 3010 as illustrated in FIG. 77, the first included angle α is 35°, the second included angle β is 45°, and the third included angle γ is 3°.

Figure 78:
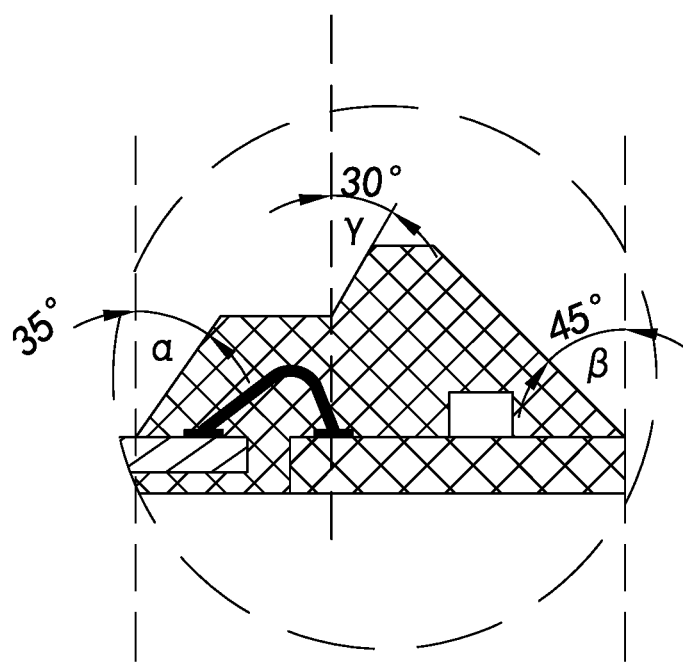
FIG. 78 is a partial sectional view of the molded circuit board member of the camera module according to the above preferred embodiment of the present invention, illustrating the relationships among the first included angle $\alpha$, the second included angle $\beta$, and the third included angle $\gamma$.

According to the molded circuit board member 3010 as illustrated in FIG. 78, the first included angle α is 35°, the second included angle β is 45°, 6 and the third included angle γ is 30°.

One skilled in the art should be able to understand that the embodiment illustrated in FIGS. 67-78 just regards the wiring direction of the lead elements 3014 that is from the basal plate 30111 of the circuit board 3011 to the photosensitive element 3012 as an example for illustrating and elaborating features and advantages of the camera module 30100 of the present invention, which shall not be considered limits to the content and scope of the camera module 30100 of the present invention. It is understandable that according to other embodiments, the wiring direction of the lead elements 3014 may also be from the photosensitive element 3012 to the basal plate 30111 of the circuit board 3011, as illustrated in FIG. 45. Alternatively, the lead elements 3014 may also be formed and deployed between the basal plate 30111 of the circuit board 3011 and the photosensitive element 3012 through HiraUchi technology, as illustrated in FIG. 45C. In another alternative manner, the photosensitive element 3012 may be attached on the basal plate 30111 of the circuit board 3011 through flip chip (FC) technology, as illustrated in FIG. 45D.

According to another aspect of the present invention, the present invention further provides a manufacturing method of molded circuit board member 3010, wherein the manufacturing method comprises the following steps:

(a) electrically connecting a circuit board 3011 and a photosensitive element 3012 accommodated and received in an accommodating space 301113 of the circuit board 3011;

(b) placing the circuit board 3011 and the photosensitive element 3012, which have been electrically connected with each other, in a lower mold 30202 of a formation mould 30200;

(c) clamping the upper mold 30201 and the lower mold 30202 of the formation mould 30200 to form and define a molding space 30203 between the upper mold 30201 and the lower mold 30202 for accommodating the circuit board 3011 and the photosensitive element 3012 that have electrically connected with each other, arranging part of the circuit board 3011 and part of the non-photosensitive area 301212 of the photosensitive element 3012 corresponding to a forming guide groove 20121 of an surrounding member 302012 of the upper mold 30201, and arranging the photosensitive area 301211 of the photosensitive element 3012 corresponding to an optical window molding member 302011 of the upper mold 30201; and (d) adding fluid molding material 30400 into the molding space 30203 for being solidified the molding material 30400 in the forming guide groove 20121 to integrally form a retaining portion 3013 on the circuit board 3011 and the photosensitive element 3012 and to form an optical window 30131 of the retaining portion 3013 at a position corresponding to the optical window molding member 302011, so as to make the molded circuit board member 3010.

One skilled in the art will understand that the embodiment of the present invention as shown in the drawings and described above is exemplary only and not intended to be limiting.

Objectives of the present invention are completely and effectively implemented. Notions of the functions and structures of the present invention have been shown and described in the embodiments, whereas implementations of the present invention may have modifications or changes in any ways without going against the above notions.

What is claimed is:

1. A photosensitive component, comprising:
   at least a photosensitive element;
   at least a window-form circuit board; and
   at least a packaging body, wherein said photosensitive element and said window-form circuit board are integrally packaged through said packaging body, wherein said packaging body form an optical window corresponding to said photosensitive element, wherein said window-form circuit board comprises a circuit board main body which comprises at least one window which is a through hole arranged thereon, wherein said photosensitive element is arranged in the through hole, wherein said photosensitive element is electrically connected through at least an electrical connection element, and wherein said electrical connection element has two ends, respectively connected with said photosensitive element and a surface of said circuit board main body.

2. The photosensitive component, as recited in claim 1, further comprising a substrate, arranged under said photosensitive element.

3. The photosensitive component, as recited in claim 1, wherein said packaging body integrally encapsulates said electrical connection element.

4. The photosensitive component, as recited in claim 3, comprising at least one electronic component protruded from or partially protruded from said circuit board main body, wherein said packaging body integrally encapsulates said electronic component.

5. The photosensitive component, as recited in claim 3, wherein said photosensitive element comprises a photosensitive area and a non-photosensitive area arranged thereon, wherein said packaging body integrally encapsulates at least part of said non-photosensitive area, wherein said photosensitive component comprises a ringlike blocking element, arranged around said photosensitive area of said photosensitive element.

6. The photosensitive component, as recited in claim 1, wherein said packaging body comprises a support portion configured for installing an optical filter and a lens portion configured for installing a lens, wherein said lens portion integrally extends along said support portion from the outside thereof and forms a step-shaped structure in the inside thereof.

7. The photosensitive component, as recited in claim 1, wherein said circuit board main body comprises a reinforced hole formed thereon, wherein said packaging body extends into said reinforced hole.

8. The photosensitive component, as recited in claim 1, further comprising an optical filter, wherein said optical filter is attached on said photosensitive element.

9. The photosensitive component, as recited in claim 1, further comprising an optical filter, wherein the edge of said optical filter is integrally encapsulated by said packaging body.

10. The photosensitive component, as recited in claim 1, further comprising a back board, wherein said back board is mounted on the bottom of said circuit board main body.

11. A camera module, comprising:
at least a photosensitive component comprising at least a circuit board, at least a photosensitive element, and at least an integrally encapsulated base, wherein said circuit board comprises at least a circuit board main body and has at least a disposing area arranged on said circuit board main body, wherein said photosensitive element is arranged on said disposing area, wherein said integrally encapsulated base comprises at least a base main body and has at least an optical window arranged thereon, wherein said base main body integrally encapsulates at least part of said photosensitive element and at least part of said circuit board main body, wherein said optical window provides a light path for said photosensitive element; and
at least a lens, positioned along the photosensitive path of said photosensitive element;
wherein said disposing area is a through hole, wherein said photosensitive element is arranged in the through hole, wherein said photosensitive element is electrically connected through at least an electrical connection element, and wherein said electrical connection element has two ends, respectively connected with said photosensitive element and a surface of said circuit board main body.

12. The camera module, as recited in claim 11, wherein said base main body comprises a primary base and a secondary base, wherein said secondary base comprises a packaging and encapsulating base and a secondary packaging base, wherein said primary base is primarily shaped and formed on part of said photosensitive element and said circuit board main body, wherein said packaging and encapsulating base connects part of said photosensitive element and said circuit board main body, wherein said packaging and encapsulating base and said primary base form a ring structure, wherein said secondary packaging base is primarily shaped and formed on said ring structure to jointly form said optical window with said ring structure.

13. The camera module, as recited in claim 11, wherein said base main body comprises a primary base and a secondary base, wherein said primary base comprises a bottom liner and a primary packaging base, wherein said secondary base comprises a packaging and encapsulating base and a secondary packaging base, wherein said bottom liner is protruded from said photosensitive element, wherein said primary packaging base is primarily shaped and formed on part of said photosensitive element, at least part of said circuit board main body, and at least part of said bottom liner, wherein said packaging and encapsulating base connects another part of said photosensitive element and another part of said circuit board main body, wherein said packaging and encapsulating base and said primary base form a ring structure, wherein said secondary packaging base is primarily shaped and formed on said ring structure to jointly form said optical window with said ring structure.

14. The camera module, as recited in claim 13, wherein said primary base is arranged on the position where said electrical connection element is absent, wherein said packaging and encapsulating base packages and encapsulates said electrical connection element.

15. A molded circuit board member, comprising:
at least a photosensitive element, wherein said photosensitive element comprises a photosensitive area and a non-photosensitive area arranged thereon;
at least a circuit board, comprising at least an accommodating space provided therein, wherein said photosensitive element is accommodated in said accommodating space and communicatively connected with said circuit board; and
at least a keeping portion, comprising at least an optical window formed thereon while integrally formed on said non-photosensitive area of said photosensitive element and said circuit board, wherein said photosensitive area of said photosensitive element corresponds to said optical window;
wherein said accommodating space is a through hole, wherein said photosensitive element is arranged in the through hole, wherein said photosensitive element is electrically connected through at least an electrical connection element, and wherein said electrical connection element has two ends, respectively connected with said photosensitive element and a surface of said circuit board main body.

16. The molded circuit board member, as recited in claim 15, wherein said keeping portion has a coupling side and a attaching side in an opposite manner, and an inner surface, wherein said coupling side of said keeping portion, said circuit board, and said non-photosensitive area of said photosensitive element are integrally bonded, wherein said inner surface of said keeping portion forms and defines said optical window.

17. The molded circuit board member, as recited in claim 16, wherein said inner surface of said keeping portion has a first inner surface, a second inner surface, and a third inner surface, wherein said first inner surface is extended from said coupling side to the direction of said attaching side, forming a first included angle α, which is a sharp angle, between said first inner surface and the photosensitive axis of said photosensitive element, wherein said third inner surface is extended from said attaching side to the direction of said coupling side, wherein said second inner surface is extended to two sides to be respectively connected with said first inner surface and said third inner surface, wherein said second inner surface is parallel to said photosensitive element, wherein said third inner surface extends from said attaching side to the direction of said coupling side in a inclined and slope manner, wherein a third included angle γ is formed and defined between said third inner surface and said photosensitive axis of the photosensitive element and is a sharp angle, wherein said keeping portion further has an outer surface extended between said coupling side and said attaching side in a inclined and slope manner, wherein said outer surface and the photosensitive axis of said photosensitive element form and define a second included angle β therebetween, wherein said second included angle β is a sharp angle.

18. The molded circuit board member, as recited in claim 17, wherein the value range of said first included angle α is 1°~85°, wherein the value range of said second included angle β is 1°~45°, wherein the value range of said third included angle γ is 1°~30°.

* * * * *